(12) United States Patent
Yu et al.

(10) Patent No.: US 11,349,004 B2
(45) Date of Patent: May 31, 2022

(54) BACKSIDE VIAS IN SEMICONDUCTOR DEVICE

(71) Applicant: Taiwan Semiconductor Manufacturing Co., Ltd., Hsinchu (TW)

(72) Inventors: Li-Zhen Yu, New Taipei (TW); Huan-Chieh Su, Tianzhong Township (TW); Lin-Yu Huang, Hsinchu (TW); Cheng-Chi Chuang, New Taipei (TW); Chih-Hao Wang, Baoshan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 85 days.

(21) Appl. No.: 16/984,881

(22) Filed: Aug. 4, 2020

(65) Prior Publication Data

US 2021/0336020 A1    Oct. 28, 2021

Related U.S. Application Data

(60) Provisional application No. 63/016,377, filed on Apr. 28, 2020.

(51) Int. Cl.
*H01L 23/528* (2006.01)
*H01L 27/092* (2006.01)
(Continued)

(52) U.S. Cl.
CPC .... *H01L 29/4238* (2013.01); *H01L 21/76804* (2013.01); *H01L 21/823418* (2013.01);
(Continued)

(58) Field of Classification Search
CPC ......... H01L 21/02603; H01L 21/28141; H01L 21/768; H01L 21/76802; H01L 21/76804;
(Continued)

(56) References Cited

U.S. PATENT DOCUMENTS 9,209,247 B2   12/2015   Colinge et al.
9,236,267 B2   1/2016    De et al.
(Continued)

*Primary Examiner* — David C Spalla
(74) *Attorney, Agent, or Firm* — Slater Matsil, LLP

(57) ABSTRACT

Methods of forming backside vias connected to source/drain regions of long-channel semiconductor devices and short-channel semiconductor devices and semiconductor devices formed by the same are disclosed. In an embodiment, a semiconductor device includes a first transistor structure; a second transistor structure adjacent the first transistor structure; a first interconnect structure on a front-side of the first transistor structure and the second transistor structure; and a second interconnect structure on a backside of the first transistor structure and the second transistor structure, the second interconnect structure including a first dielectric layer on the backside of the first transistor structure; a second dielectric layer on the backside of the second transistor structure; a first contact extending through the first dielectric layer and electrically coupled to a first source/drain region of the first transistor structure; and a second contact extending through the second dielectric layer and electrically coupled to a second source/drain region of the second transistor structure, the second contact having a second length less than a first length of the first contact.

20 Claims, 119 Drawing Sheets

(51) Int. Cl.
*H01L 23/535* (2006.01)
*H01L 29/417* (2006.01)
*H01L 29/06* (2006.01)
*H01L 21/8238* (2006.01)
*H01L 29/423* (2006.01)
*H01L 21/768* (2006.01)
*H01L 21/8234* (2006.01)
*H01L 29/49* (2006.01)
*H01L 29/66* (2006.01)

(52) U.S. Cl.
CPC ...... *H01L 29/0665* (2013.01); *H01L 29/4933* (2013.01); *H01L 29/6656* (2013.01)

(58) Field of Classification Search
CPC ........... H01L 21/76816; H01L 21/8221; H01L 21/823418; H01L 21/823475; H01L 21/823814; H01L 21/823871; H01L 23/481; H01L 23/52; H01L 23/5226; H01L 23/528; H01L 27/0688; H01L 29/0653; H01L 29/0665; H01L 29/0669; H01L 29/0673; H01L 29/4238; H01L 29/4933; H01L 29/66439; H01L 29/6653; H01L 29/66553; H01L 29/6656; H01L 29/775

See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 10,840,146 | B1* | 11/2020 | Paul .................. H01L 29/42392 |
| 2015/0118837 | A1 | 4/2015 | Shieh et al. |
| 2018/0122714 | A1 | 5/2018 | Cheng et al. |
| 2019/0214469 | A1* | 7/2019 | Paul .................. H01L 29/78654 |
| 2020/0126987 | A1* | 4/2020 | Rubin ............... H01L 21/76897 |
| 2020/0211905 | A1* | 7/2020 | Huang ............. H01L 29/42356 |
| 2021/0184000 | A1* | 6/2021 | Ramaswamy .. H01L 21/823842 |
| 2021/0272904 | A1* | 9/2021 | Komuro ................ H01L 29/775 |

* cited by examiner

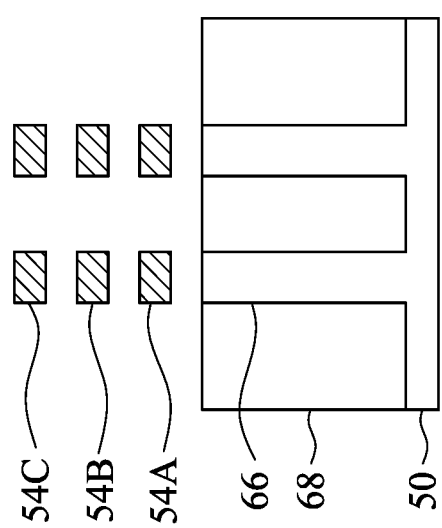

US 11,349,004 B2

BACKSIDE VIAS IN SEMICONDUCTOR DEVICE

PRIORITY CLAIM AND CROSS-REFERENCE

This application claims the benefit of U.S. Provisional Application No. 63/016,377, filed on Apr. 28, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 3A, 3B, 4A, 4B, 5A, 5B, 6A, 6B, 6C, 7A, 7B, 7C 8A, 8B, 8C, 9A, 9B, 9C, 10A, 10B, 10C, 11A, 11B, 11C, 12A, 12B, 12C, 13A, 13B, 13C, 13D, 14A, 14B, 14C, 15A, 15B, 15C, 15D, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 29C, 30A, 30B, 30C, 31A, 31B, 31C, 32A, 32B, 32C, 33A, 33B, 33C, 34A, 34B, 34C, 35A, 35B, 35C, 36A, 36B, 36C, 37A, 37B, 37C, 37D, 37E, 37F, 38A, 38B, 38C, 39A, 39B, 39C, 40A, 40B, and 40C are cross-sectional views and backside views of intermediate stages in the manufacturing of nano-FETs, in accordance with some embodiments.

DETAILED DESCRIPTION

Figure 1:
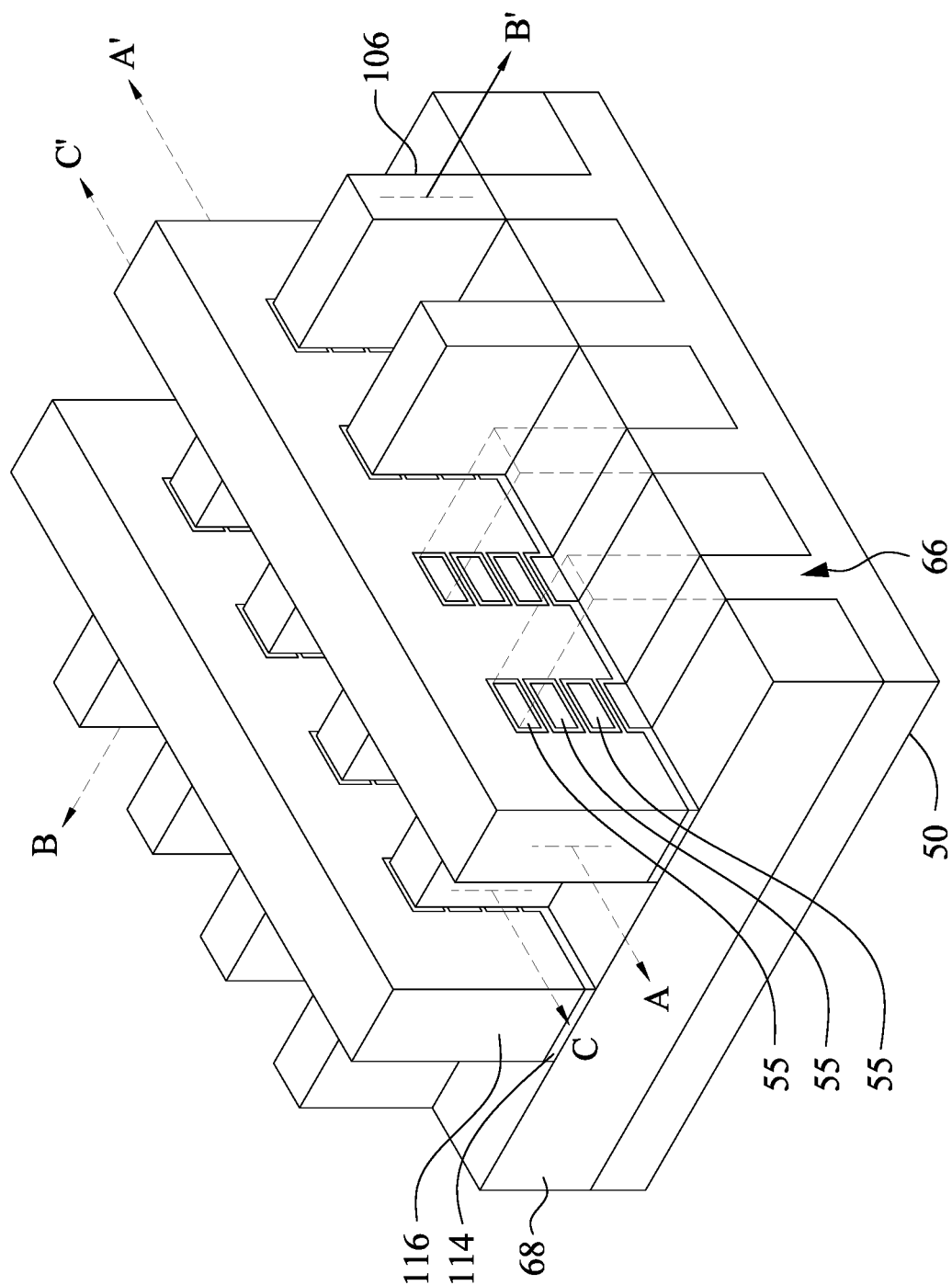
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming backside vias in short-channel regions and long-channel regions of semiconductor devices and semiconductor devices including the same. The methods include etching a substrate in the long-channel regions to form first recesses exposing epitaxial source/drain regions while masking the short-channel regions and refilling the first recesses over the epitaxial source/drain regions and a remaining portion of the substrate with dielectric materials. The substrate in the short-channel regions is then also replaced with dielectric materials. Sacrificial materials in the short-channel regions are removed to form second recesses exposing epitaxial source/drain regions and the dielectric materials in the long-channel regions are etched through a patterned mask to form third recesses exposing epitaxial source/drain regions. Backside vias are then formed in the second recesses and the third recesses. Separately forming backside vias in the long-channel regions and the short-channel regions reduces depth loading between the long-channel regions and the short-channel regions, which reduces device defects. Reduced depth loading also allows for shorter backside vias to be included in the short-channel regions, which improves device performance. Moreover, including backside vias in the long-channel regions allows for device density in the long-channel regions to be increased and improves performance of devices in the long-channel regions.

Some embodiments discussed herein are described in the context of a die including nano-FETs. However, various embodiments may be applied to dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs include nanostructures 55 (e.g., nanosheets, nanowires, or the like) over fins 66 on a substrate 50 (e.g., a semiconductor substrate, a silicon-on-insulator substrate, or the like). The nanostructures 55 act as channel regions for the nano-FETs. The nanostructures 55 may include p-type nanostructures, n-type nanostructures, or combinations thereof. Shallow trench isolation (STI) regions 68 are disposed between adjacent the fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may include a single material or a plurality of materials. In this context, the fins 66 refer to the portion extending between the neighboring STI regions 68.

Gate dielectric layers 114 are along top surfaces and sidewalls of the fins 66 and along top surfaces, sidewalls, and bottom surfaces of the nanostructures 55. Gate electrodes 116 are over the gate dielectric layers 114. Epitaxial source/drain regions 106 are disposed on the fins 66 on opposing sides of the gate dielectric layers 114 and the gate electrodes 116.

FIG. 1 further illustrates reference cross-sections that are used in later figures. Cross-section A-A' is along a longitudinal axis of a gate electrode 116 and in a direction, for example, perpendicular to the direction of current flow between the epitaxial source/drain regions 106 of a nano-FET. Cross-section B-B' is perpendicular to cross-section A-A' and is parallel to the longitudinal axis of a fin of the nano-FET and in a direction of, for example, a current flow between the epitaxial source/drain regions 106 of the nano-FET. Cross-section C-C' is parallel to cross-section A-A' and extends through the epitaxial source/drain regions 106 of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2A through 40C are cross-sectional views and backside views of intermediate stages in the manufacturing of nano-FETs, in accordance with some embodiments. FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, 32A, 33A, 34A, 35A, 36A, 37A, 38A, 39A, and 40A illustrate reference cross-section A-A' illustrated in FIG. 1. FIGS. 2B, 3B, 4B, 5B, 6B, 7B, 8B, 9B, 10B, 11B, 12B, 13B, 13D, 14B, 15B, 16B, 17B, 18B, 19B, 20B, 21B, 22B, 23B, 24B, 25B, 26B, 27B, 28B, 29B, 30B, 31B, 32B, 33B, 34B, 35B, 36B, 37B, 37D, 37E, 37F 38B, 39B, and 40B illustrate reference cross-section B-B' illustrated in FIG. 1. FIGS. 6C, 7C, 8C, 9C, 10C, 11C, 12C, 13C, 14C, 15C, 15D, 16C, 17C, 18C, 19C, 20C, 21C, 22C, 23C, 24C, 25C, 26C, 27C, 28C, 29C, 30C, 31C, 32C, 33C, 34C, 35C, 36C, 37C, 38C, 39C, and 40C illustrate reference cross-section C-C' illustrated in FIG. 1.

Figure 2A:
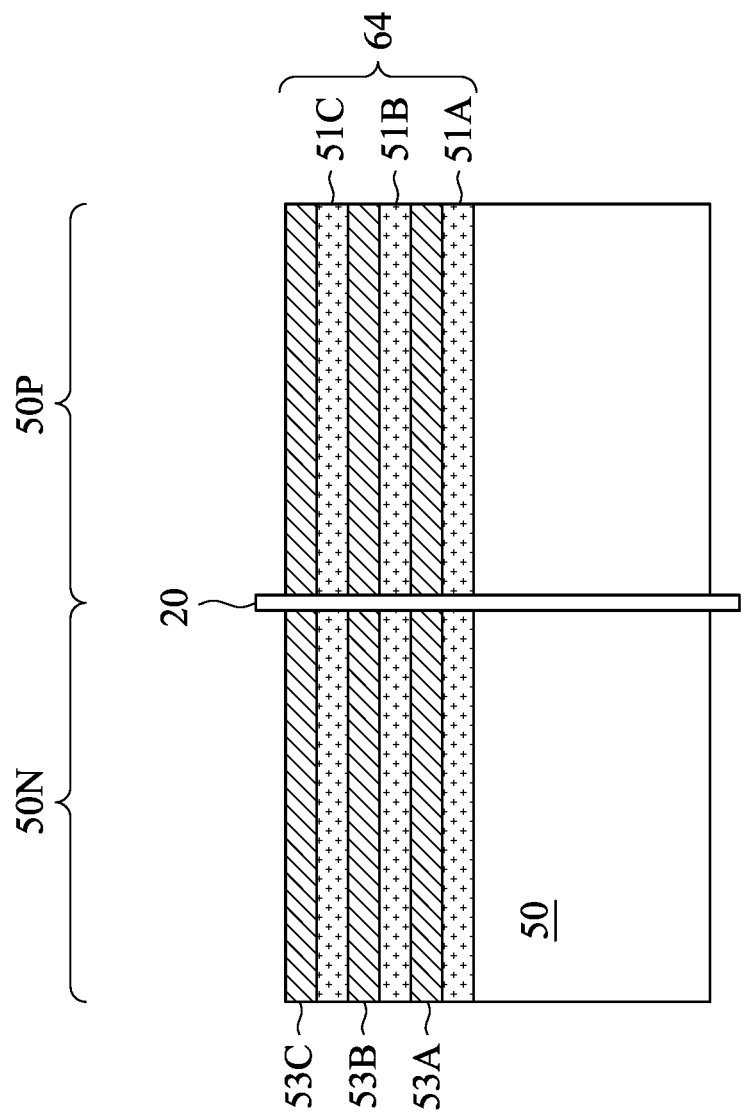
Figure 2B:
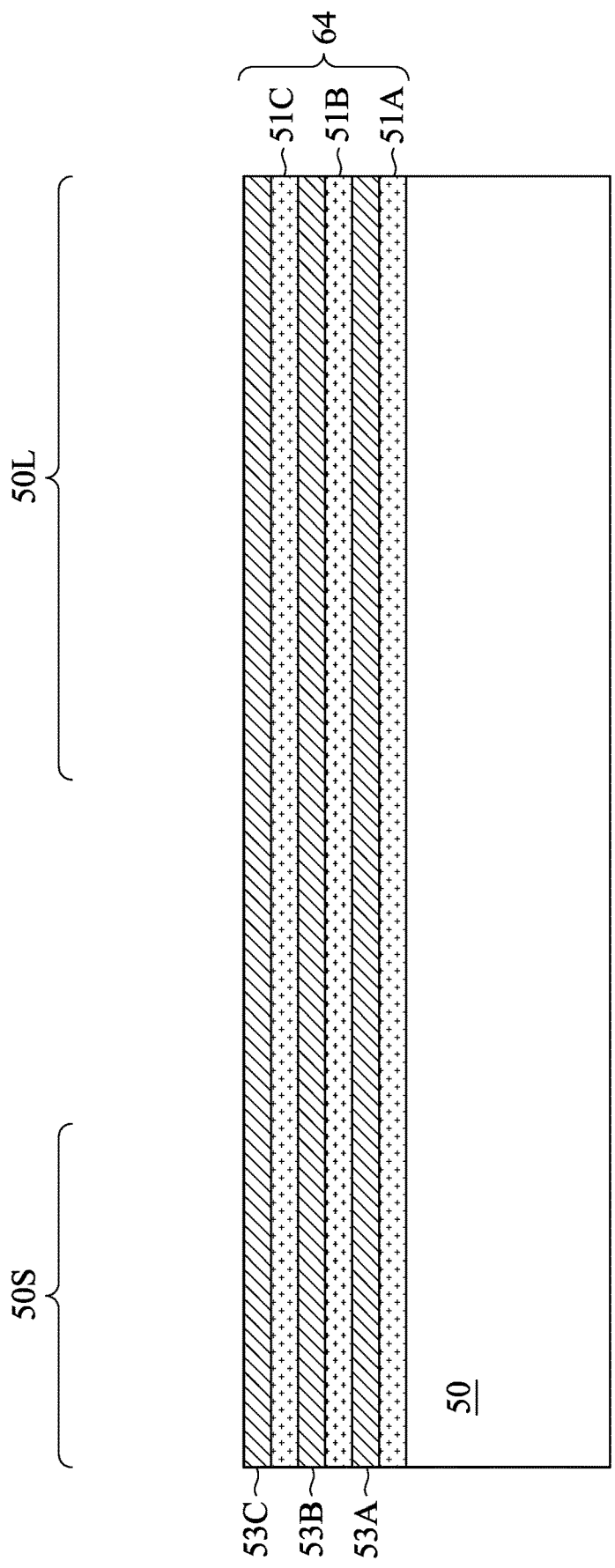

In FIGS. 2A and 2B, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium; gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 further has a short-channel region 50S and a long-channel region SOL (see FIG. 2B). Channel lengths (also referred to as gate lengths) of devices in the short-channel region 50S may be less than channel lengths of devices in the long-channel region SOL. As will be discussed in greater detail below, the short-channel region 50S may be separated from the long-channel region SOL by an isolation region (such as the STI region 68, discussed below with respect to FIGS. 4A and 4B). Although one short-channel region 50S and one long-channel region SOL are illustrated, any number of short-channel regions 50S and long-channel regions SOL may be provided. Each of the short-channel regions 50S and the long-channel regions SOL may comprise one or more of the n-type regions 50N and/or the p-type regions 50P.

Further in FIGS. 2A and 2B, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETS. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETS.

Figure 3A:
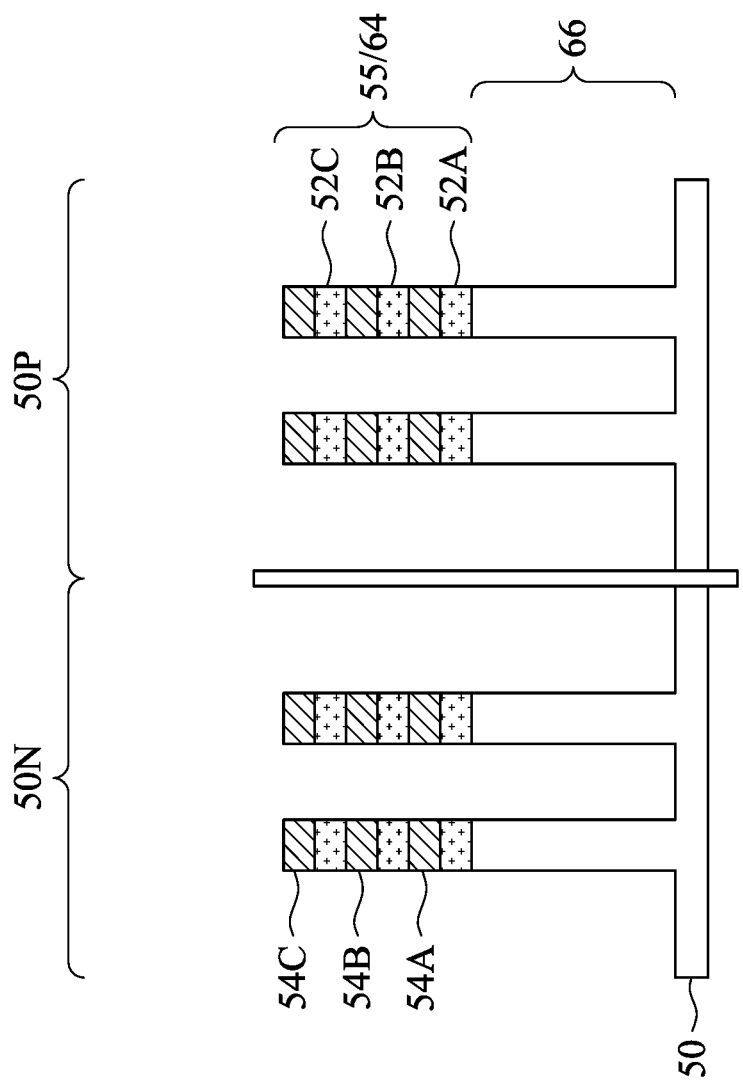
Figure 3B:
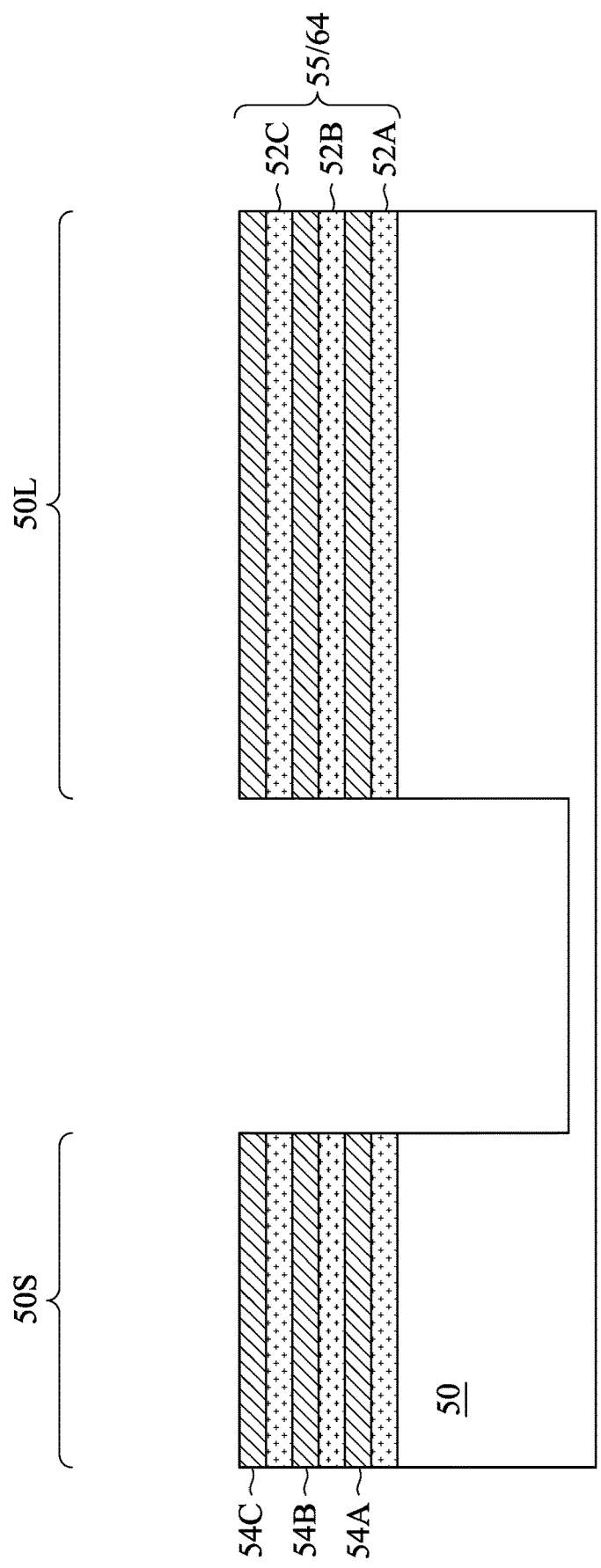

Referring now to FIGS. 3A and 3B, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and second nanostructures 54A-54C (collectively referred to as the second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3A illustrates the fins 66 and the nanostructures 55 in the n-type region 50N and the p-type region 50P as having substantially equal widths for illustrative purposes. In some embodiments, widths of the fins 66 and the nanostructures 55 in the n-type region 50N may be greater or thinner than those of the fins 66 and the nanostructures 55 in the p-type region 50P. As illustrated in FIG. 3B, the fins 66 and the nanostructures 55 in the long-channel region 50L have widths greater than the fins 66 and the nanostructures 55 in the short-channel region 50S. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4A:
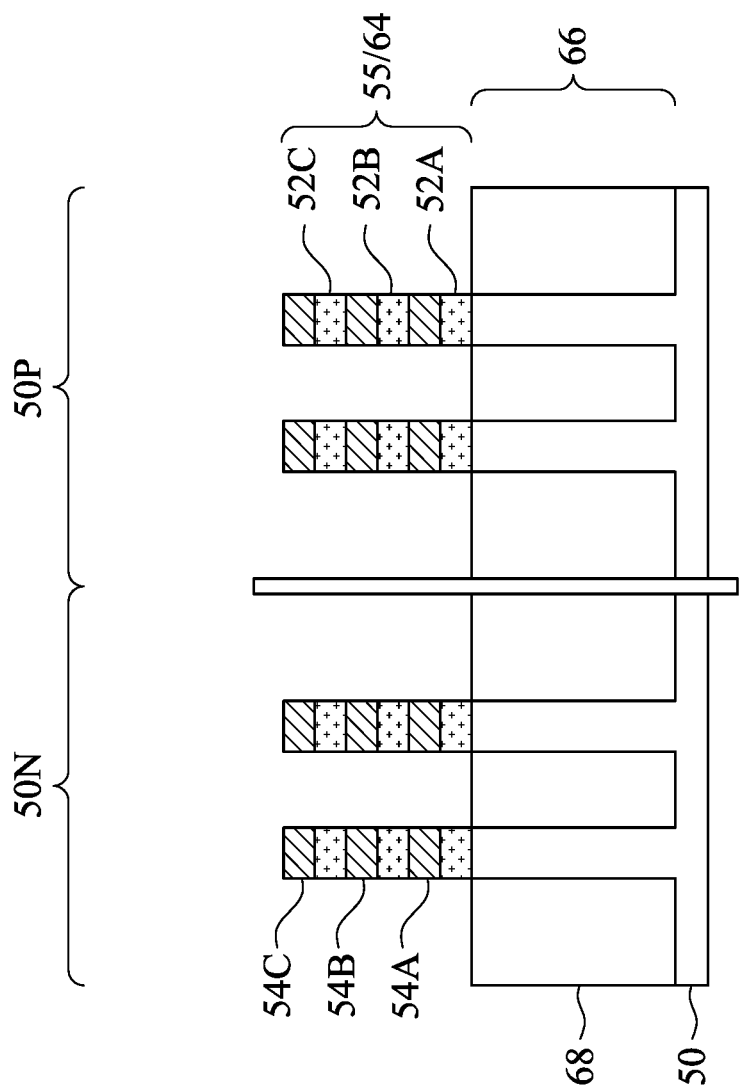
Figure 4B:
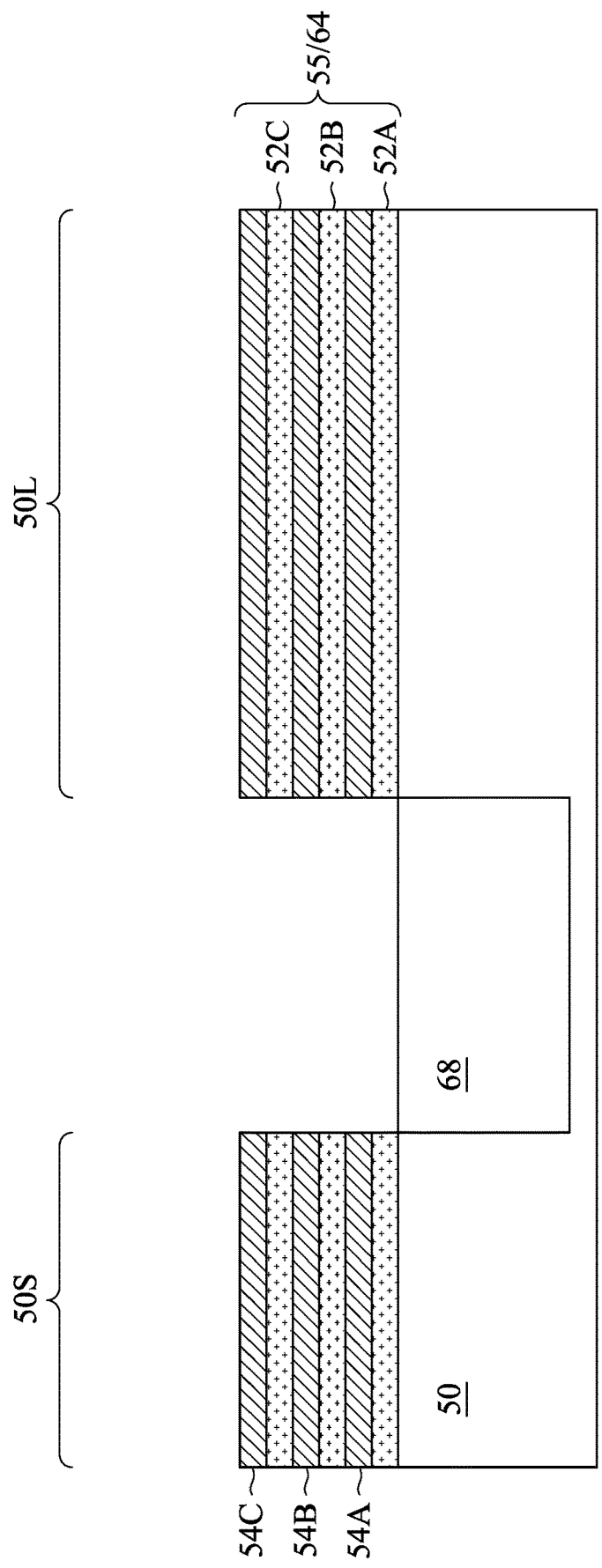

In FIGS. 4A and 4B, shallow trench isolation (STI) regions 68 are formed adjacent the fins 66. The STI regions 68 may be formed by depositing an insulation material over the substrate 50, the fins 66, and nanostructures 55, and between adjacent fins 66 and nanostructures 55. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, the insulation material may comprise silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), silicon (Si), zirconium nitride (ZrN), silicon carbonitride (SiCN), combinations or multiple layers thereof, or the like. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the nanostructures 55. Although the insulation material is illustrated as a single layer, some embodiments may utilize multiple layers. For example, in some embodiments a liner (not separately illustrated) may first be formed along surfaces of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that the nanostructures 55 and upper portions of the fins 66 protrude from between neighboring STI regions 68 in the n-type region 50N and the p-type region 50P. Further, the top surfaces of the STI regions 68 may have flat surfaces as illustrated, convex surfaces, concave surfaces (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric acid (dHF) may be used.

The process described above with respect to FIGS. 2A through 4B is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIGS. 4A and 4B, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the nanostructures 55, the fins 66, and the STI regions 68 in the n-type region 50N and the p-type region 50P. The photoresist may be patterned to expose the p-type region 50P. The photoresist may be formed by using a spin-on technique and may be patterned using acceptable photolithography techniques. Once the photoresist is patterned, an n-type impurity implant may be performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist may be removed, such as by an acceptable ashing process.

Following or prior to the implanting of the p-type region 50P, a photoresist or other masks (not separately illustrated) may be formed over the nanostructures 55, the fins 66, and the STI regions 68 in the p-type region 50P and the n-type region 50N. The photoresist may be patterned to expose the n-type region 50N. The photoresist may be formed by using a spin-on technique and may be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins and nanostructures may be in situ doped during growth, which may obviate the implantations, although in situ and implantation doping may be used together.

Figure 5A:
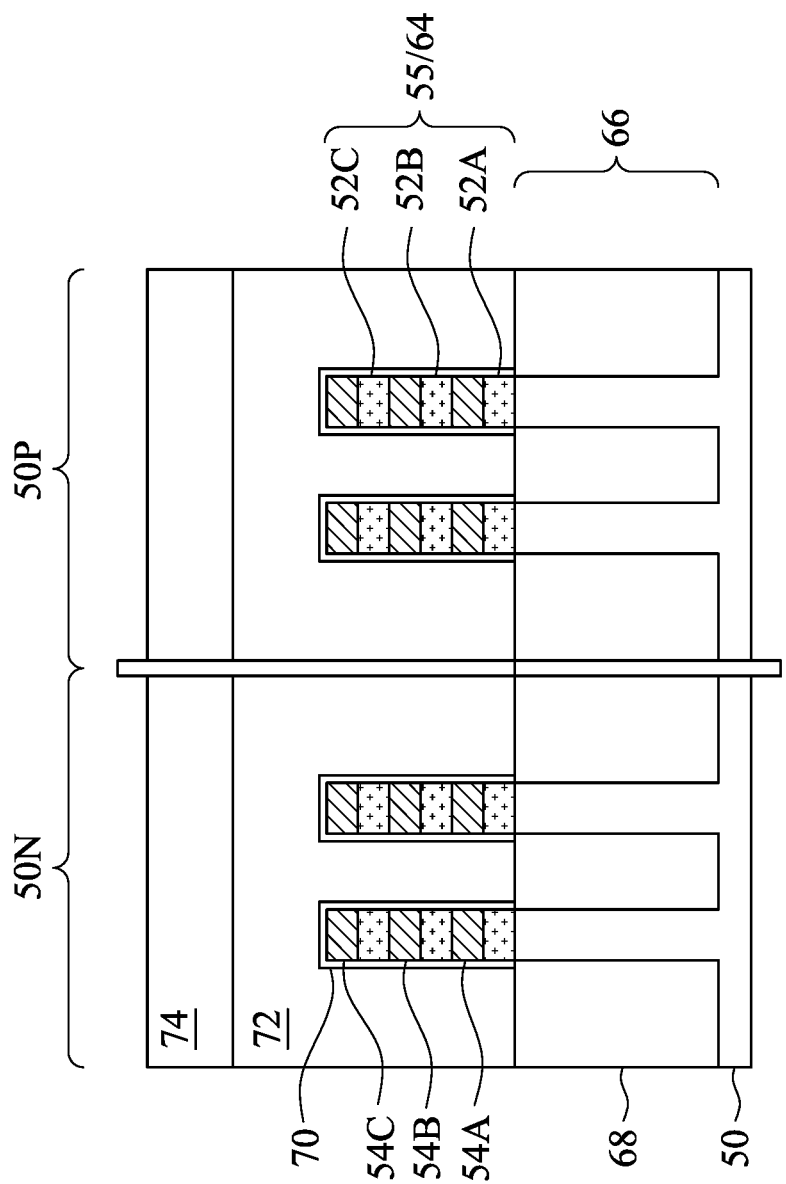
Figure 5B:
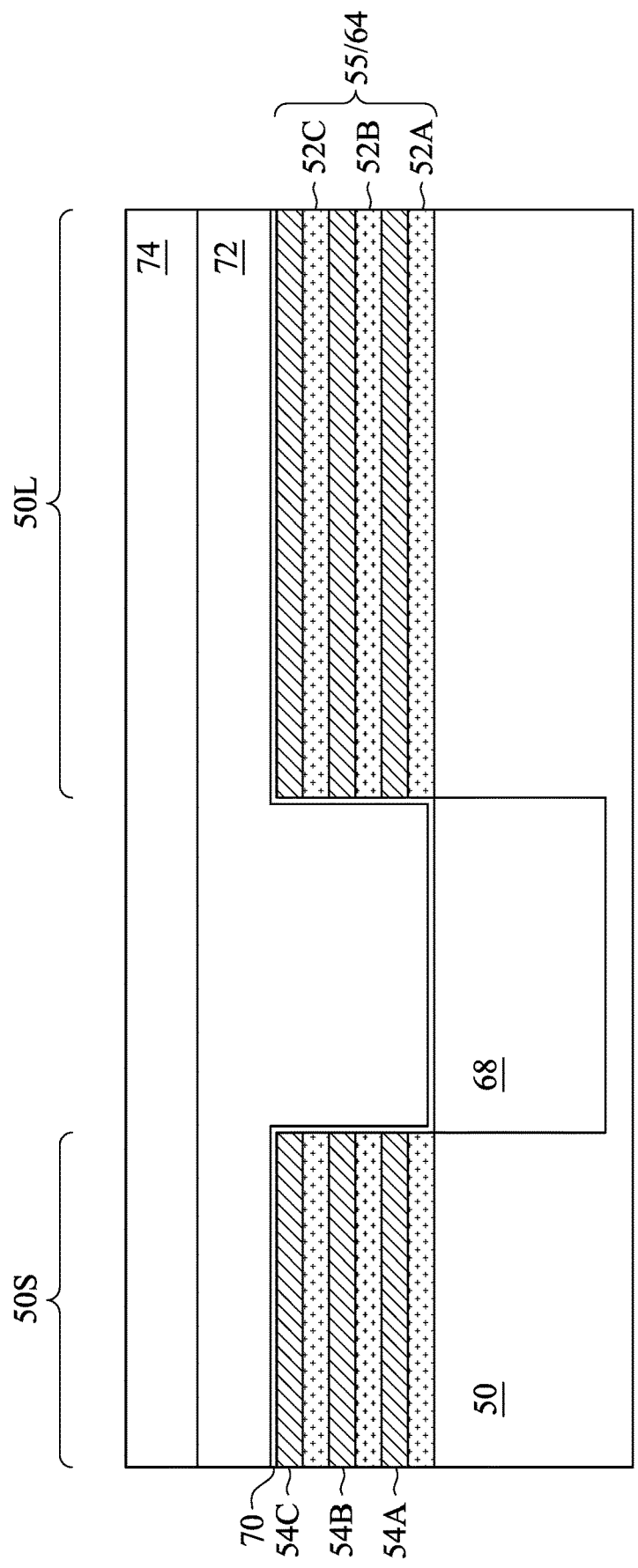

In FIGS. 5A and 5B, a dummy dielectric layer 70 is formed over the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive, semi-conductive, or non-conductive material and may be selected from a group including amorphous silicon, polycrystalline-silicon (poly-silicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of STI regions 68. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68 and the dummy dielectric layer 70 extends between the dummy gate layer 72 and the STI regions 68.

FIGS. 6A through 40C illustrate various additional steps in the manufacturing of embodiment devices. FIGS. 6A through 40C illustrate features in either the n-type region 50N or the p-type region 50P. FIGS. 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, 32A, 33A, 34A, 35A, 36A, 37A, 38A, 39A, and 40A illustrate features in either the short-channel region 50S or the long-channel region 50L. The remainder of FIGS. 6A through 40C illustrate features in both the short-channel region 50S and the long-channel region 50L.

Figure 6A:
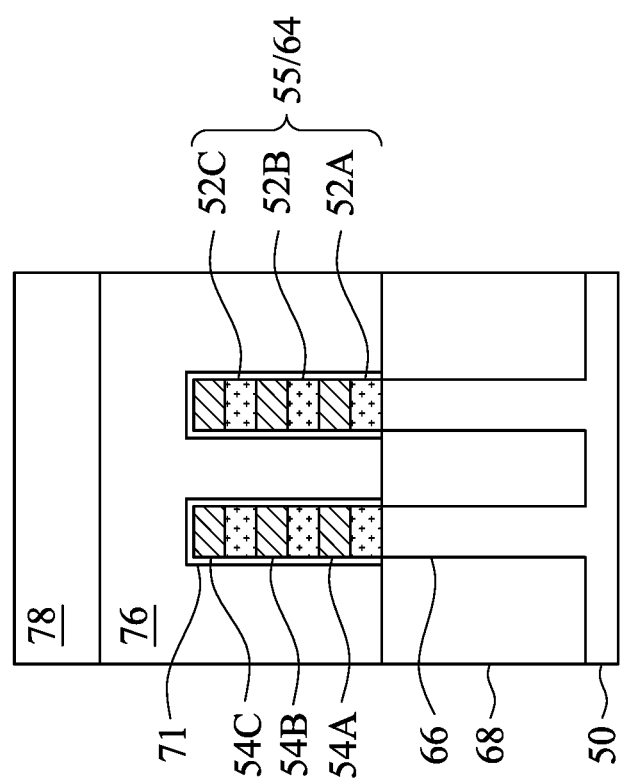
Figure 6B:
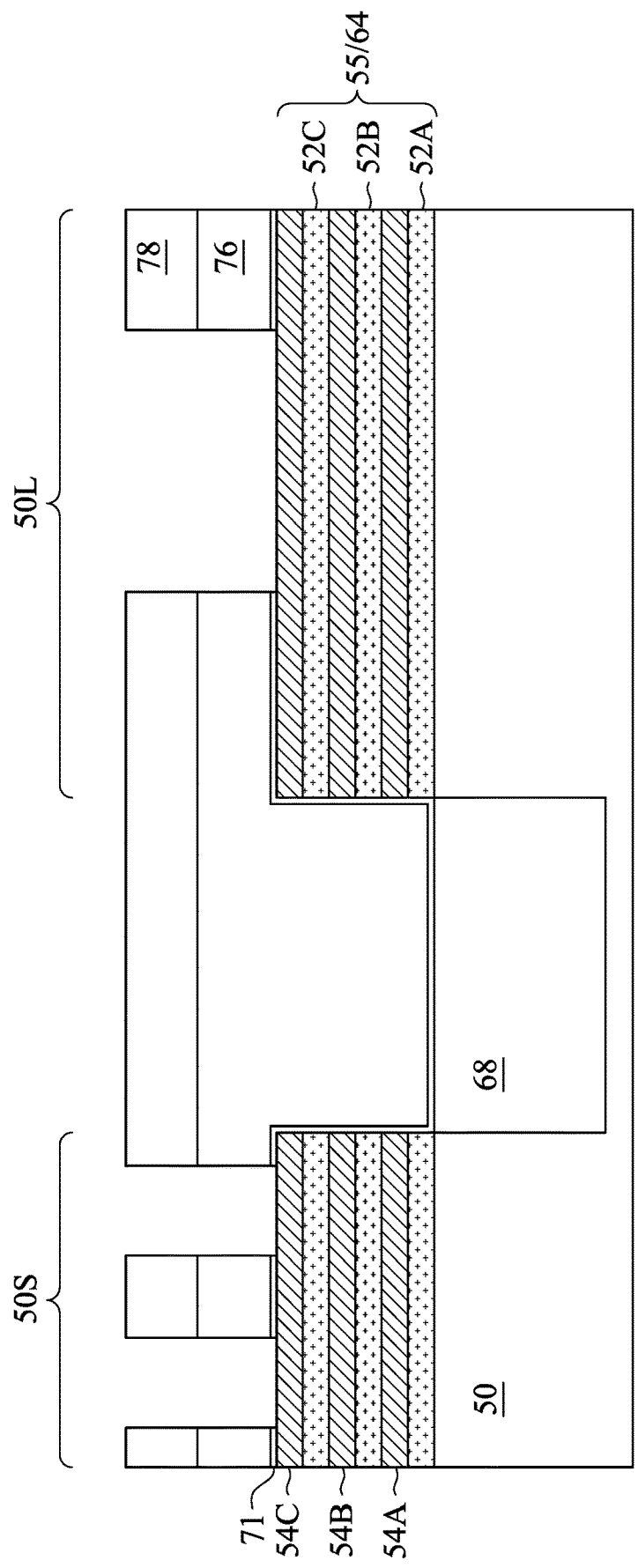
Figure 6C:
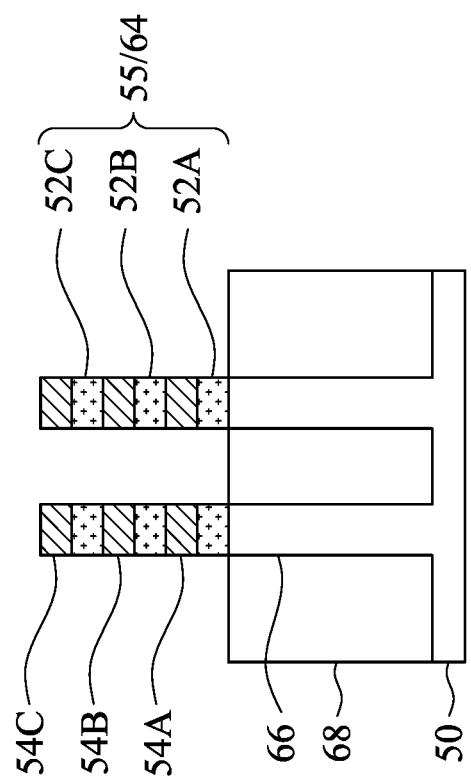

In FIGS. 6A through 6C, the mask layer 74 (see FIGS. 5A and 5B) may be patterned using acceptable photolithography and etching techniques to form masks 78. The pattern of the masks 78 then may be transferred to the dummy gate layer 72 and the dummy dielectric layer 70 to form dummy gates 76 and dummy gate dielectrics 71, respectively. The dummy gates 76 cover respective channel regions of the nanostructures 55. The pattern of the masks 78 may be used to physically separate each of the dummy gates 76 from adjacent dummy gates 76. The dummy gates 76 may have a lengthwise direction substantially perpendicular to the lengthwise direction of respective fins 66.

Figure 7A:
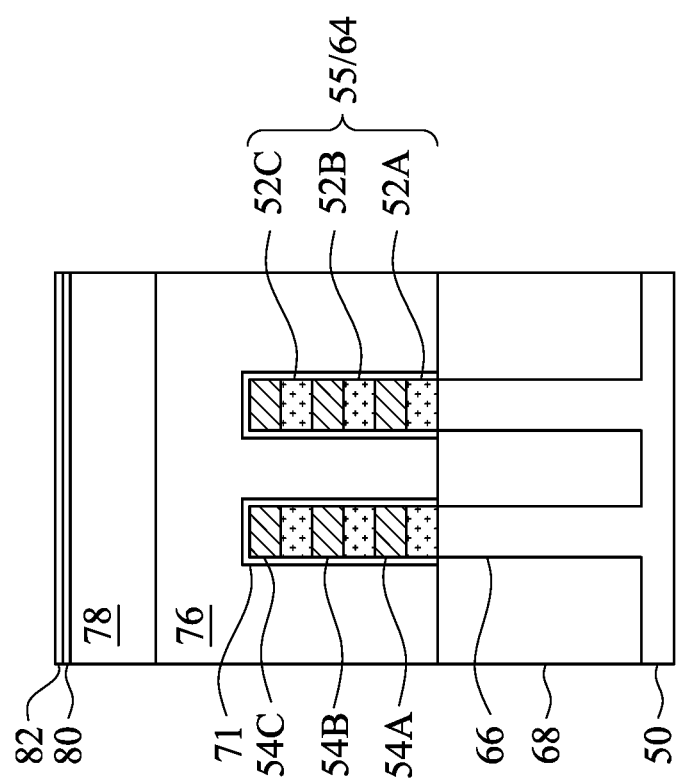
Figure 7B:
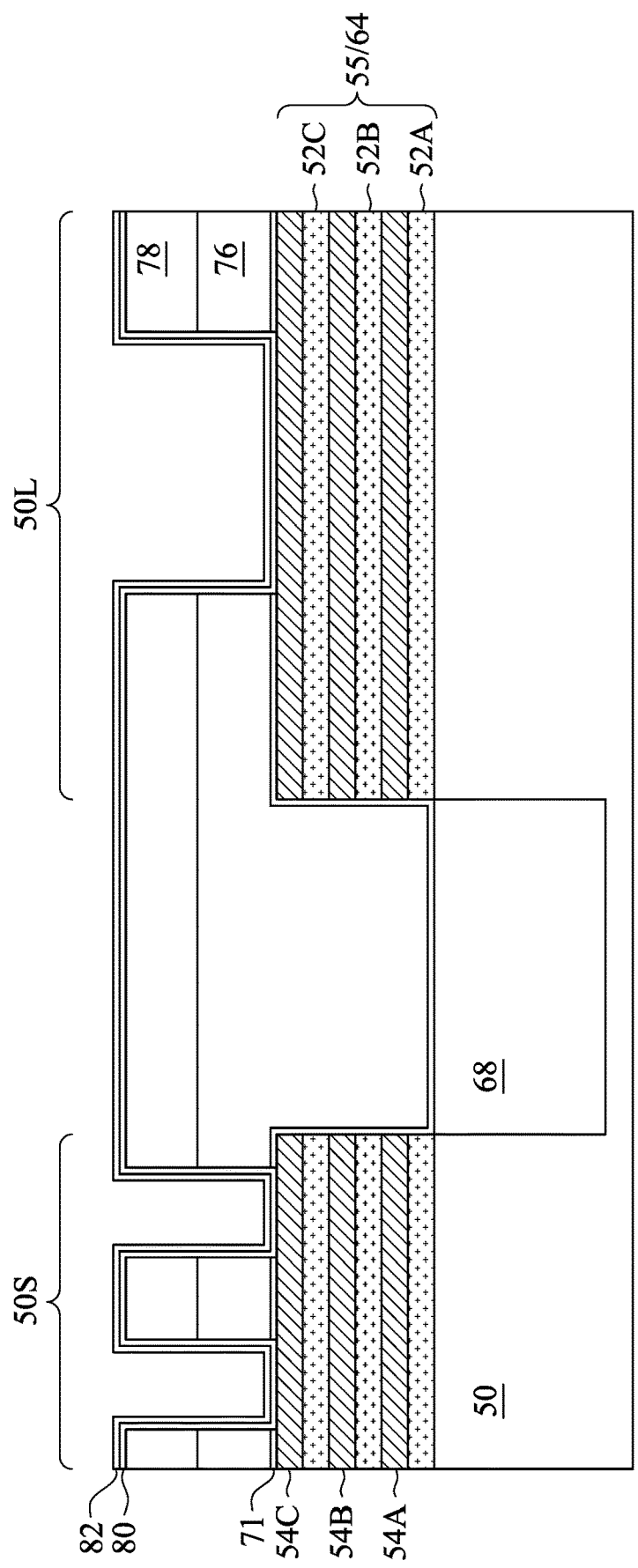
Figure 7C:
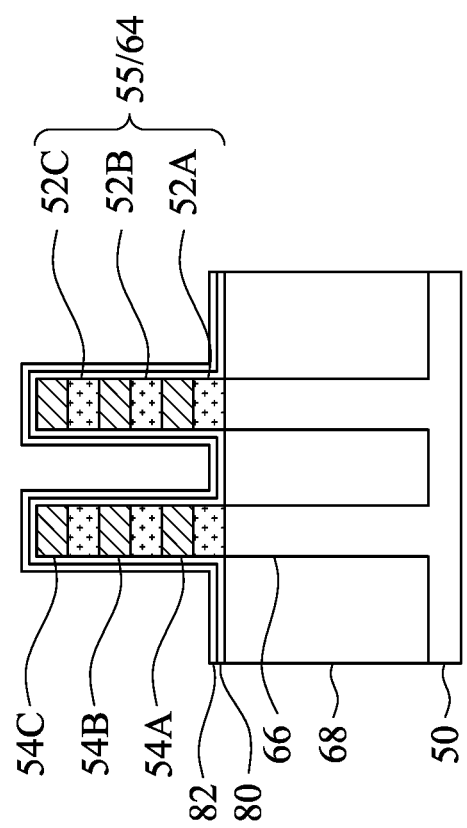

In FIGS. 7A through 7C, a first spacer layer 80 and a second spacer layer 82 are formed over the structures illustrated in FIGS. 6A through 6C, respectively. The first spacer layer 80 and the second spacer layer 82 will be subsequently patterned to act as spacers for forming self-aligned source/drain regions. In FIGS. 7A through 7C, the first spacer layer 80 is formed on top surfaces and sidewalls of the masks 78 and the nanostructures 55; top surfaces of the STI regions 68; and sidewalls of the fins 66, the dummy gates 76, and the dummy gate dielectrics 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIGS. 4A and 4B, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1 \times 10^{15}$ atoms/cm$^3$ to about $1 \times 10^{19}$ atoms/cm$^3$. An anneal may be used to repair implant damage and to activate the implanted impurities.

Figure 8A:
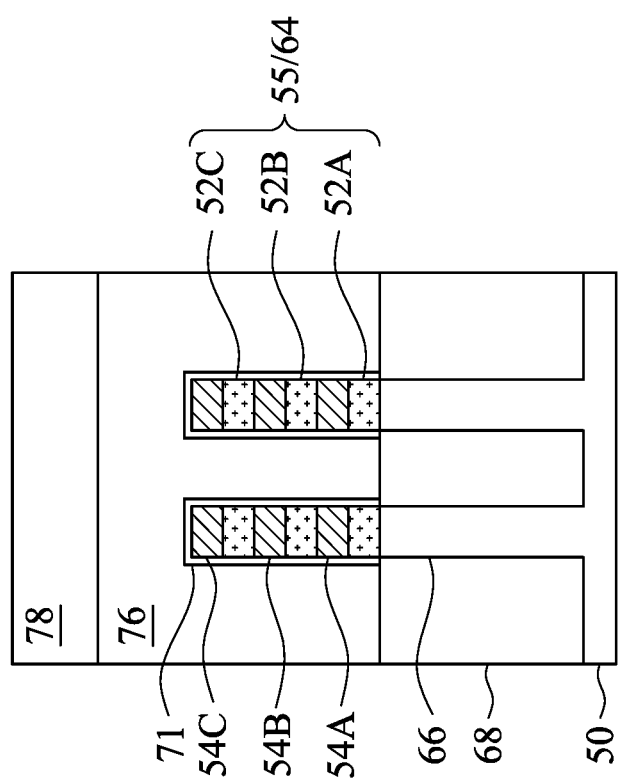
Figure 8B:
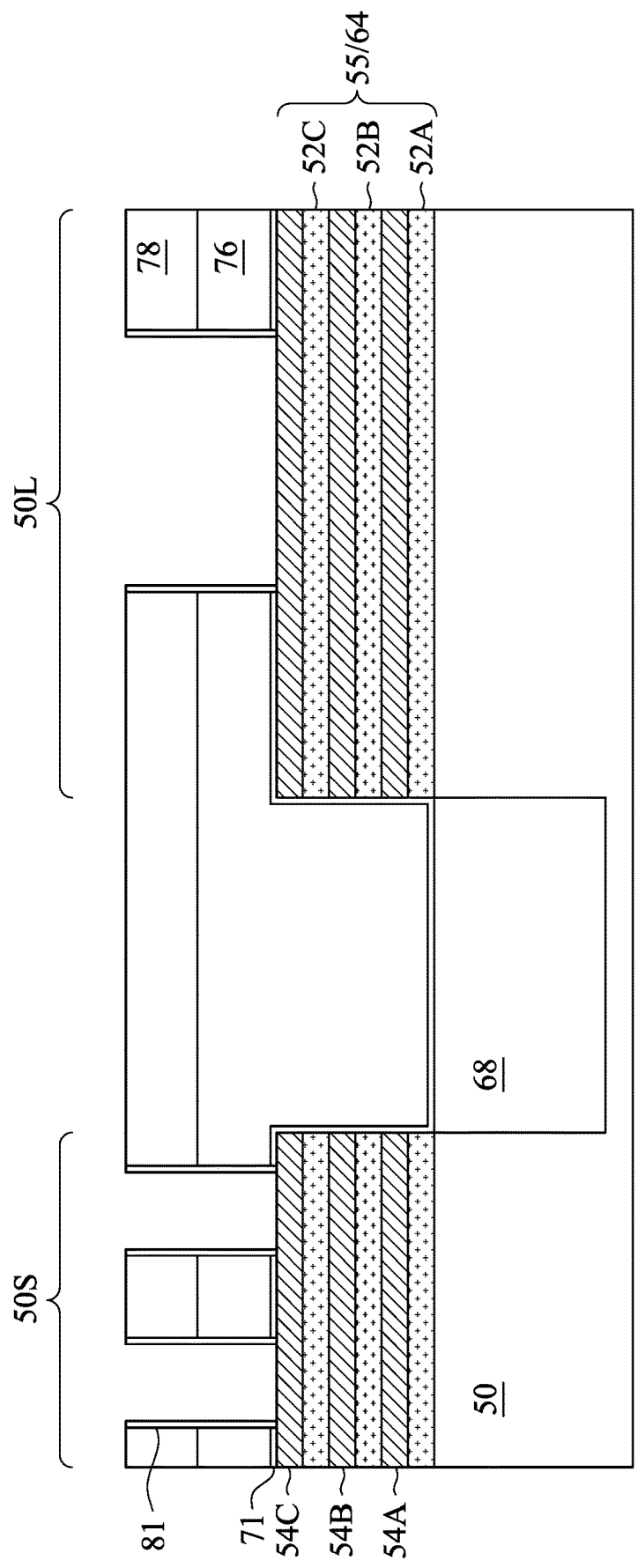
Figure 8C:
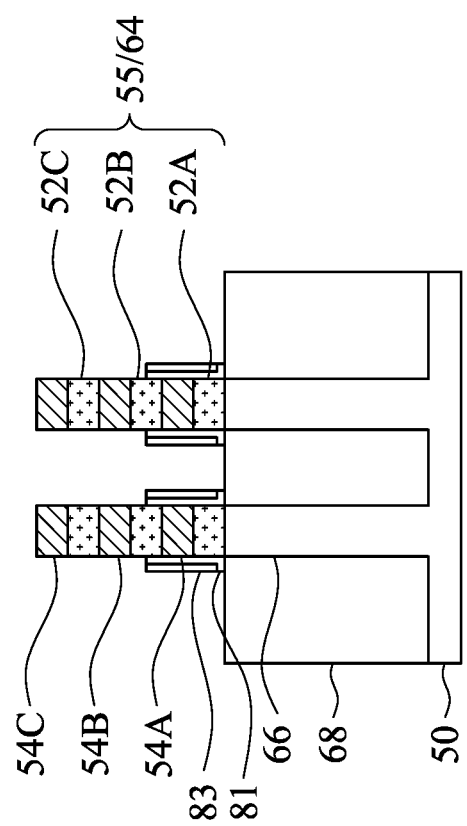

In FIGS. 8A through 8C, the first spacer layer 80 and the second spacer layer 82 are etched to form first spacers 81 and second spacers 83. As will be discussed in greater detail below, the first spacers 81 and the second spacers 83 may be used to self-align subsequently formed source/drain regions, as well as to protect sidewalls of the fins 66 and/or nanostructure 55 during subsequent processing. The first spacer layer 80 and the second spacer layer 82 may be etched using suitable etching processes, such as isotropic etching processes (e.g., wet etching processes), anisotropic etching processes (e.g., dry etching processes), multiple processes or combinations thereof, or the like. In some embodiments, the material of the second spacer layer 82 has a different etch rate than the material of the first spacer layer 80, such that the first spacer layer 80 may act as an etch stop layer when patterning the second spacer layer 82. The second spacer layer 82 may also act as a mask when patterning the first spacer layer 80. For example, the second spacer layer 82 may be etched using an anisotropic etching process while the first spacer layer 80 acts as an etch stop layer. Remaining portions of the second spacer layer 82 may form second spacers 83, as illustrated in FIG. 8C. Thereafter, the second spacers 83 act as a mask while etching exposed portions of the first spacer layer 80, thereby forming first spacers 81, as illustrated in FIGS. 8B and 8C.

As illustrated in FIG. 8C, the first spacers 81 and the second spacers 83 are disposed on sidewalls of the fins 66 and/or the nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
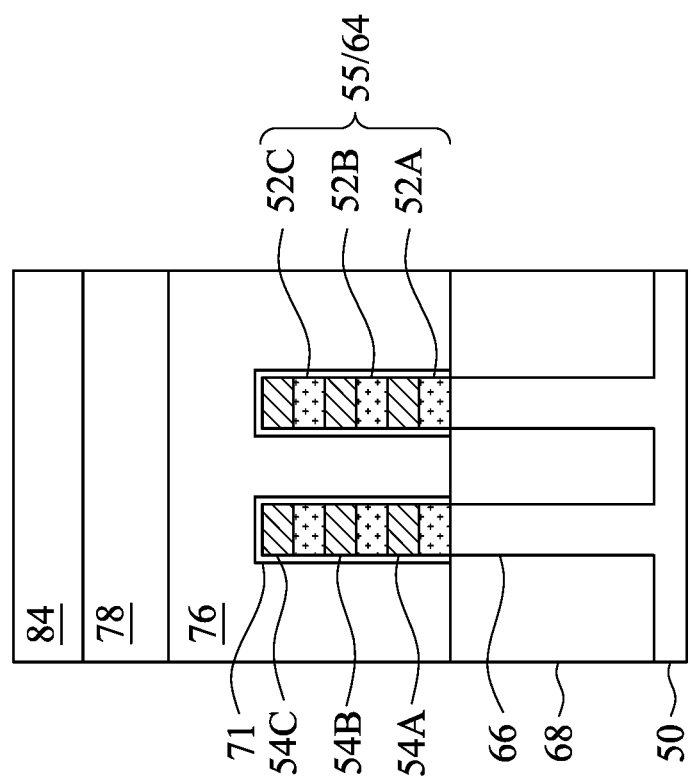
Figure 9B:
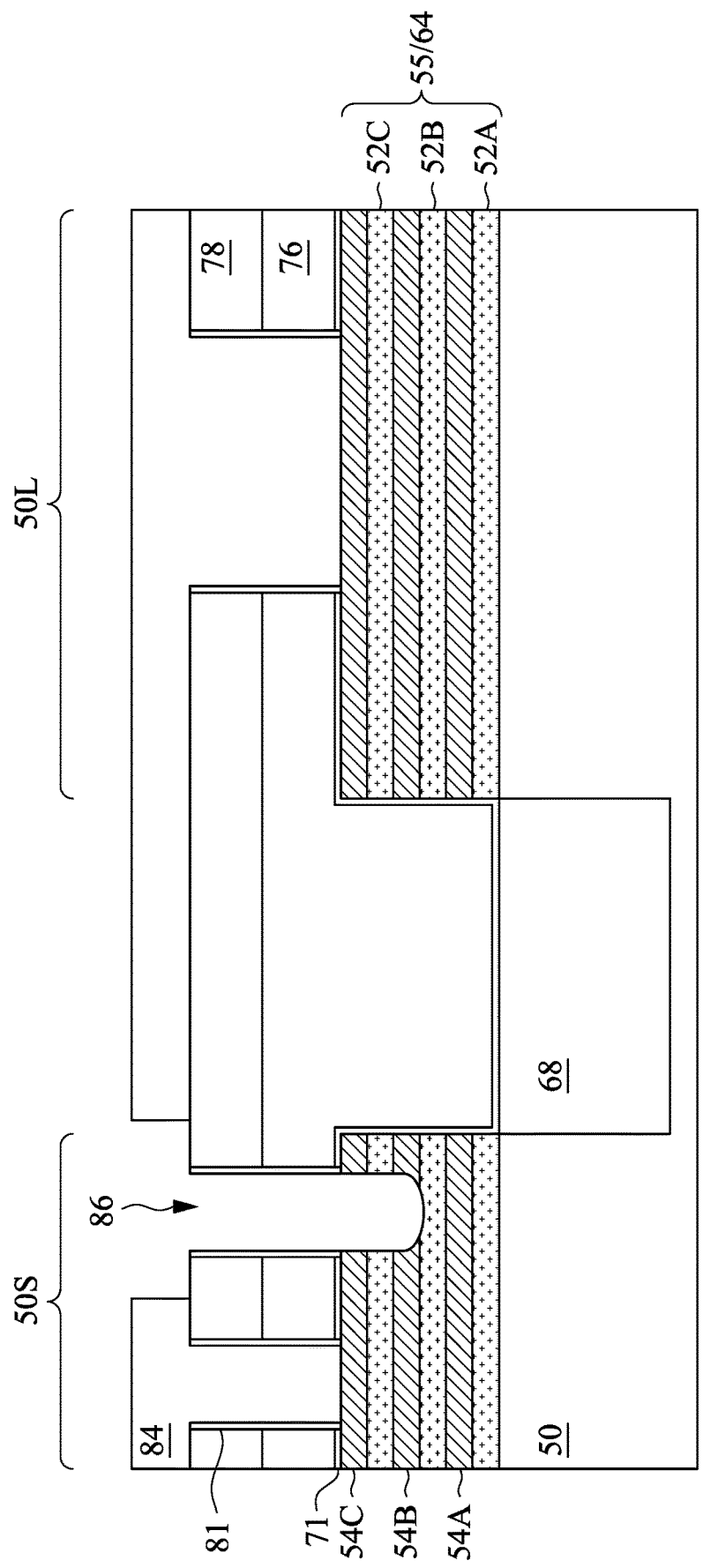
Figure 9C:
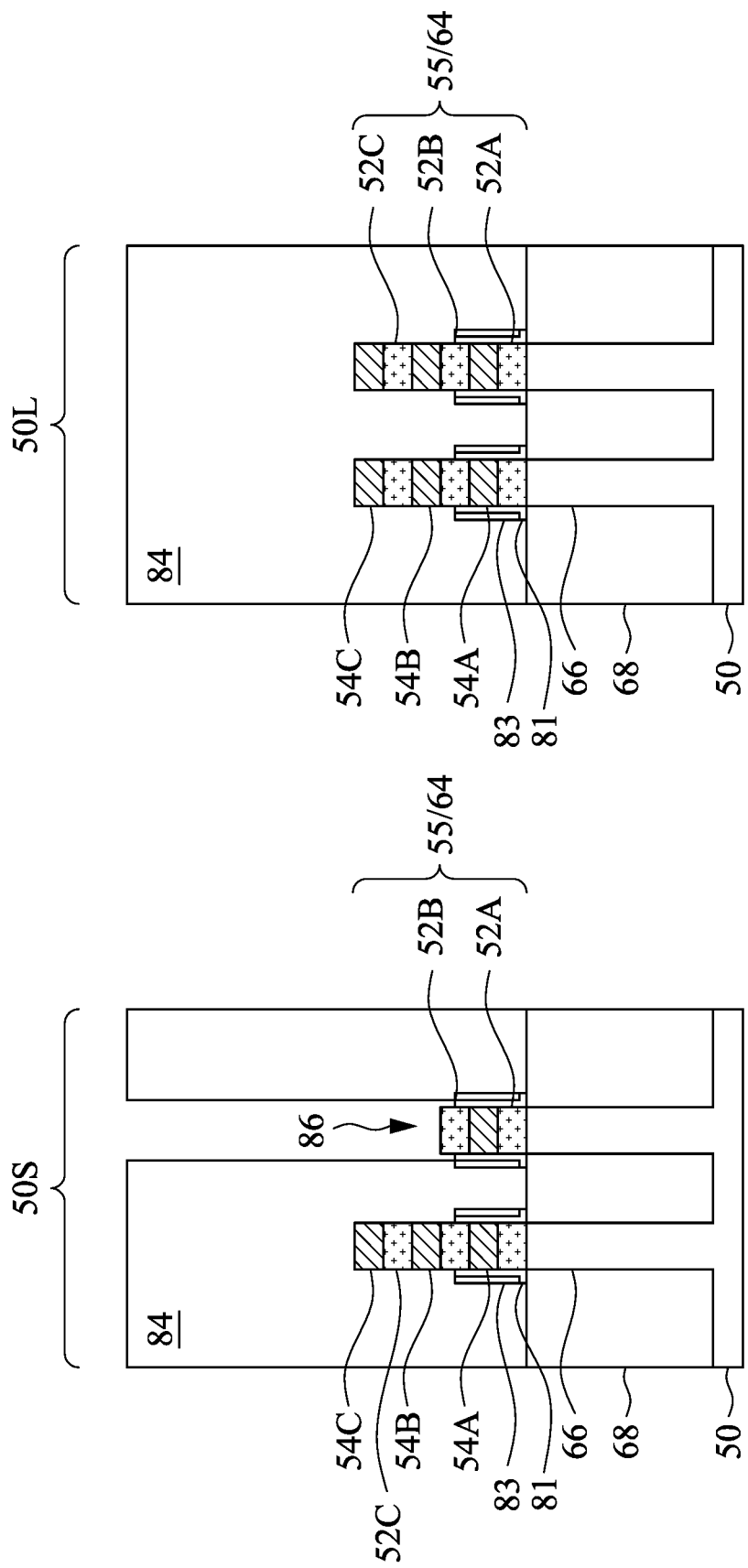

In FIGS. 9A through 9C, first recesses 86 are formed in the nanostructures 55. Epitaxial materials and epitaxial source/drain regions will be subsequently formed in the first recesses 86. The first recesses 86 may extend through one or more of the first nanostructures 52 and the second nanostructures 54. As illustrated in FIGS. 9B and 9C, the first recesses 86 may extend through the second nanostructure 54C, the first nanostructure 52C, the second nanostructure 54B, and partially through the first nanostructure 52B. However, in some embodiments, the first recesses 86 may extend through any of the first nanostructures 52 and the second nanostructures 54 and even into the substrate 50. As illustrated in FIGS. 9B and 9C, the first recesses 86 may be formed in the short-channel region 50S.

The first recesses 86 may be formed by forming a first patterned mask 84 over the structures illustrated in FIGS. 8A through 8C, then etching the nanostructures 55 using the first patterned mask 84, the masks 78, the first spacers 81, and the second spacers 83 as masks. The first patterned mask 84 may be formed by depositing a photoresist layer using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the first patterned mask 84. The nanostructures 55 are then etched using anisotropic etching processes, such as RIE, NBE, or the like. A single etching process or multiple etching processes may be used to etch each layer of the nanostructures 55. Timed etching processes may be used to stop the etching of the first recesses 86 after the first recesses 86 reach a desired depth. The first patterned mask 84 may then be removed.

Figure 10A:
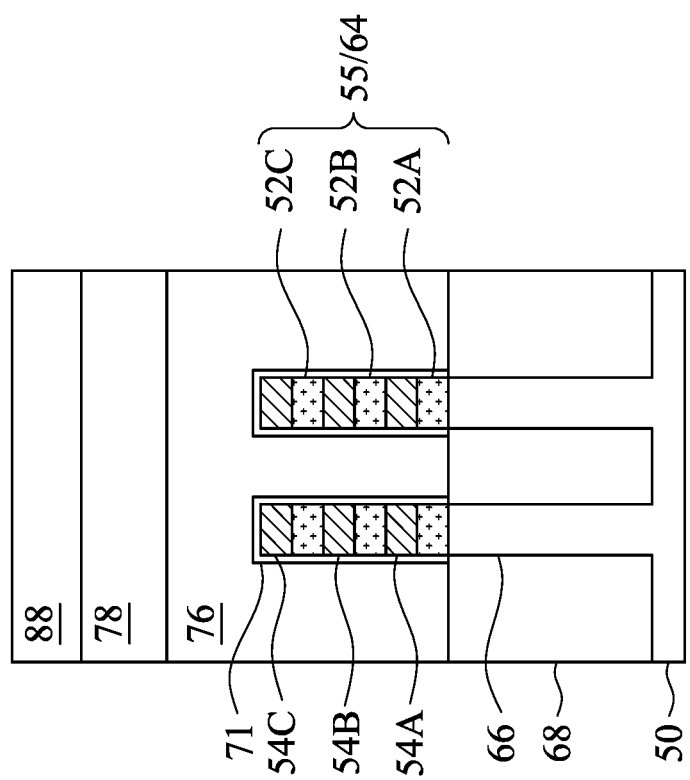
Figure 10B:
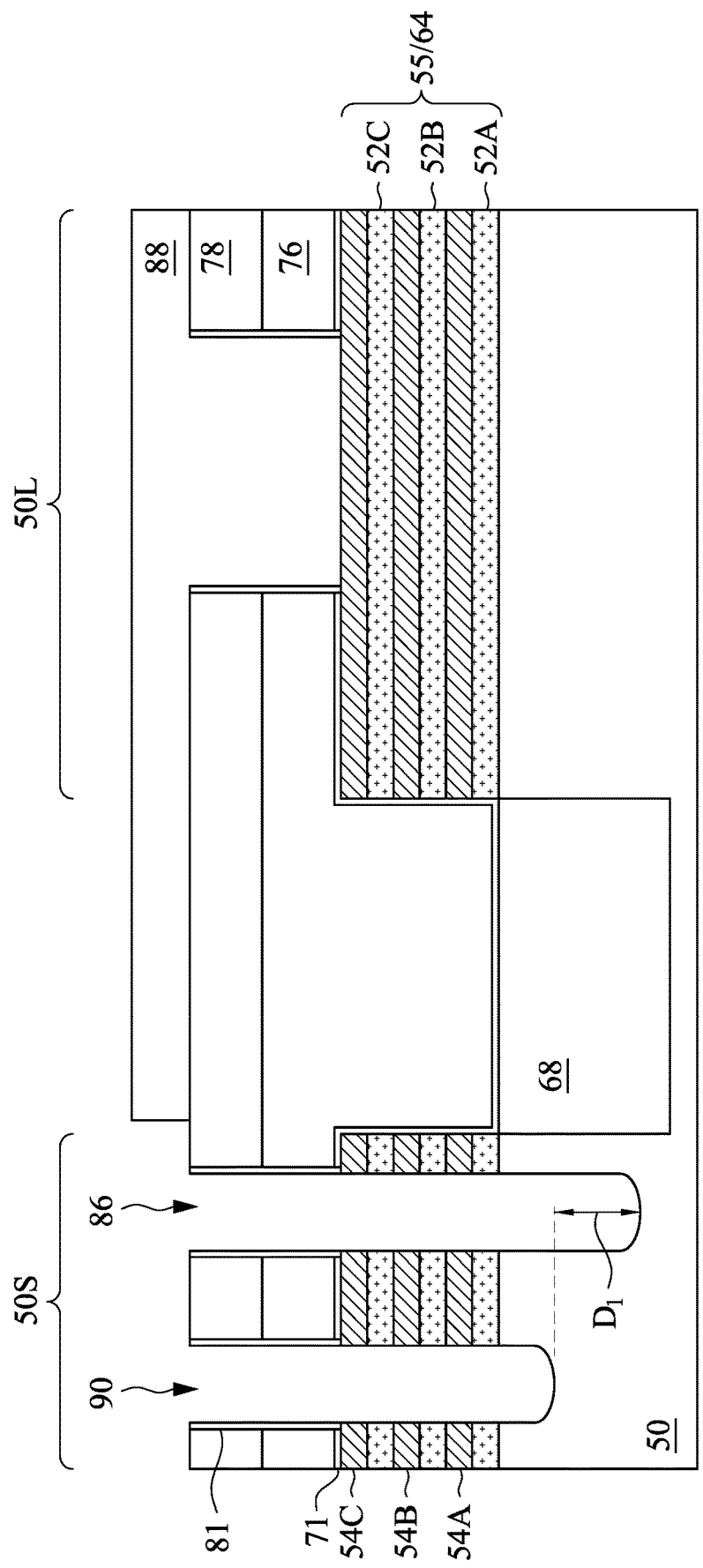
Figure 10C:
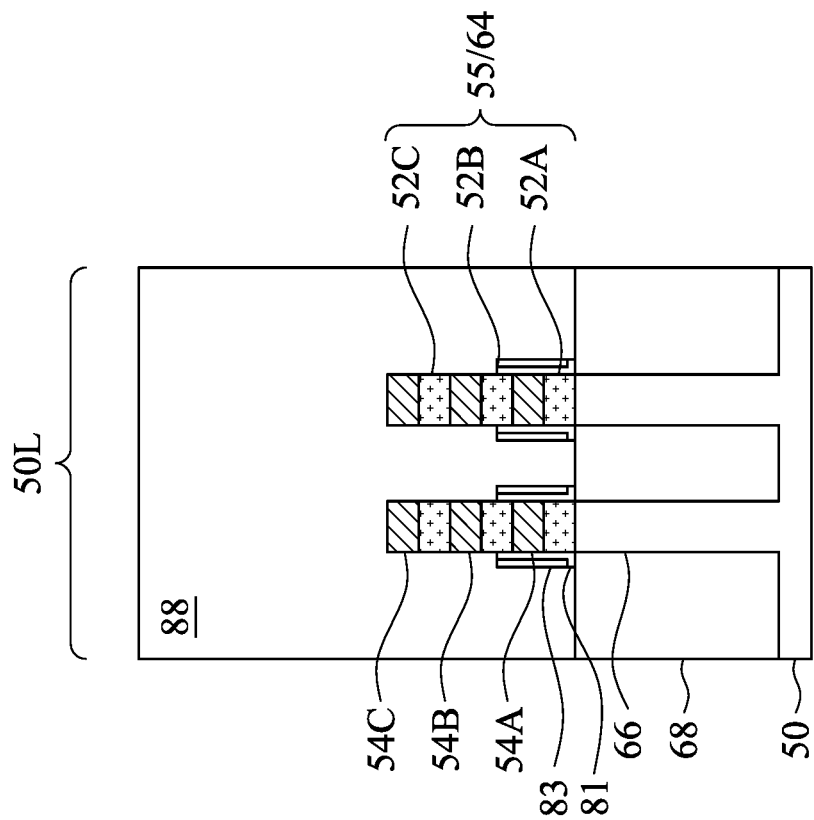
Figure 10C:
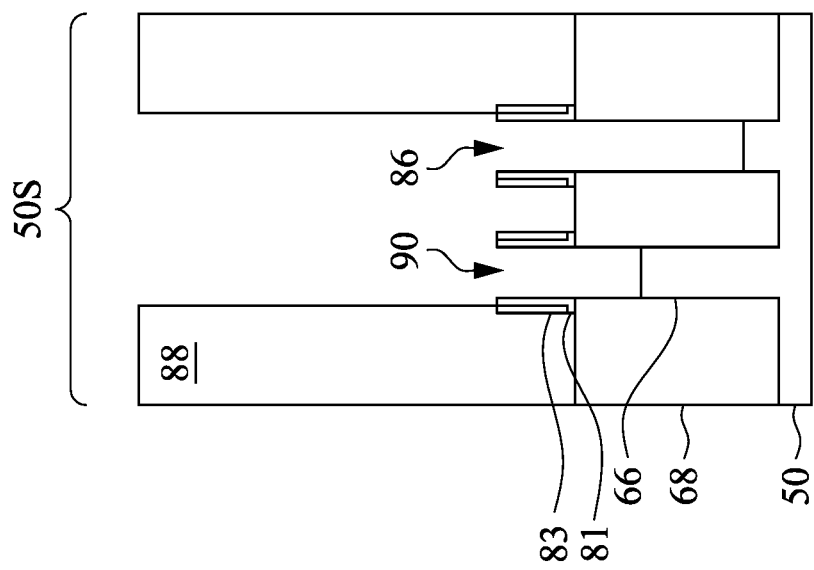

In FIGS. 10A through 10C, the first recesses 86 are extended through the nanostructures 55 and into the fins 66 and the substrate 50 and second recesses 90 are formed in the nanostructures 55, the fins 66, and the substrate 50. Epitaxial materials and epitaxial source/drain regions will be subsequently formed in the first recesses 86 and epitaxial source/drain regions will be subsequently formed in the second recesses 90. As illustrated in FIGS. 10B and 10C, both the first recesses 86 and the second recesses 90 may extend through the nanostructures 55 and into the fins 66 and the substrate 50. Bottom surfaces of the first recesses 86 and the second recesses 90 may be disposed below top surfaces of the STI regions 68. Bottom surfaces of the first recesses 86 may be disposed a distance $D_1$ below bottom surfaces of the second recesses 90 ranging from about 30 nm to about 70 nm. As illustrated in FIGS. 10B and 10C, both the first recesses 86 and the second recesses 90 may be formed in the short-channel region 50S.

The first recesses 86 may be extended and the second recesses 90 formed by forming a second patterned mask 88 over the structures illustrated in FIGS. 9A through 9C after removing the first patterned mask 84, then etching the nanostructures 55, the fins 66, and the substrate 50 using the second patterned mask 88, the masks 78, the first spacers 81, and the second spacers 83 as masks. The second patterned mask 88 may be formed by depositing a photoresist layer using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the second patterned mask 88. The nanostructures 55, the fins 66, and the substrate 50 are then etched using anisotropic etching processes, such as RIE, NBE, or the like. A single etching process or multiple etching processes may be used to etch each layer of the nanostructures 55, the fins 66, and/or the substrate 50. Timed etching processes may be used to stop the etching of the first recesses 86 and the second recesses 90 after the first recesses 86 and the second recesses 90 reach a desired depth. The second patterned mask 88 may then be removed.

Figure 11A:
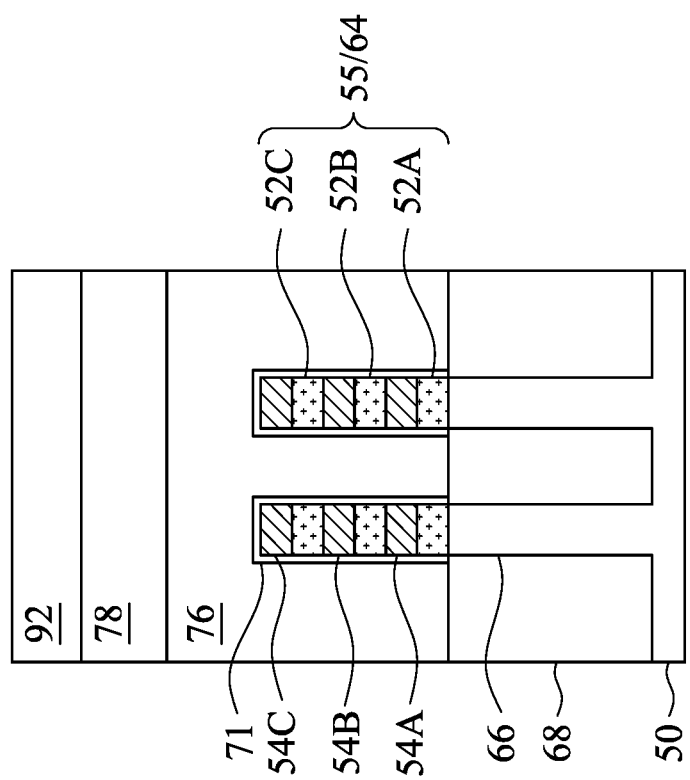
Figure 11B:
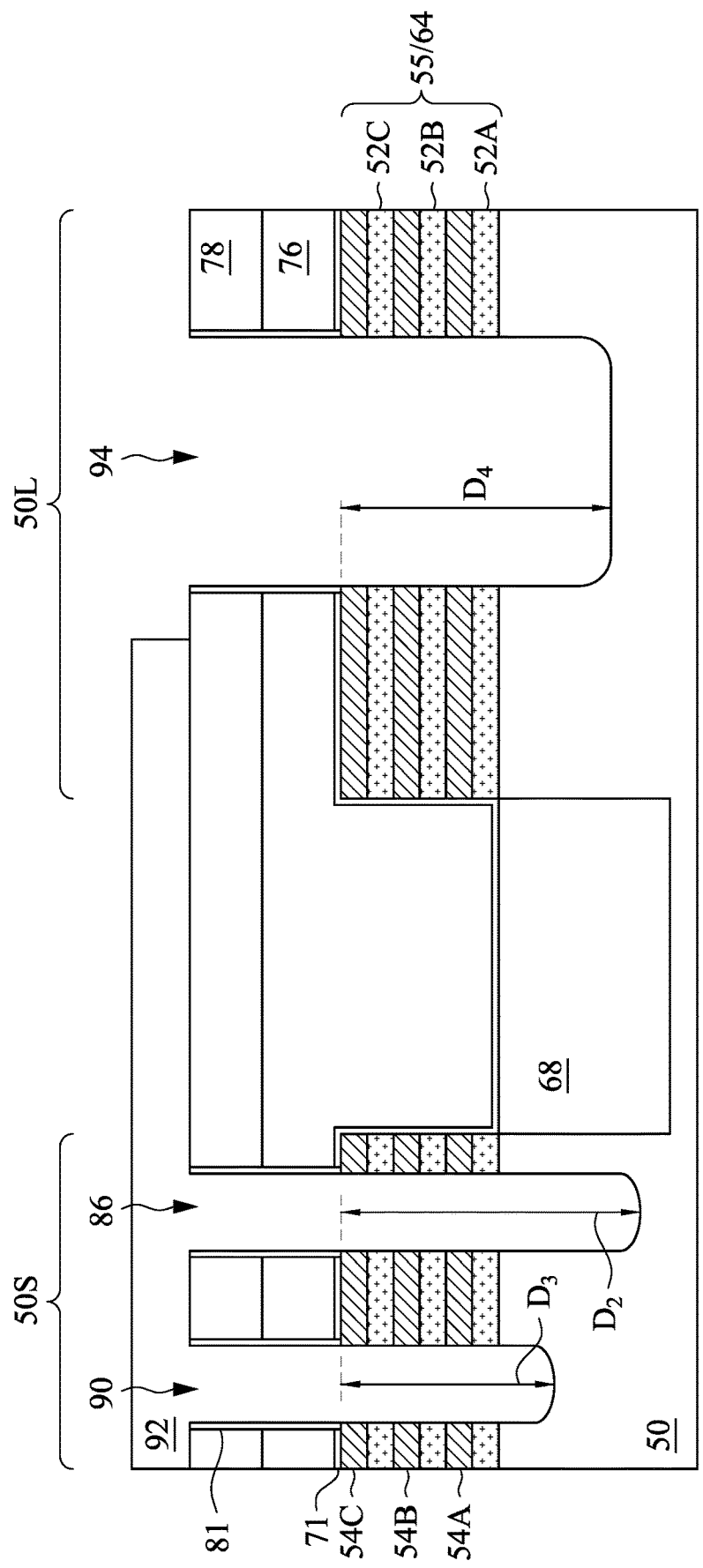
Figure 11C:
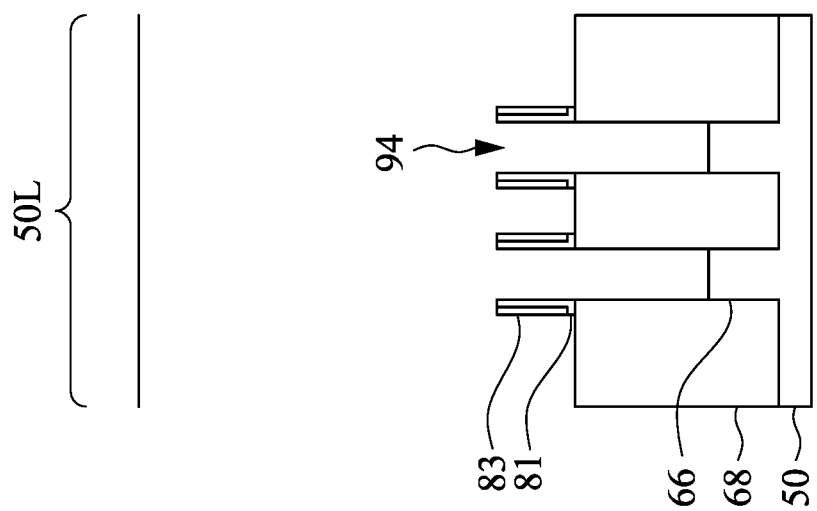
Figure 11C:
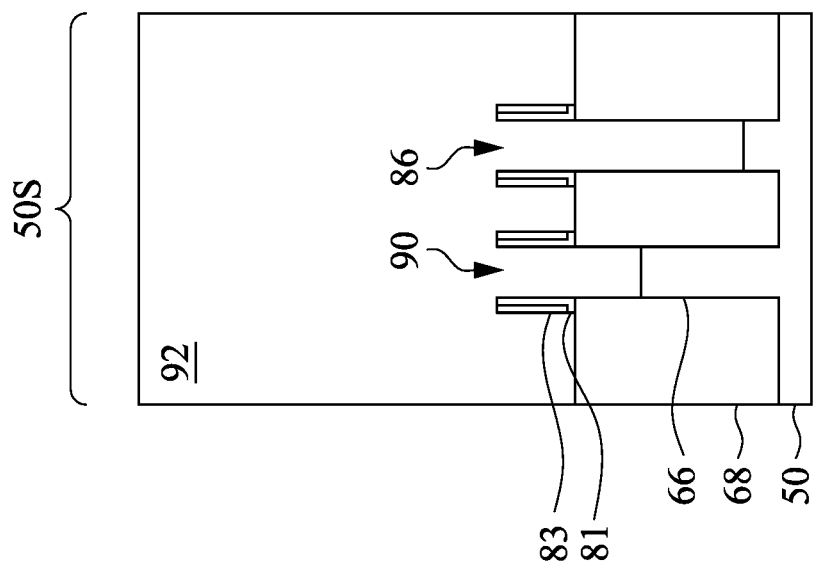

In FIGS. 11A through 11C, third recesses 94 are formed in the nanostructures 55, the fins 66, and the substrate 50. Epitaxial source/drain regions will be subsequently formed in the third recesses 94. As illustrated in FIGS. 11B and 11C, the third recesses 94 may extend through the nanostructures 55 and into the fins 66 and the substrate 50. Bottom surfaces of the third recesses 94 may be disposed below top surfaces of the STI regions 68. As illustrated in FIGS. 11B and 11C, the third recesses 94 may be formed in the long-channel region 50L.

The third recesses 94 may be formed by forming a third patterned mask 92 over the structures illustrated in FIGS. 10A through 10C after removing the second patterned mask 88, then etching the nanostructures 55, the fins 66, and the substrate 50 using the third patterned mask 92, the masks 78, the first spacers 81, and the second spacers 83 as masks. The third patterned mask 92 may be formed by depositing a photoresist layer using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the third patterned mask 92. The nanostructures 55, the fins 66, and the substrate 50 are then etched using anisotropic etching processes, such as RIE, NBE, or the like. A single etching process or multiple etching processes may be used to etch each layer of the nanostructures 55, the fins 66, and/or the substrate 50. Timed etching processes may be used to stop the etching of the third recesses 94 after the third recesses 94 reach a desired depth. The third patterned mask 92 may then be removed.

As illustrated in FIG. 11B, the first recesses 86 extend to a depth $D_2$ below top surfaces of the fins 66, the second recesses 90 extend to a depth $D_3$ below top surfaces of the fins 66, and the third recesses 94 extend to a depth $D_4$ below top surfaces of the fins 66. The depth $D_2$ may be from about 5 nm to about 30 nm, the depth $D_3$ may be from about 50 nm to about 150 nm, and the depth $D_4$ may be from about 50 nm to about 150 nm. The first recesses 86, the second recesses 90, and the third recesses 94 may be etched to depths in the above ranges in order to control the length of subsequently formed backside vias (such as the backside vias 180, discussed below with respect to FIGS. 37A through 37F). Moreover, providing backside vias having selected lengths may improve device performance and providing backside vias in the long-channel regions 50L as well as the short-channel regions 50S may improve performance while also increasing device density in the long-channel regions 50L.

Figure 12A:
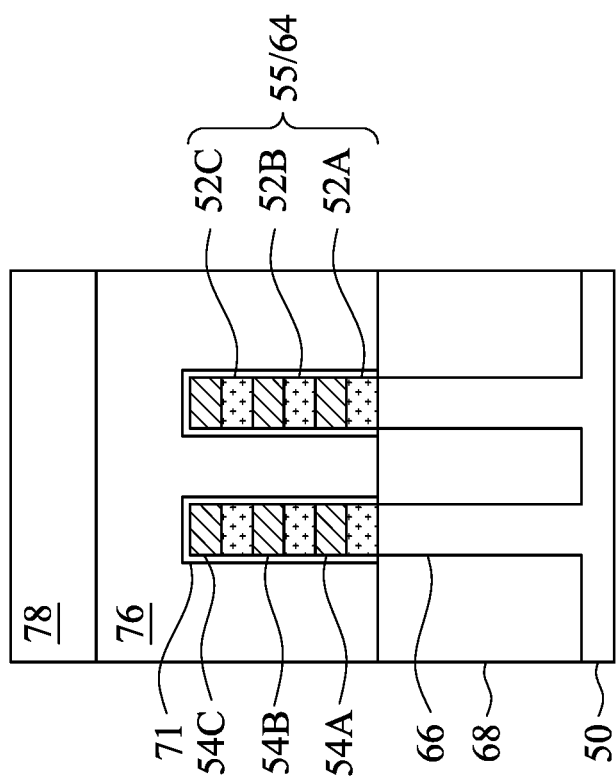
Figure 12B:
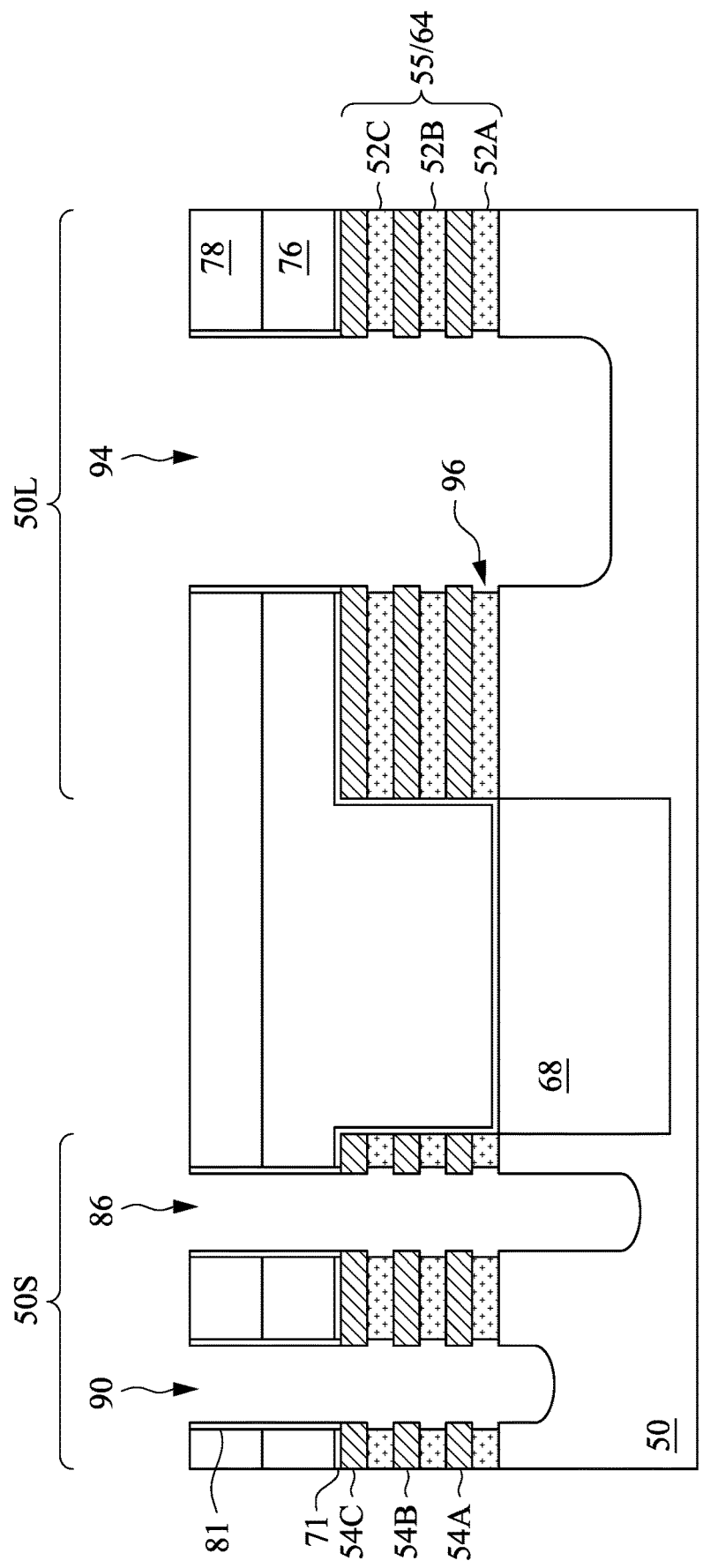
Figure 12C:
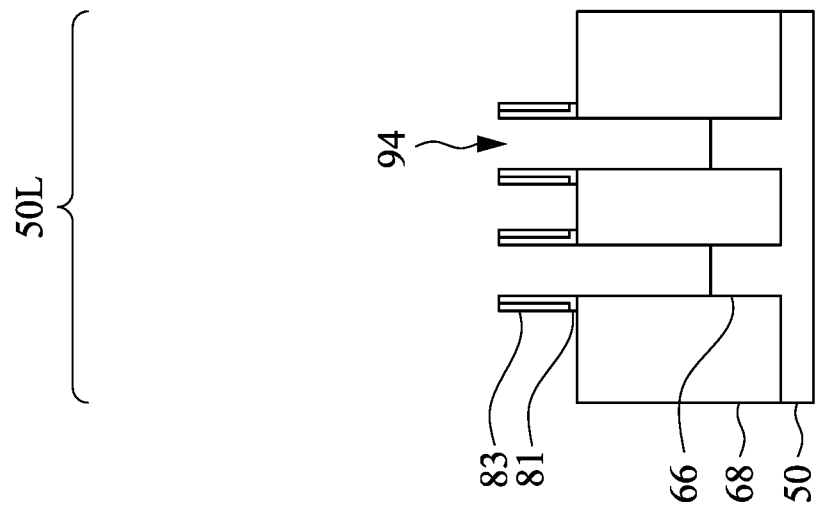
Figure 12C:
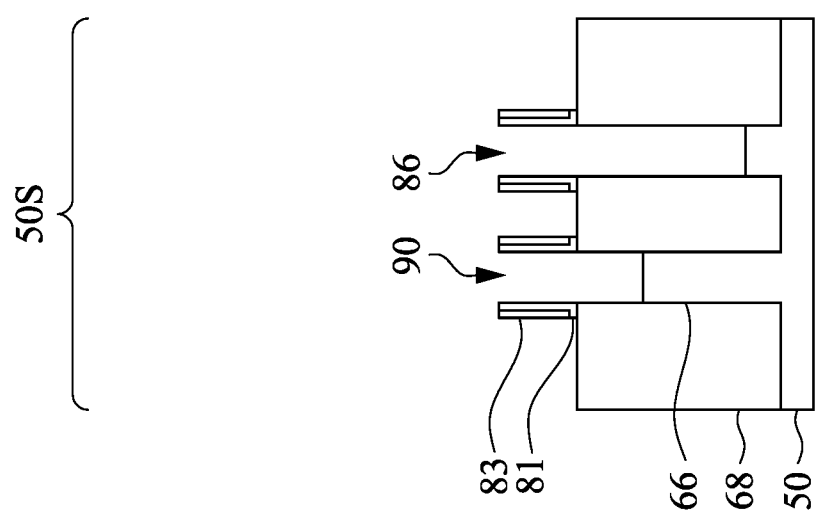

In FIGS. 12A through 12C, portions of sidewalls of the layers of the multi-layer stack 64 formed of the first semiconductor materials (e.g., the first nanostructures 52) exposed by the first recesses 86, the second recesses 90, and the third recesses 94 are etched to form sidewall recesses 96. Although sidewalls of the first nano structures 52 adjacent the sidewall recesses 96 are illustrated as being straight in FIG. 12B, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a wet etch process with tetramethylammonium hydroxide (TMAH), ammonium hydroxide ($NH_4OH$), or the like may be used to etch sidewalls of the first nanostructures 52.

Figure 13A:
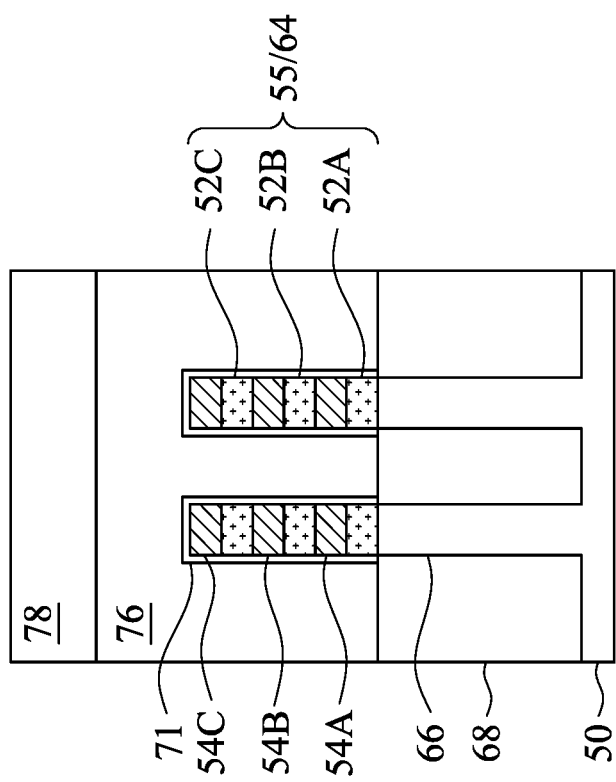
Figure 13B:
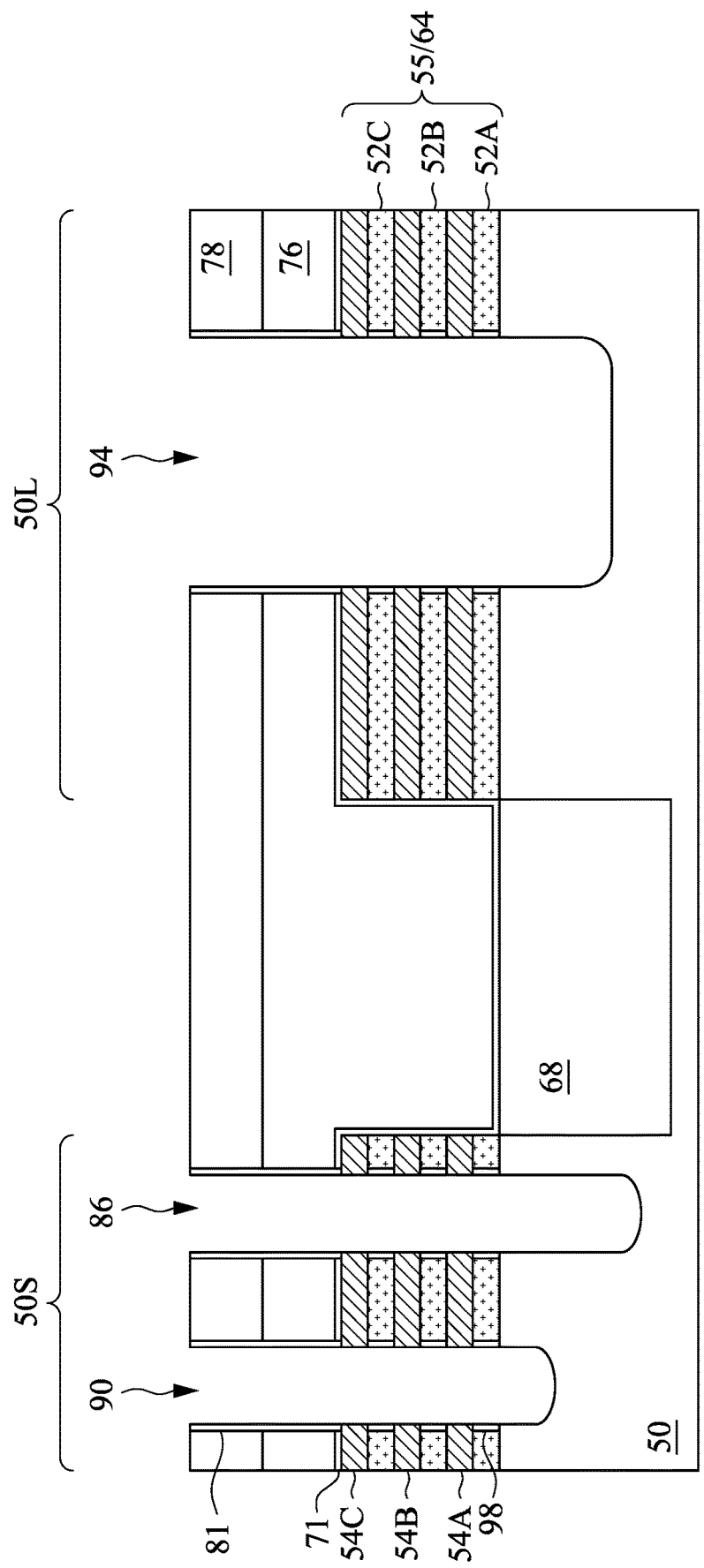
Figure 13C:
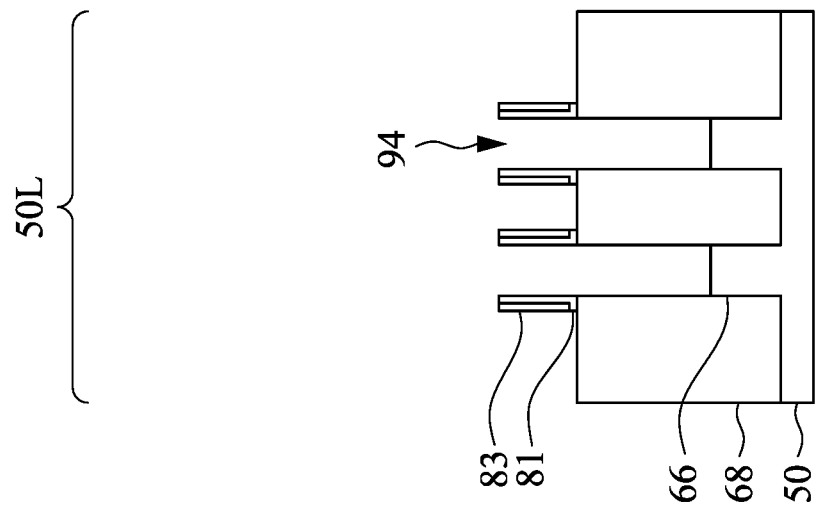
Figure 13C:
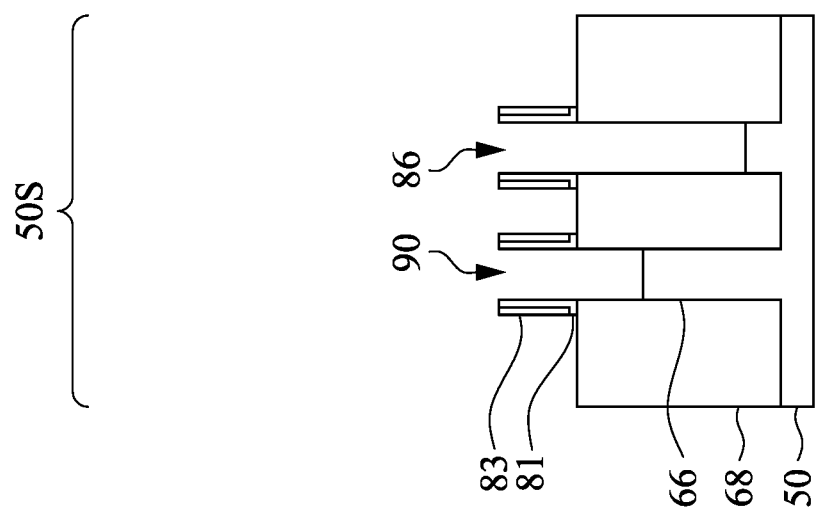
Figure 13D:
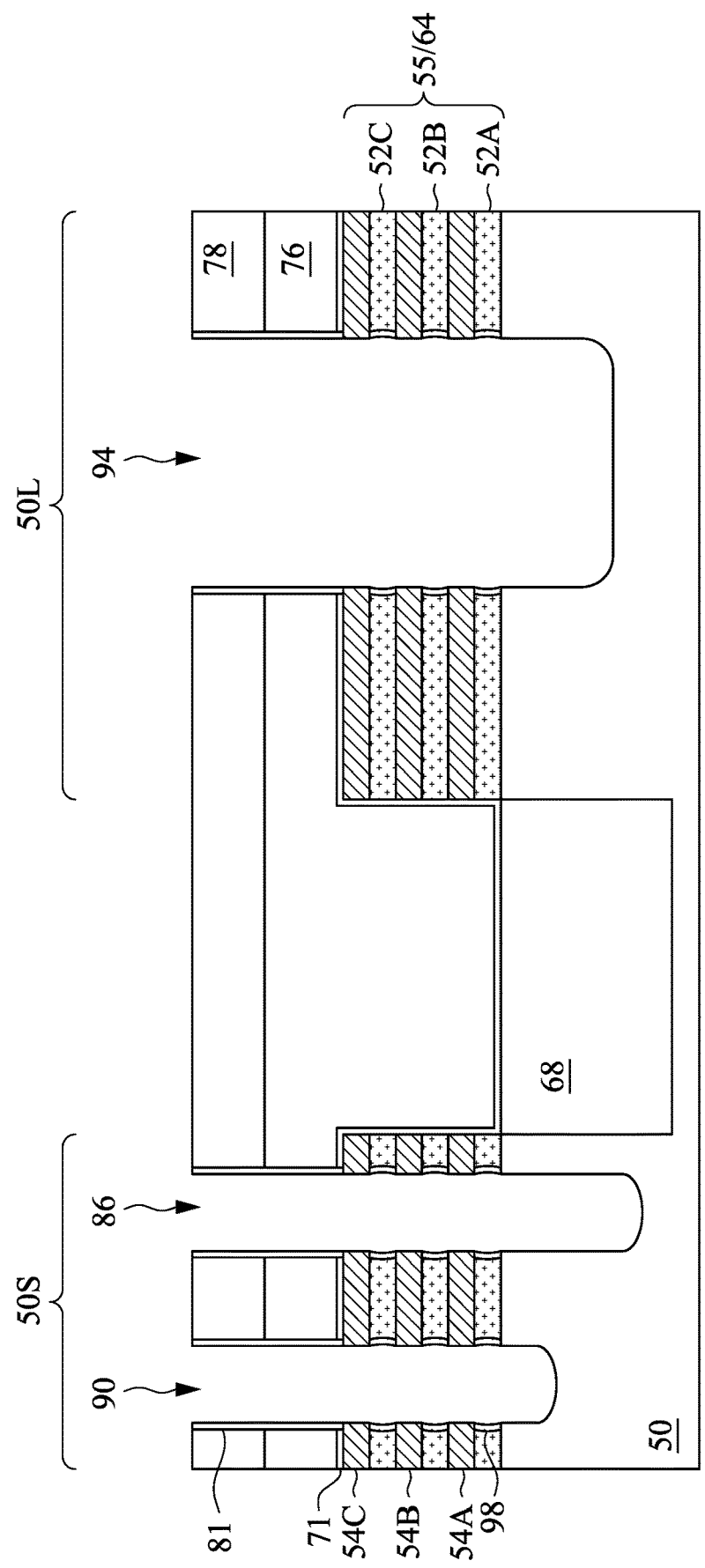

In FIGS. 13A through 13D, first inner spacers 98 are formed in the sidewall recess 96. The first inner spacers 98 may be formed by depositing an inner spacer layer (not separately illustrated) over the structures illustrated in FIGS. 12A through 12C. The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. In some embodiments, the inner spacer layer may comprise silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), silicon (Si), zirconium nitride (ZrN), silicon carbonitride (SiCN), combinations or multiple layers thereof, or the like. The inner spacer layer may be deposited to a thickness from about 1 nm to about 40 nm. The inner spacer layer may be etched by an anisotropic etching process, such as RIE, NBE, or the like, to form the first inner spacers 98. Although outer sidewalls of the first inner spacers 98 are illustrated as being flush with sidewalls of the second nanostructures 54, the outer sidewalls of the first inner spacers 98 may extend beyond or be recessed from sidewalls of the second nanostructures 54. Moreover, although the outer sidewalls of the first inner spacers 98 are illustrated as being straight in FIG. 13B, the outer sidewalls of the first inner spacers 98 may be concave or convex. As an example, FIG. 13D illustrates an embodiment in which sidewalls of the first nanostructures 52 are concave, outer sidewalls of the first inner spacers 98 are concave, and the first inner spacers 98 are recessed from sidewalls of the second nanostructures 54.

The first inner spacers 98 act as isolation features between subsequently formed source/drain regions (such as the epitaxial source/drain regions 106, discussed below with respect to FIGS. 15A through 15D) and subsequently formed gate structures (such as the gate structures including gate dielectric layers 114 and gate electrodes 116, discussed below with respect to FIGS. 20A through 20C). As will be discussed in greater detail below, the source/drain regions will be formed in the first recesses 86, the second recesses 90, and the third recesses 94, while the first nanostructures 52 will be replaced with corresponding gate structures. The first inner spacers 98 may also be used to prevent damage to the source/drain regions by subsequent etching processes, such as etching processes used to form the gate structures.

Figure 14A:
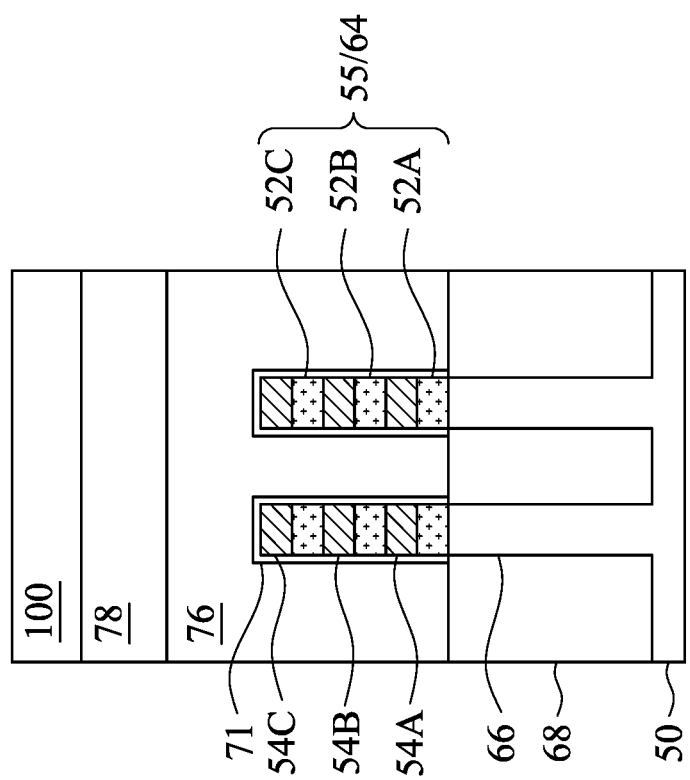
Figure 14B:
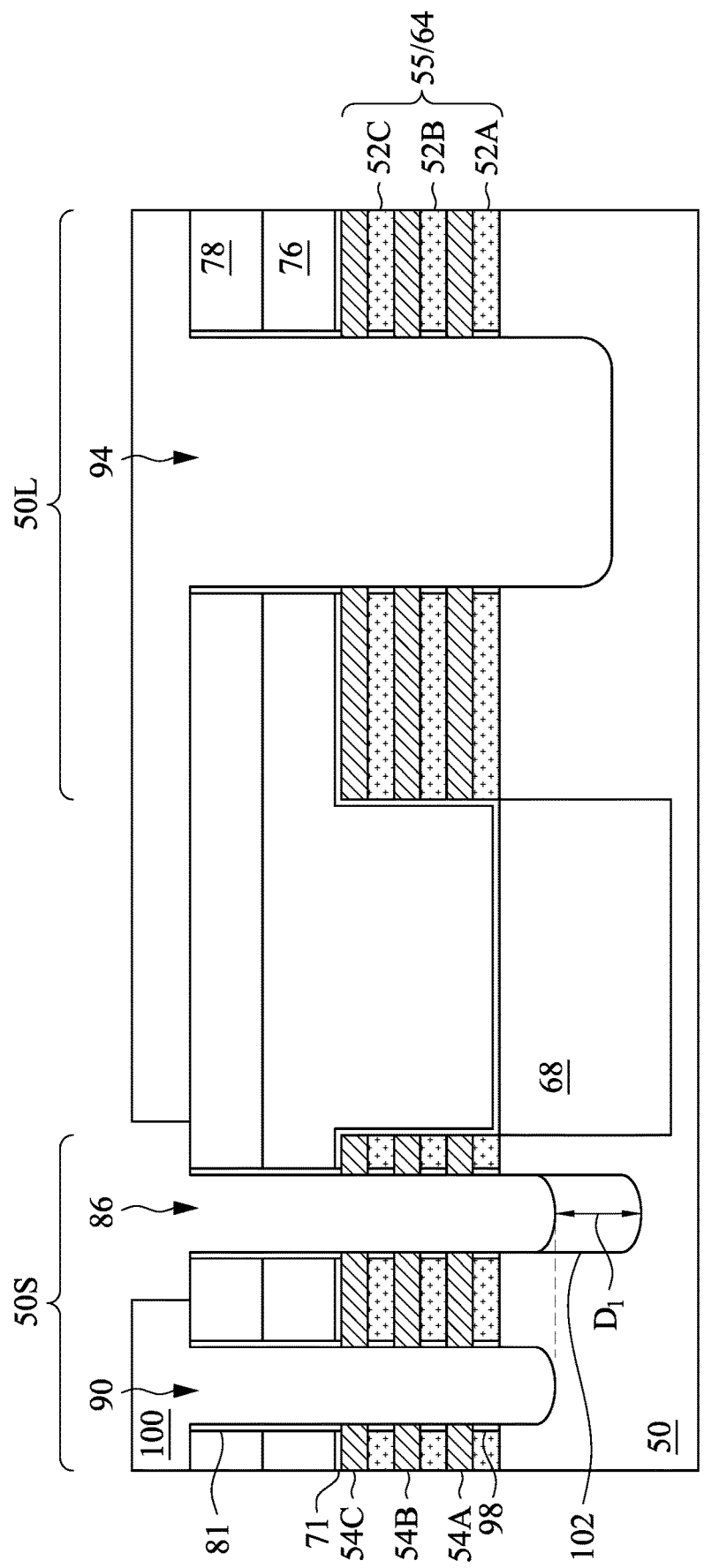
Figure 14C:
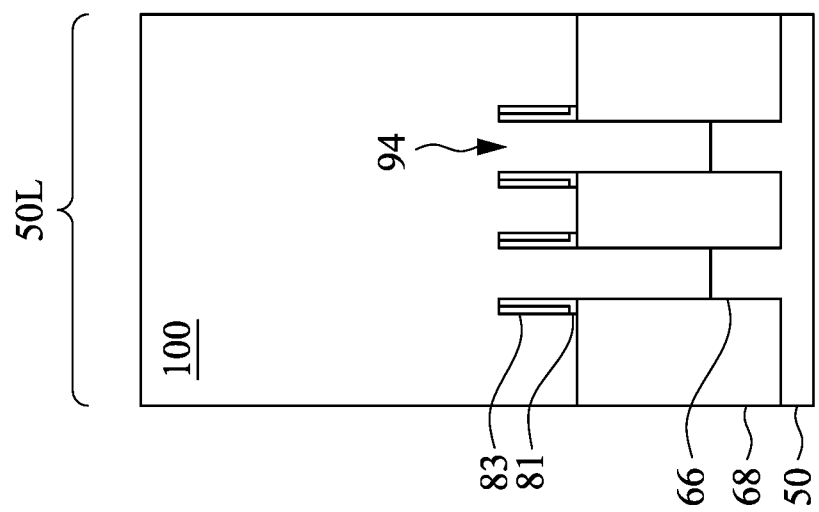
Figure 14C:
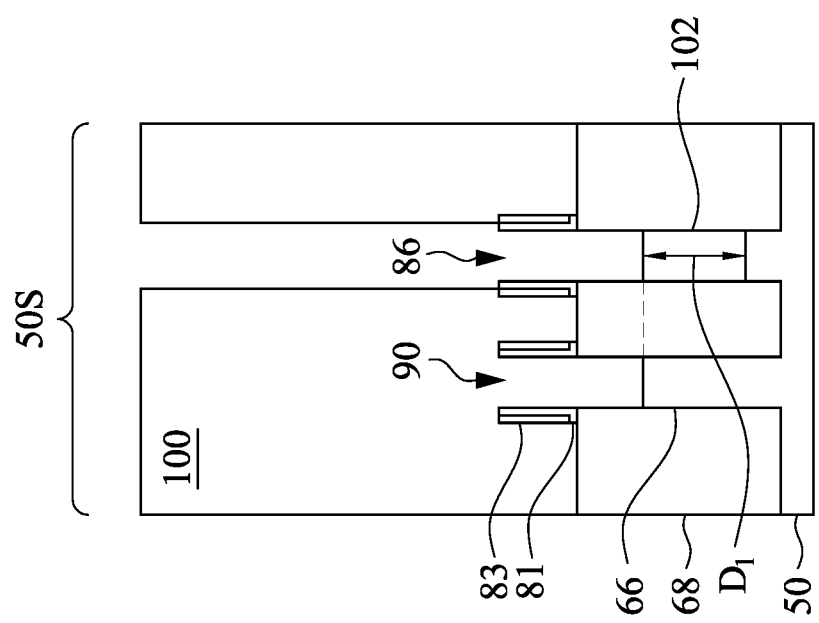

In FIGS. 14A through 14C, a first epitaxial material 102 is formed in the first recesses 86. In some embodiments, the first epitaxial material 102 may be a sacrificial material, which is subsequently removed to form backside vias (such as the backside vias 180, discussed below with respect to FIGS. 37A through 37F). As illustrated in FIGS. 14B and 14C, top surfaces of the first epitaxial material 102 may be level with bottom surfaces of the second recesses 90. However, in some embodiments, top surfaces of the first epitaxial material 102 may be disposed above or below bottom surfaces of the second recesses 90. For example, a height of the first epitaxial material 102 may be substantially equal to the distance $D_1$ (e.g., a height difference between bottom surfaces of the first recesses 86 and the second recesses 90.

The first epitaxial material 102 may be epitaxially grown in the first recesses 86 using a process such as chemical vapor deposition (CVD), atomic layer deposition (ALD), vapor phase epitaxy (VPE), molecular beam epitaxy (MBE), or the like. A fourth patterned mask 100 may be formed over the structures illustrated in FIGS. 10A through 10C before forming the first epitaxial material 102 to prevent the first epitaxial material 102 from being formed in the second recesses 90 and the third recesses 94. The fourth patterned mask 100 may be formed by depositing a photoresist layer using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the fourth patterned mask 100. The first epitaxial material 102 may then be deposited in the first recesses 86. The fourth patterned mask 100 may then be removed.

The first epitaxial material 102 may include any acceptable material, such as silicon germanium or the like. In embodiments in which the first epitaxial material 102 includes silicon germanium, a germanium concentration in the first epitaxial material 102 may be from about 10 atomic percent to about 50 atomic percent. Providing germanium concentrations in the above range allows the substrate 50 to be selectively etched with respect to the first epitaxial material 102 in subsequent process steps. Providing germanium concentrations in the above range may also allow for the first epitaxial material 102 to be selectively etched with respect to subsequently formed source/drain regions (such as the epitaxial source/drain regions 106, discussed below with respect to FIGS. 15A through 15D) and dielectric layers. As such, the first epitaxial material 102 may be removed and replaced with backside vias without significantly removing the epitaxial source/drain regions and the interlayer dielectrics.

In FIGS. 15A through 15D, a second epitaxial material 104 is formed in the first recesses 86 over the first epitaxial material 102 and in the second recesses 90 and the third recesses 94 and epitaxial source/drain regions 106 are formed over the second epitaxial material 104. In some embodiments, the second epitaxial material 104 may be a sacrificial material, which is subsequently removed. The second epitaxial material 104 may be epitaxially grown in the first recesses 86, the second recesses 90, and the third recesses 94 using a process such as chemical vapor deposition (CVD), atomic layer deposition (ALD), vapor phase epitaxy (VPE), molecular beam epitaxy (MBE), or the like.

The second epitaxial material 104 may include any acceptable material, such as silicon, silicon germanium, boron-doped silicon germanium, or the like. In embodiments in which the second epitaxial material 104 includes silicon germanium, a germanium concentration in the second epitaxial material 104 may be from about 10 atomic percent to about 50 atomic percent. In some embodiments, the second epitaxial material 104 may further include dopants. For example, the second epitaxial material 104 in the n-type regions 50N may include phosphorous ions and the second epitaxial material 104 in the p-type regions 50P may include boron. The second epitaxial material 104 may have a dopant concentration from about $2\times10^{20}$ atoms/cm$^3$ to about $10\times10^{20}$ atoms/cm$^3$. Providing germanium concentrations and boron concentrations in the above ranges allows the substrate 50 to be selectively etched with respect to the second epitaxial material 104 in subsequent process steps. Providing germanium concentrations and boron concentrations in the above ranges may also allow for the second epitaxial material 104 to be selectively etched with respect to subsequently formed source/drain regions (such as the epitaxial source/drain regions 106, discussed below with respect to FIGS. 15A through 15D) and dielectric layers. As such, the second epitaxial material 104 may be removed without significantly removing the epitaxial source/drain regions and the interlayer dielectrics.

Figure 15A:
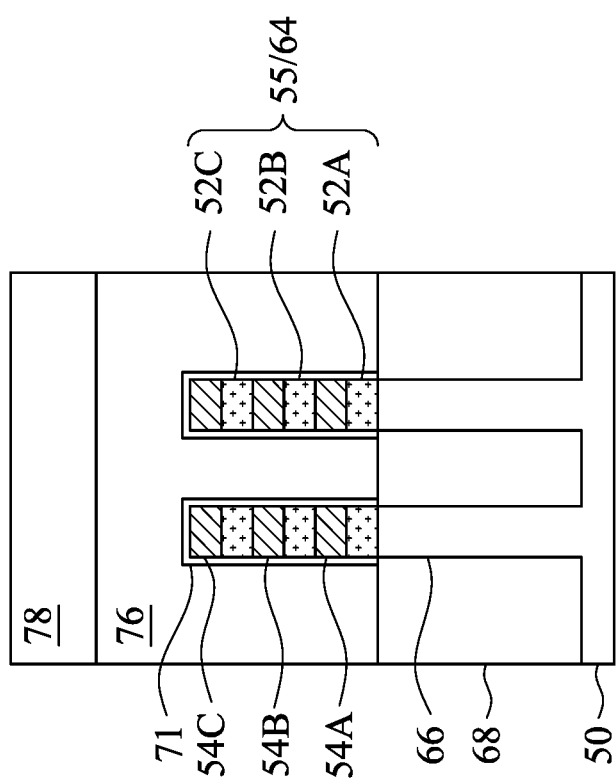
Figure 15B:
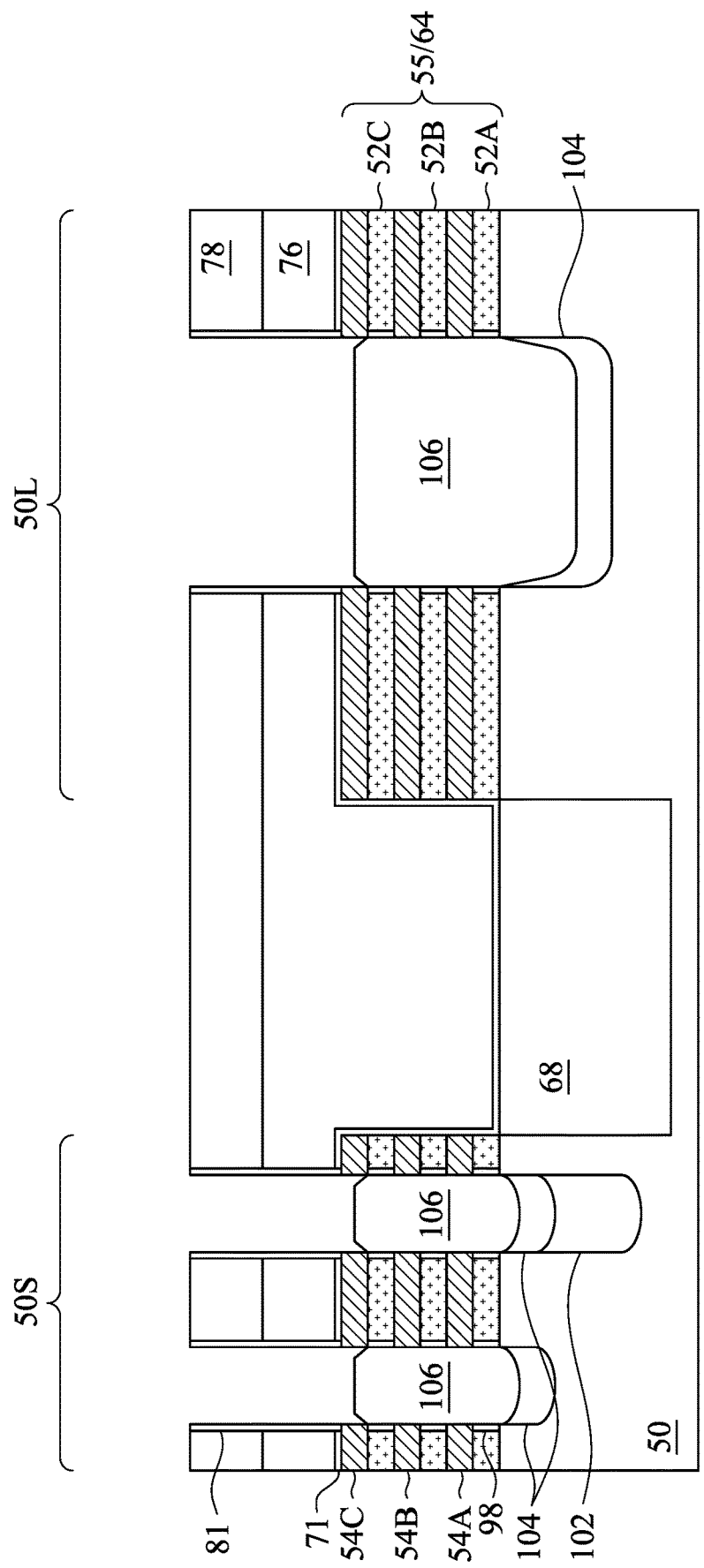
Figure 15C:
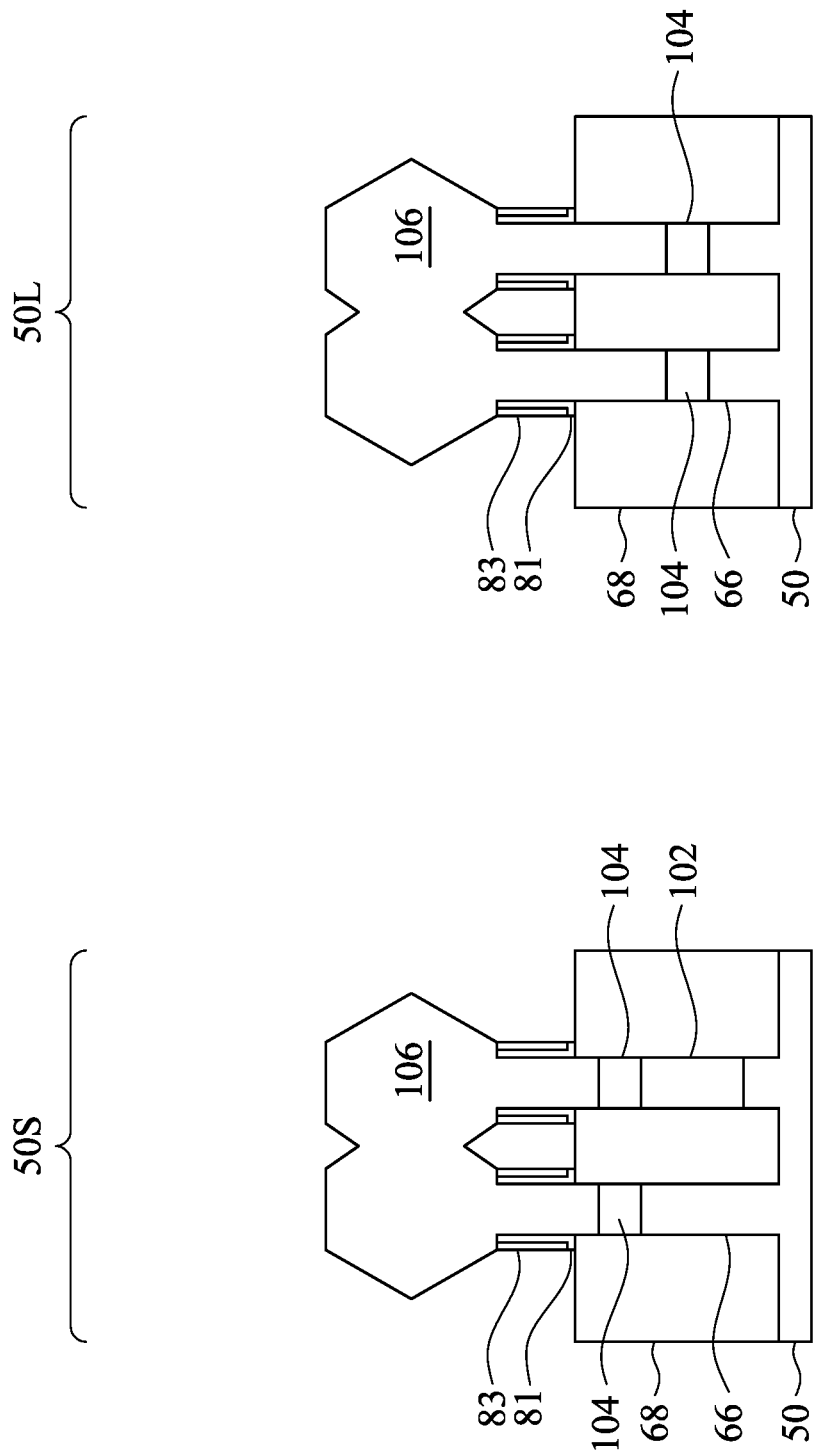

Further in FIGS. 15A through 15D, epitaxial source/drain regions 106 are formed in the first recesses 86, the second recesses 90, and the third recesses 94. In some embodiments, the epitaxial source/drain regions 106 may exert stress on the second nanostructures 54, thereby improving performance. As illustrated in FIG. 15C, the epitaxial source/drain regions 106 are formed in the first recesses 86, the second recesses 90, and the third recesses 94 such that each dummy gate 76 is disposed between respective neighboring pairs of the epitaxial source/drain regions 106. In some embodiments, the first spacers 81 are used to separate the epitaxial source/drain regions 106 from the dummy gates 76 and the first inner spacers 98 are used to separate the epitaxial source/drain regions 106 from the first nanostructures 52 by an appropriate lateral distance so that the epitaxial source/drain regions 106 do not short out with subsequently formed gates of the resulting nano-FETs.

The epitaxial source/drain regions 106 in the n-type region 50N, e.g., the NMOS region, may be formed by masking the p-type region 50P, e.g., the PMOS region. Then, the epitaxial source/drain regions 106 are epitaxially grown in the first recesses 86, the second recesses 90, and the third recesses 94 in the n-type region 50N. The epitaxial source/drain regions 106 may include any acceptable material appropriate for n-type nano-FETs. For example, if the second nanostructures 54 are silicon, the epitaxial source/drain regions 106 may include materials exerting a tensile strain on the second nanostructures 54, such as silicon, silicon carbide, phosphorous doped silicon carbide, silicon phosphide, or the like. The epitaxial source/drain regions 106 may have surfaces raised from respective upper surfaces of the nanostructures 55 and may have facets.

The epitaxial source/drain regions 106 in the p-type region 50P, e.g., the PMOS region, may be formed by masking the n-type region 50N, e.g., the NMOS region. Then, the epitaxial source/drain regions 106 are epitaxially grown in the first recesses 86, the second recesses 90, and the third recesses 94 in the p-type region 50P. The epitaxial source/drain regions 106 may include any acceptable material appropriate for p-type nano-FETs. For example, if the second nanostructures 54 are silicon, the epitaxial source/drain regions 106 may comprise materials exerting a compressive strain or stress on the second nanostructures 54, such as silicon, phosphorous-doped silicon, silicon-germanium, boron-doped silicon-germanium, germanium, germanium tin, or the like. In embodiments in which the epitaxial source/drain regions 106 include silicon germanium, a germanium concentration in the epitaxial source/drain regions 106 may be from about 10 atomic percent to about 50 atomic percent. In some embodiments, the epitaxial source/drain regions 106 may further include dopants. For example, the epitaxial source/drain regions 106 in the n-type regions 50N may include phosphorous ions and the epitaxial source/drain regions 106 in the p-type regions 50P may include boron. The epitaxial source/drain regions 106 may have a dopant concentration from about $2 \times 10^{20}$ atoms/cm$^3$ to about $10 \times 10^{20}$ atoms/cm$^3$. Providing germanium concentrations and boron concentrations in the above ranges allows the substrate 50 to be selectively etched with respect to the second epitaxial material 104 in subsequent process steps. Providing germanium concentrations and boron concentrations in the above ranges allows for the second epitaxial material 104 to be selectively etched with respect to the epitaxial source/drain regions 106. As such, the second epitaxial material 104 may be removed without significantly removing the epitaxial source/drain regions 106. The epitaxial source/drain regions 106 may also have surfaces raised from respective surfaces of the nanostructures 55 and may have facets.

The epitaxial source/drain regions 106, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 106 may be in situ doped during growth.

Figure 15D:
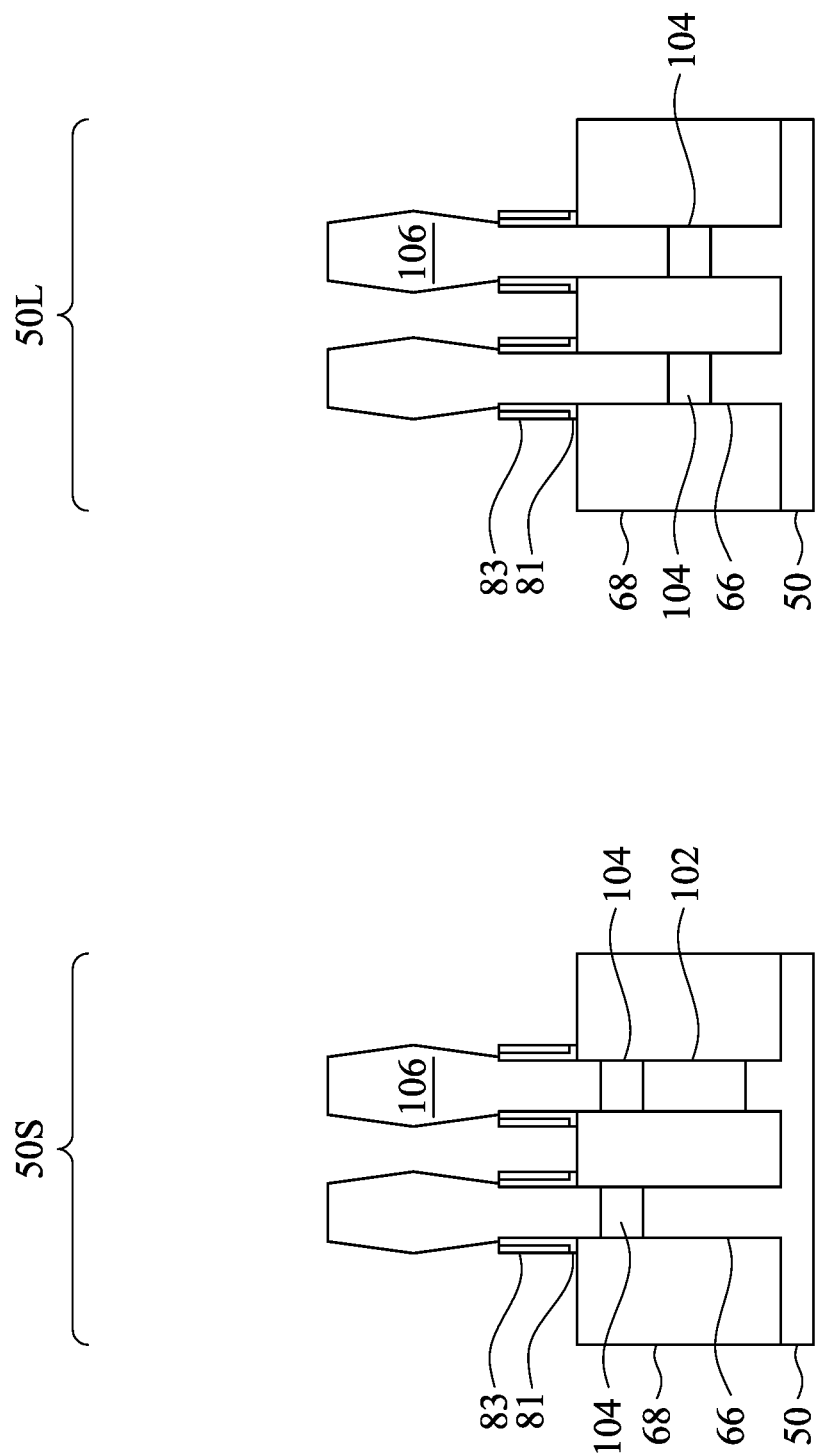

As a result of the epitaxy processes used to form the epitaxial source/drain regions 106 in the n-type region 50N and the p-type region 50P, upper surfaces of the epitaxial source/drain regions 106 have facets which expand laterally outward beyond sidewalls of the nanostructures 55. In some embodiments, these facets cause adjacent epitaxial source/drain regions 106 of a same nano-FET to merge, as illustrated by FIG. 15C. In some embodiments, adjacent epitaxial source/drain regions 106 remain separated after the epitaxy process is completed, as illustrated by FIG. 15D. In the embodiments illustrated in FIGS. 15C and 15D, the first spacers 81 may be formed extending from top surfaces of the STI regions 68 thereby blocking the epitaxial growth. In some other embodiments, the first spacers 81 may cover portions of the sidewalls of the nanostructures 55 further blocking the epitaxial growth. In some embodiments, the etching process used to form the first spacers 81 may be adjusted to remove the spacer material and allow the epitaxial source/drain regions 106 to extend to the surfaces of the STI regions 68.

Figure 16A:
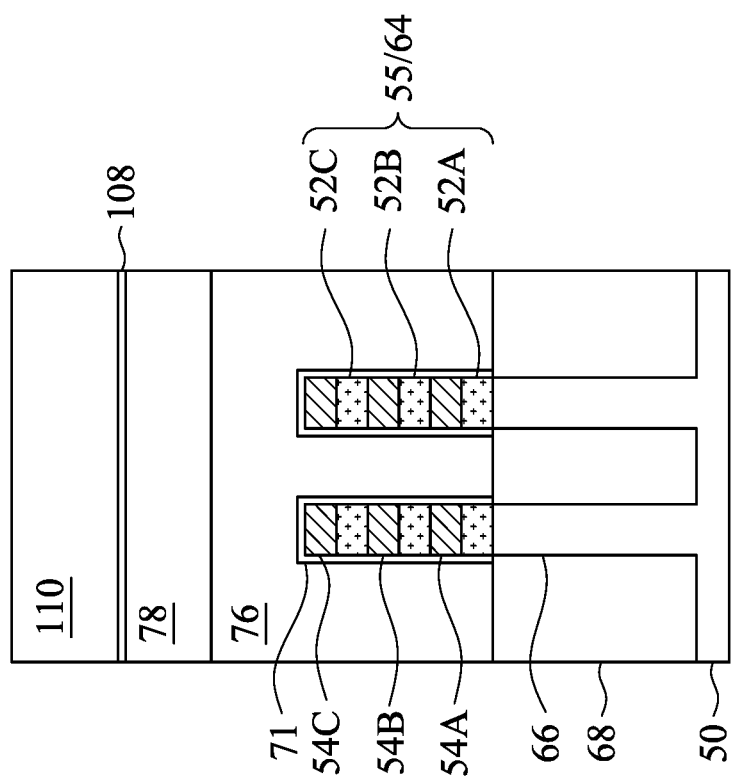
Figure 16B:
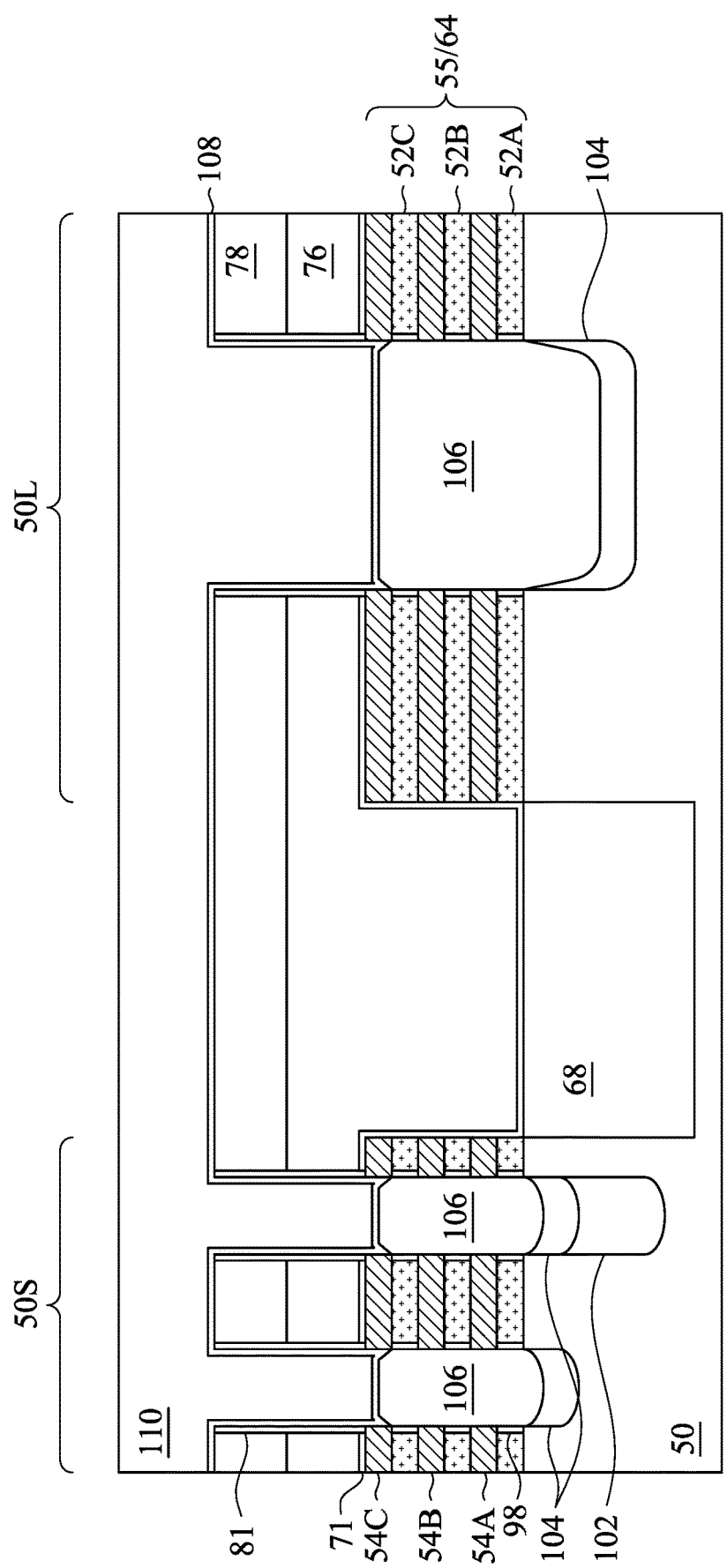
Figure 16C:
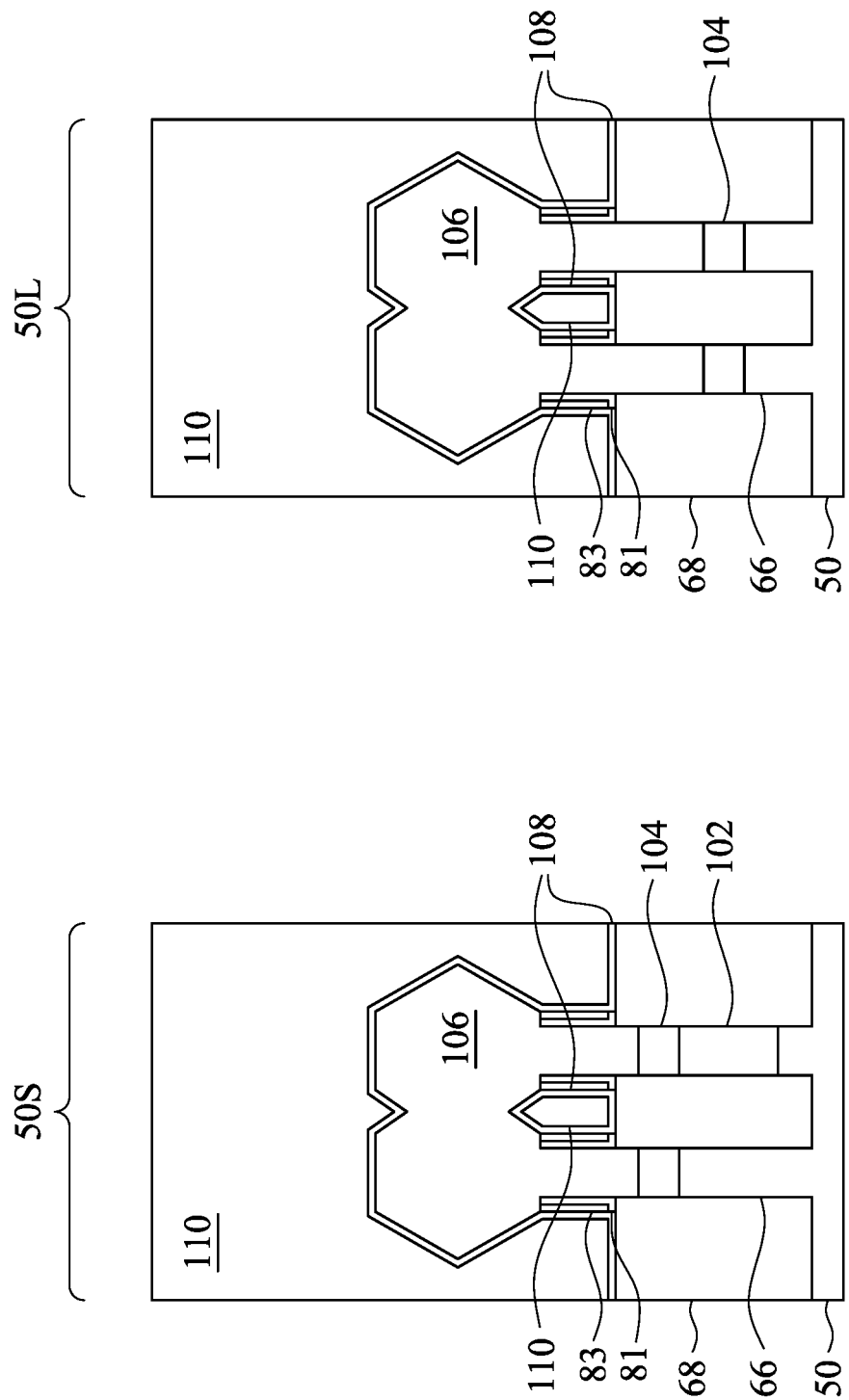

In FIGS. 16A through 16C, a first interlayer dielectric (ILD) 110 is deposited over the structures illustrated in FIGS. 15A through 15C. The first ILD 110 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. In some embodiments, the first ILD 110 may comprise silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), silicon (Si), zirconium nitride (ZrN), silicon carbonitride (SiCN), combinations or multiple layers thereof, or the like. Other insulation materials formed by any acceptable process may be used. In some embodiments, a contact etch stop layer (CESL) 108 is disposed between the first ILD 110 and the epitaxial source/drain regions 106, the masks 78, the first spacers 81, the second spacers 83, and the STI regions 68. The CESL 108 may include a dielectric material, such as, silicon nitride, silicon oxide, silicon oxynitride, or the like. In some embodiments, the CESL 108 may include a material having a different etch rate than the material of the overlying first ILD 110.

Figure 17A:
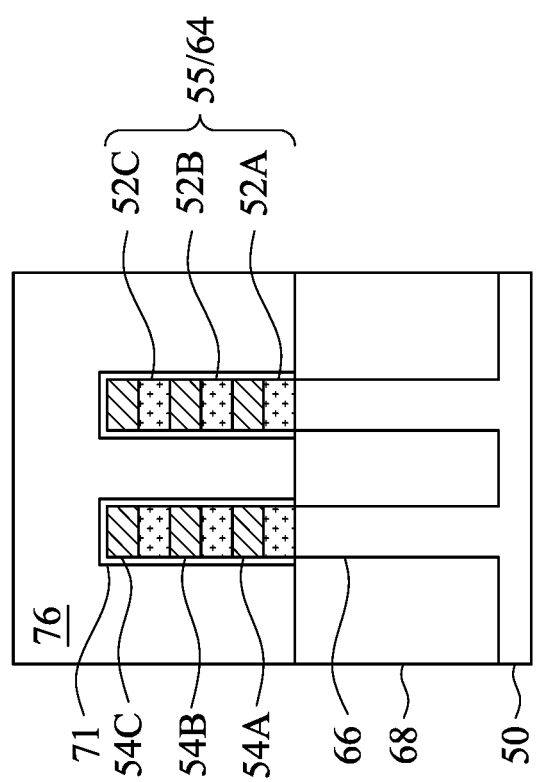
Figure 17B:
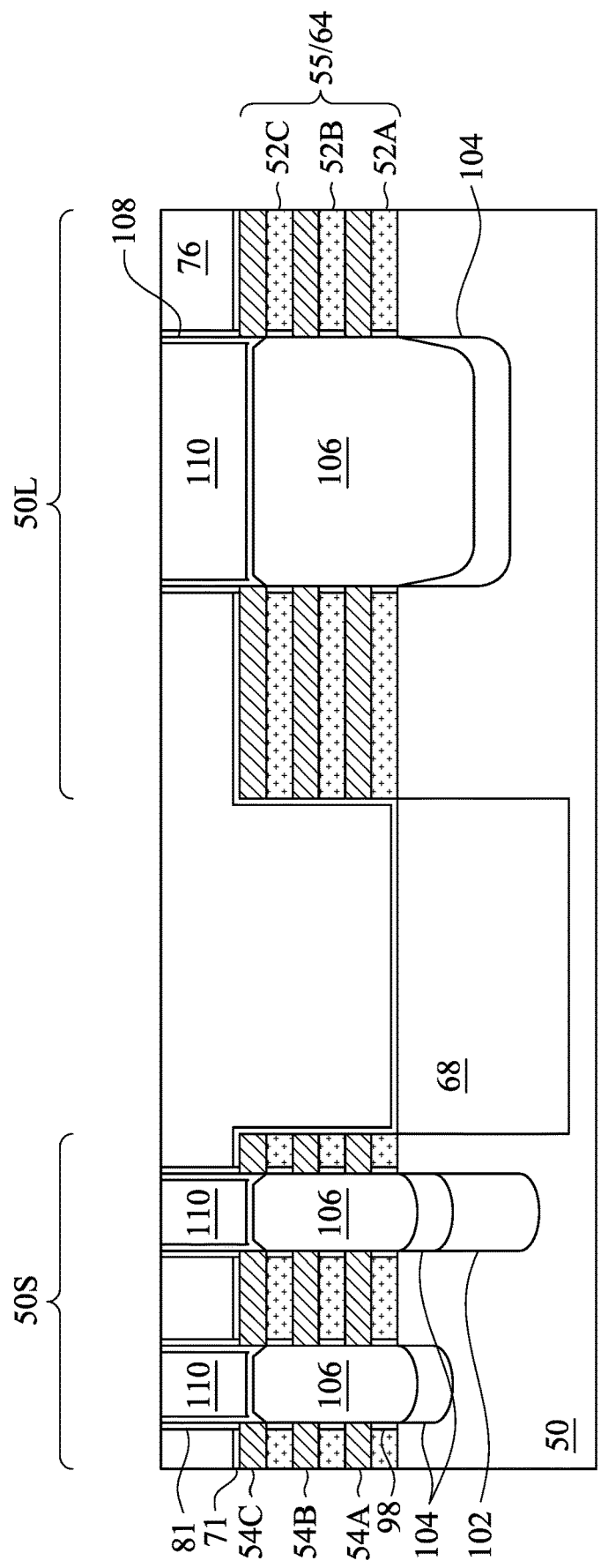
Figure 17C:
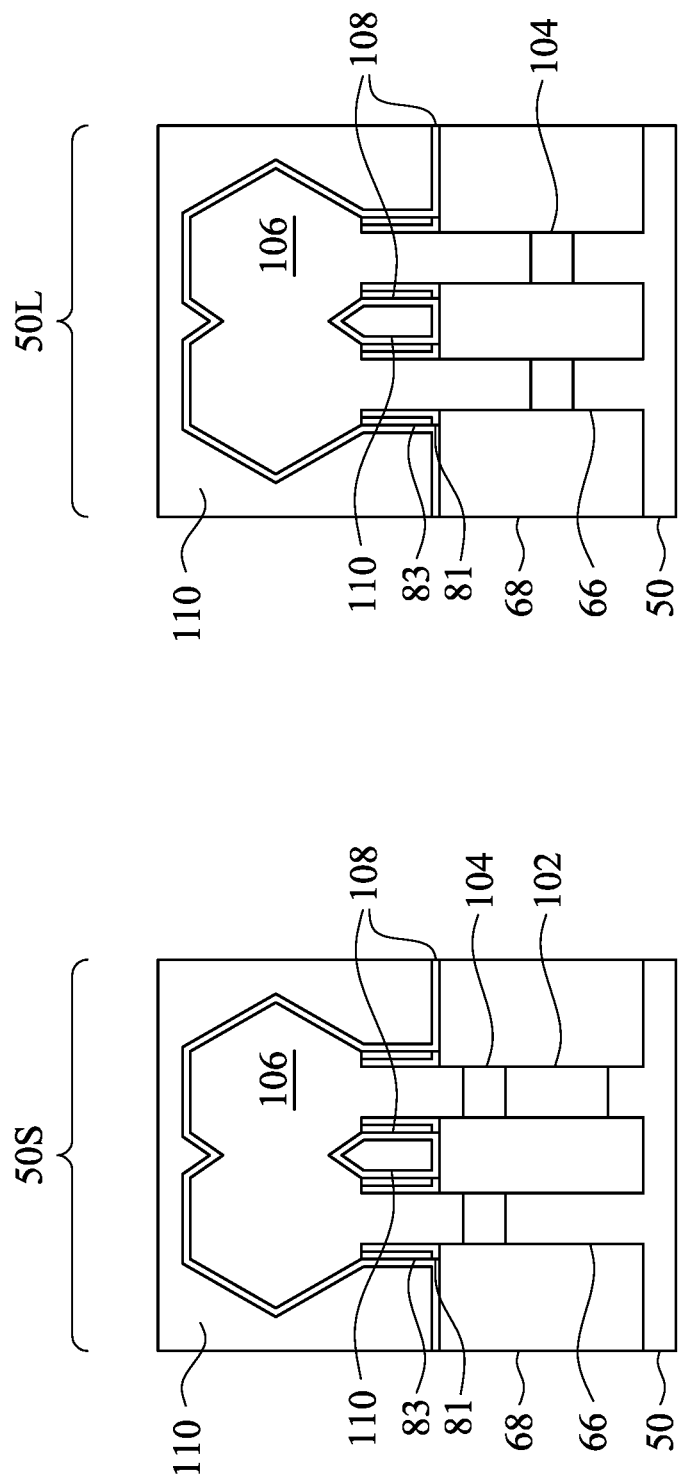

In FIGS. 17A through 17C, a planarization process, such as a CMP, may be performed to level the top surface of the first ILD 110 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 110 may be level, within process variations. Accordingly, the top surfaces of the dummy gates 76 are exposed through the first ILD 110. In some embodiments, the masks 78 may remain, in which case the planarization process levels the top surface of the first ILD 110 with top surfaces of the masks 78 and the first spacers 81.

Figure 18A:
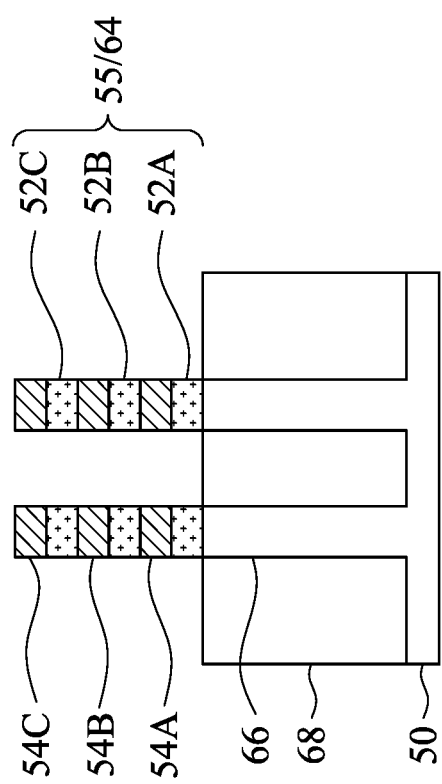
Figure 18B:
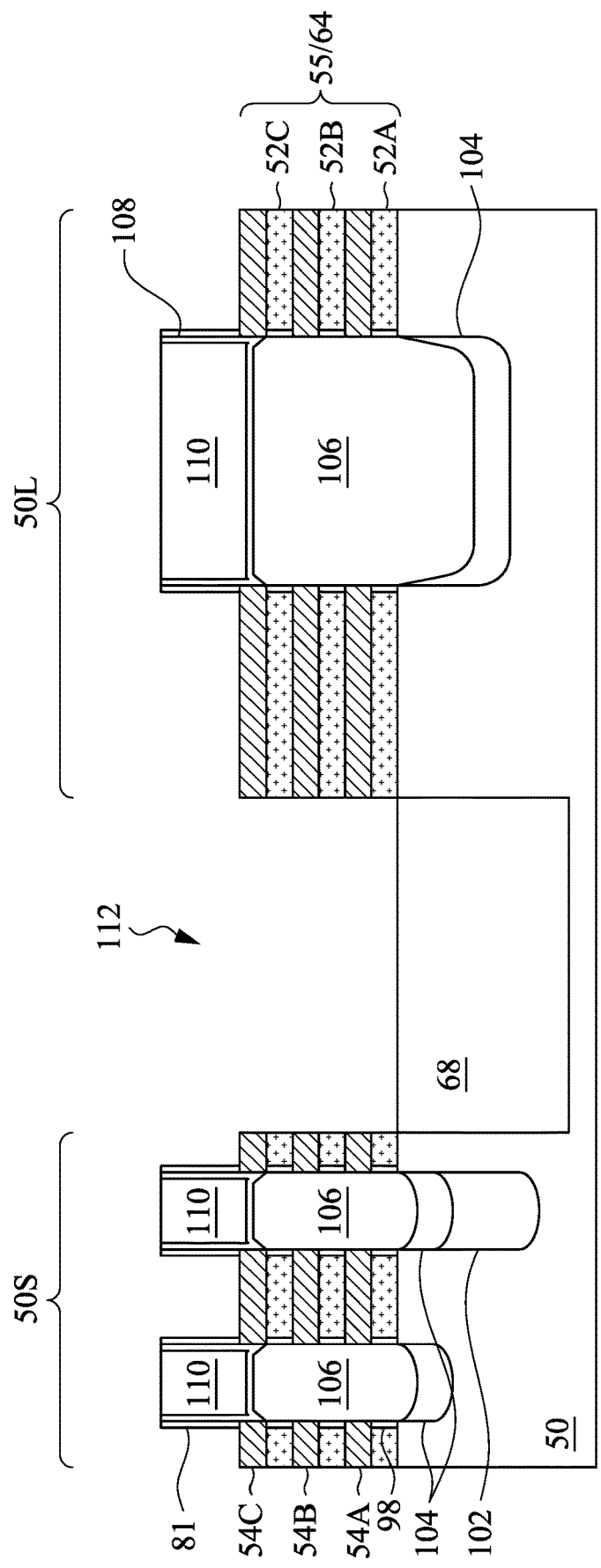
Figure 18C:
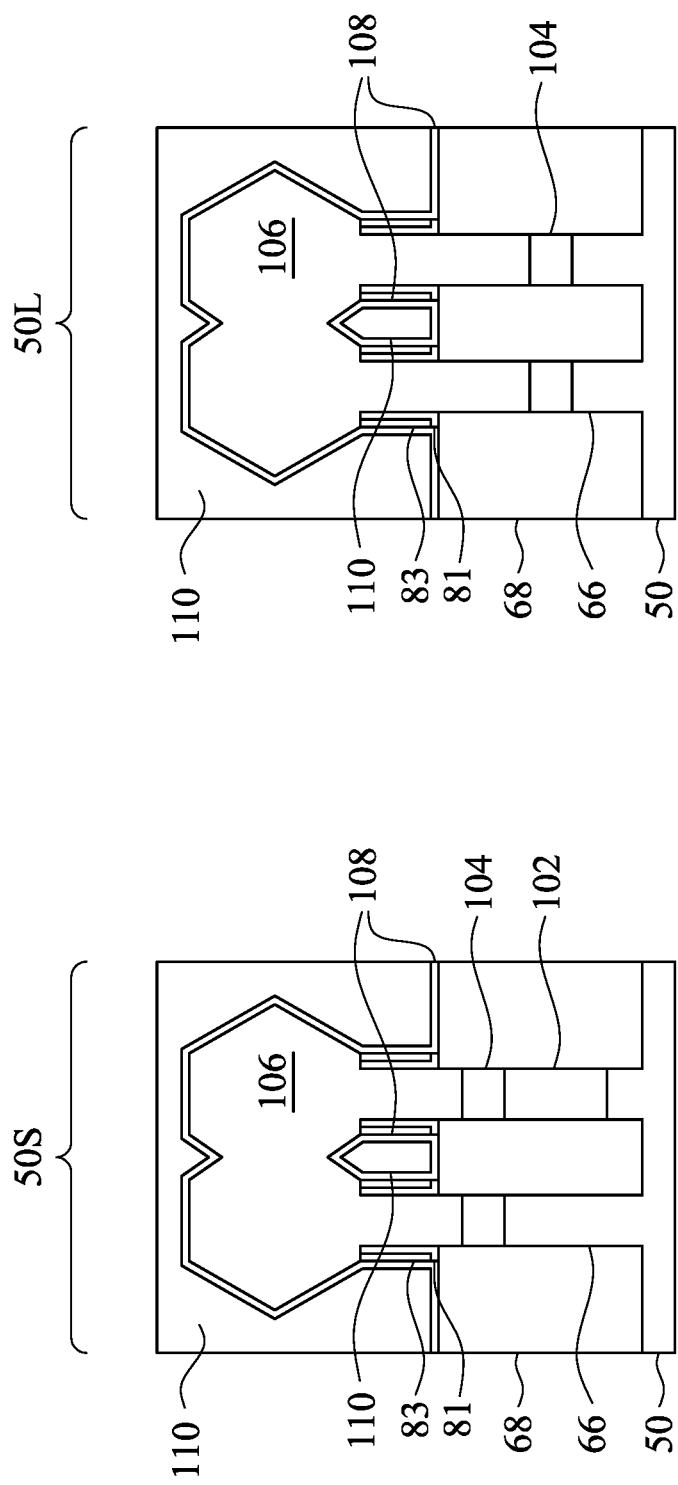

In FIGS. 18A through 18C, the dummy gates 76, and masks 78 if present, are removed in one or more etching steps, so that fourth recesses 112 are formed. Portions of the dummy gate dielectrics 71 in the fourth recesses 112 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 110 or the first spacers 81. Each of the fourth recesses 112 exposes and/or overlies portions of nanostructures 55, which act as channel regions in subsequently completed nano-FETs. Portions of the nanostructures 55 which act as the channel regions are disposed between neighboring pairs of the epitaxial source/drain regions 106. During the removal, the dummy gate dielectrics 71 may be used as etch stop layers when the dummy gates 76 are etched. The dummy gate dielectrics 71 may then be removed after the removal of the dummy gates 76.

Figure 19B:
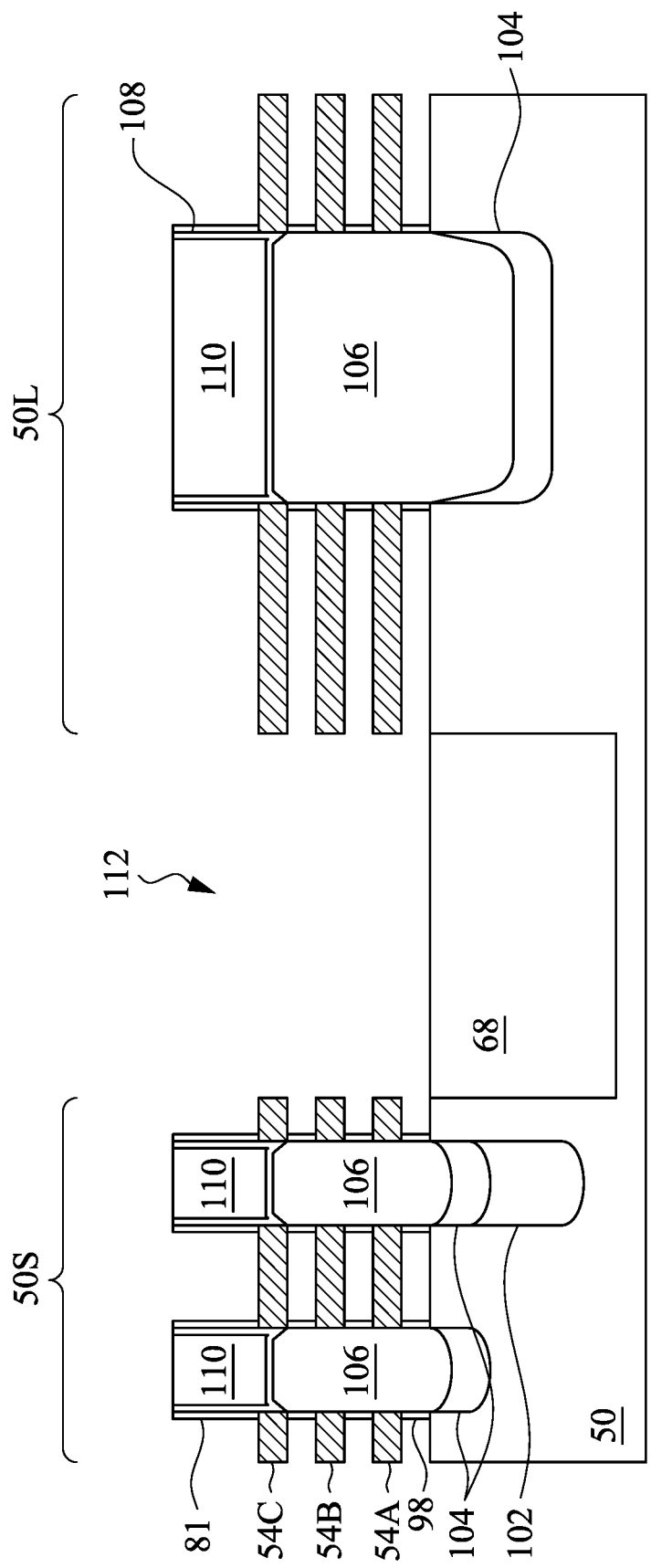
Figure 19C:
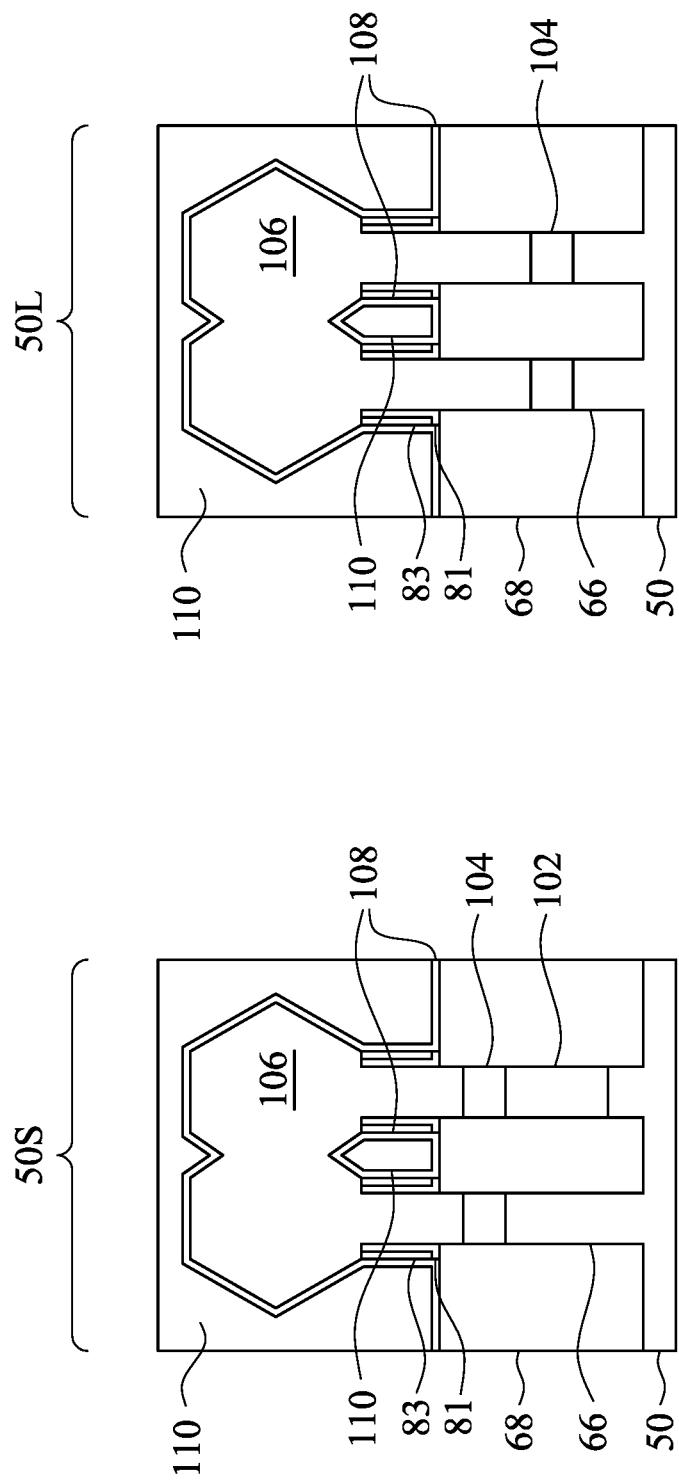

In FIGS. 19A through 19C, the first nanostructures 52 are removed extending the fourth recesses 112. The first nanostructures 52 may be removed by performing an isotropic etching process, such as wet etching or the like using etchants which are selective to the materials of the first nanostructures 52, while the second nanostructures 54, the substrate 50, the STI regions 58 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH₄OH), or the like may be used to remove the first nanostructures 52.

Figure 20A:
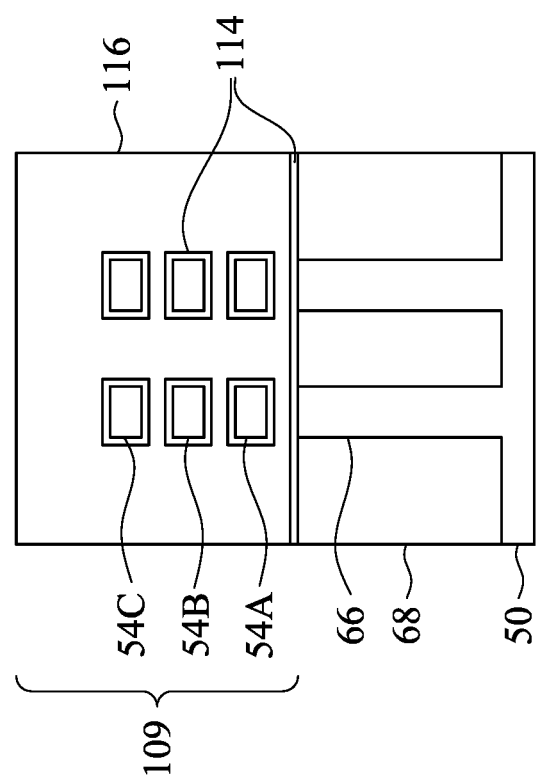
Figure 20B:
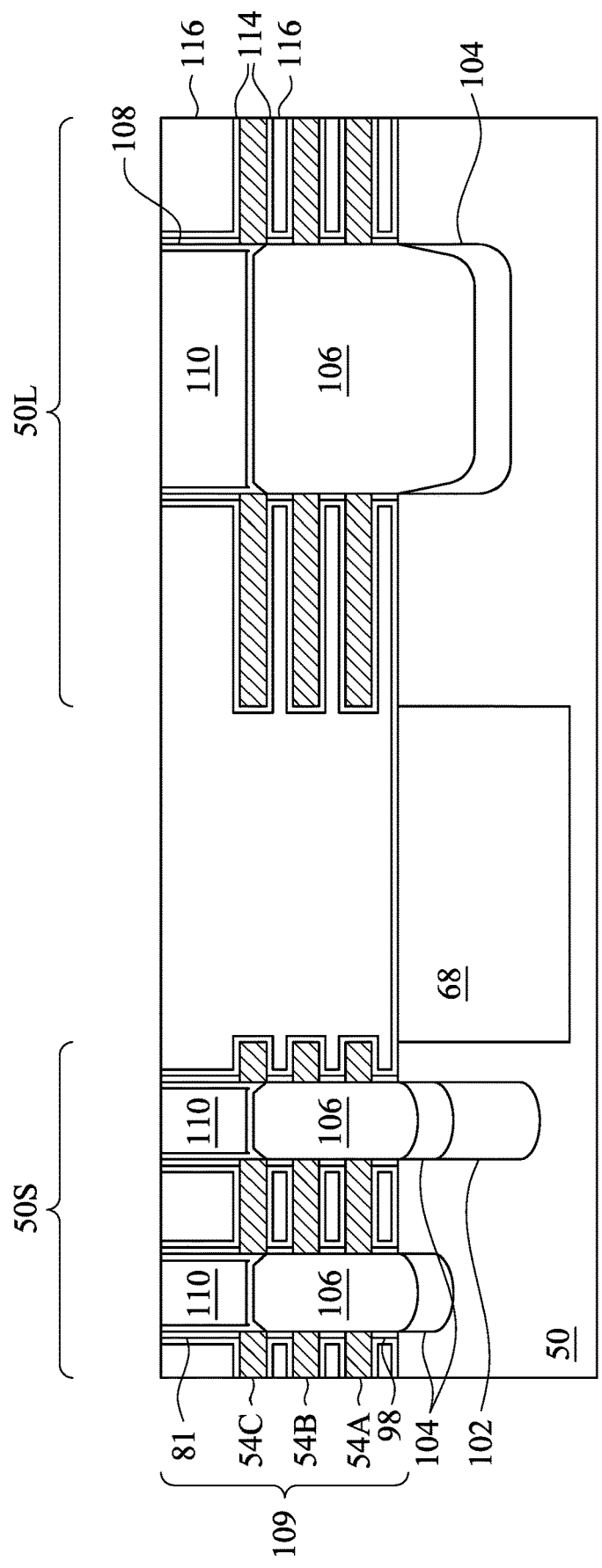
Figure 20C:
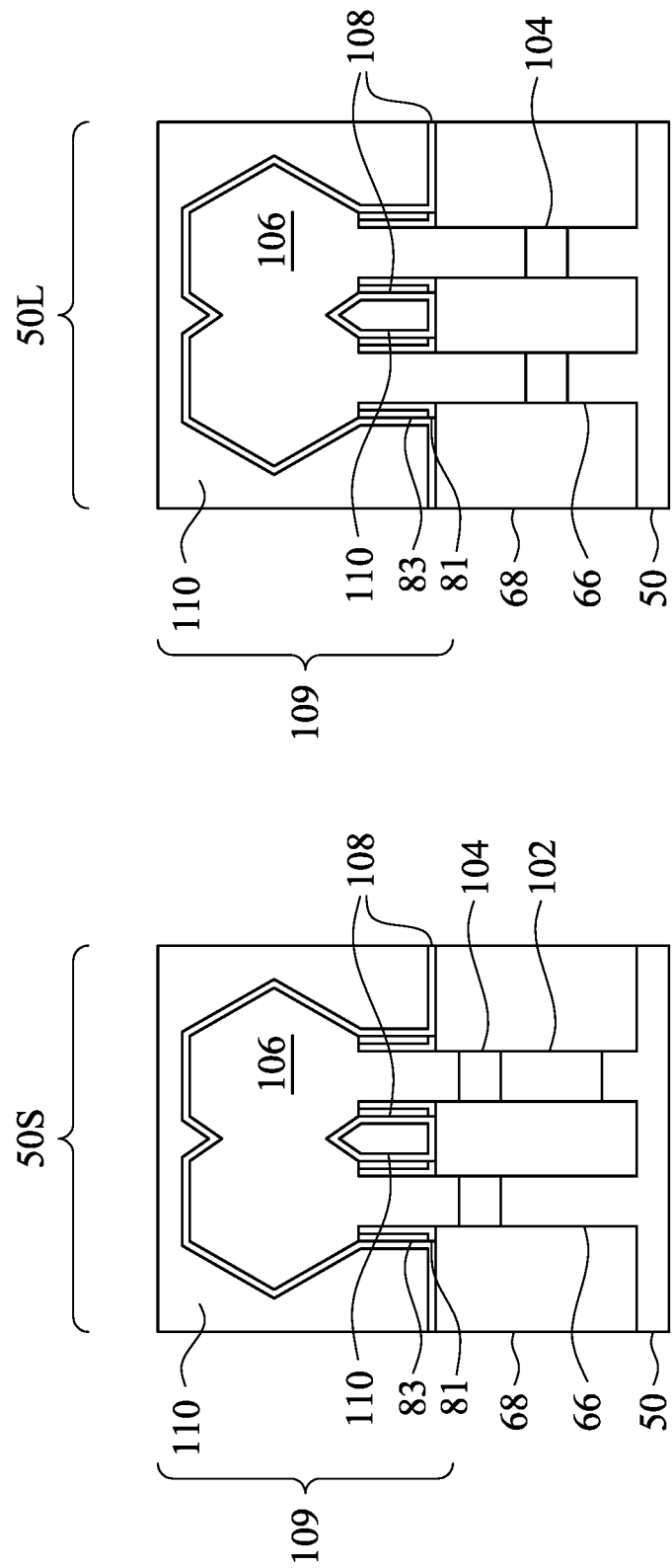

In FIGS. 20A through 20C, gate dielectric layers 114 and gate electrodes 116 are formed for replacement gates. The gate dielectric layers 114 are deposited conformally in the fourth recesses 112. The gate dielectric layers 114 may be formed on top surfaces and sidewalls of the fins 66 and on top surfaces, sidewalls, and bottom surfaces of the second nanostructures 54. The gate dielectric layers 114 may also be deposited on top surfaces of the first ILD 110, the CESL 108, the first spacers 81, and the STI regions 68 and on sidewalls of the first inner spacers 98.

In accordance with some embodiments, the gate dielectric layers 114 include one or more dielectric layers, such as an oxide, a metal oxide, the like, or combinations thereof. For example, in some embodiments, the gate dielectric layers 114 may include a silicon oxide layer and a metal oxide layer over the silicon oxide layer. In some embodiments, the gate dielectric layers 114 include a high-k dielectric material, and in these embodiments, the gate dielectric layers 114 may have a k-value greater than about 7.0. The gate dielectric layers 114 may include a metal oxide or a silicate of hafnium, aluminum, zirconium, lanthanum, manganese, barium, titanium, lead, and combinations thereof. The structure of the gate dielectric layers 114 may be the same or different in the n-type region 50N and the p-type region 50P. The formation methods of the gate dielectric layers 114 may include molecular-beam deposition (MBD), ALD, PECVD, and the like.

The gate electrodes 116 are deposited over the gate dielectric layers 114, respectively, and fill the remaining portions of the fourth recesses 112. The gate electrodes 116 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 116 are illustrated in FIGS. 20A and 20B, the gate electrodes 116 may comprise any number of liner layers, any number of work function tuning layers, and a fill material. Any combination of the layers which make up the gate electrodes 116 may be deposited in the n-type region 50N and the p-type region 50P between adjacent ones of the second nanostructures 54 and between the second nanostructure 54A and the substrate 50.

The formation of the gate dielectric layers 114 in the n-type region 50N and the p-type region 50P may occur simultaneously such that the gate dielectric layers 114 in each region are formed from the same materials, and the formation of the gate electrodes 116 may occur simultaneously such that the gate electrodes 116 in each region are formed from the same materials. In some embodiments, the gate dielectric layers 114 in each region may be formed by distinct processes, such that the gate dielectric layers 114 may be different materials and/or have a different number of layers, and/or the gate electrodes 116 in each region may be formed by distinct processes, such that the gate electrodes 116 may be different materials and/or have a different number of layers. Various masking steps may be used to mask and expose appropriate regions when using distinct processes.

After the filling of the fourth recesses 112, a planarization process, such as a CMP, may be performed to remove the excess portions of the gate dielectric layers 114 and the material of the gate electrodes 116, which excess portions are over the top surface of the first ILD 110. The remaining portions of material of the gate electrodes 116 and the gate dielectric layers 114 thus form replacement gate structures of the resulting nano-FETs. The gate electrodes 116 and the gate dielectric layers 114 may be collectively referred to as "gate structures." The epitaxial source/drain regions 106, the second nanostructures 54, and the gate structures (including the gate dielectric layers 114 and the gate electrodes 116) may collectively be referred to as transistor structures 109.

Figure 21A:
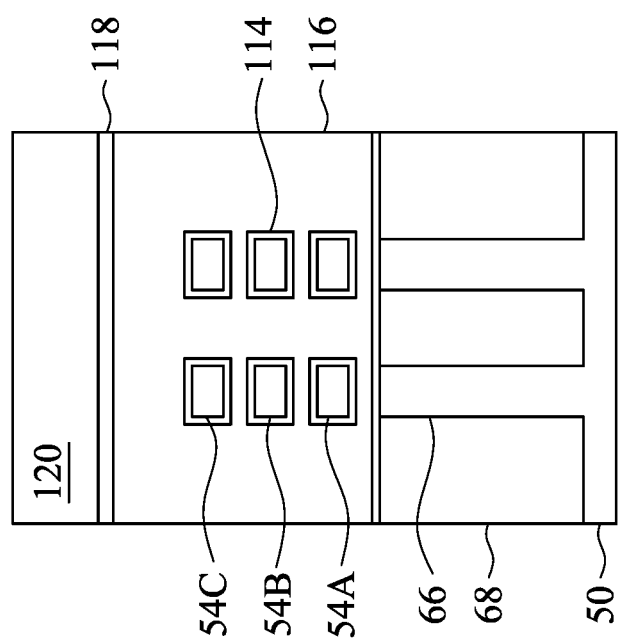
Figure 21B:
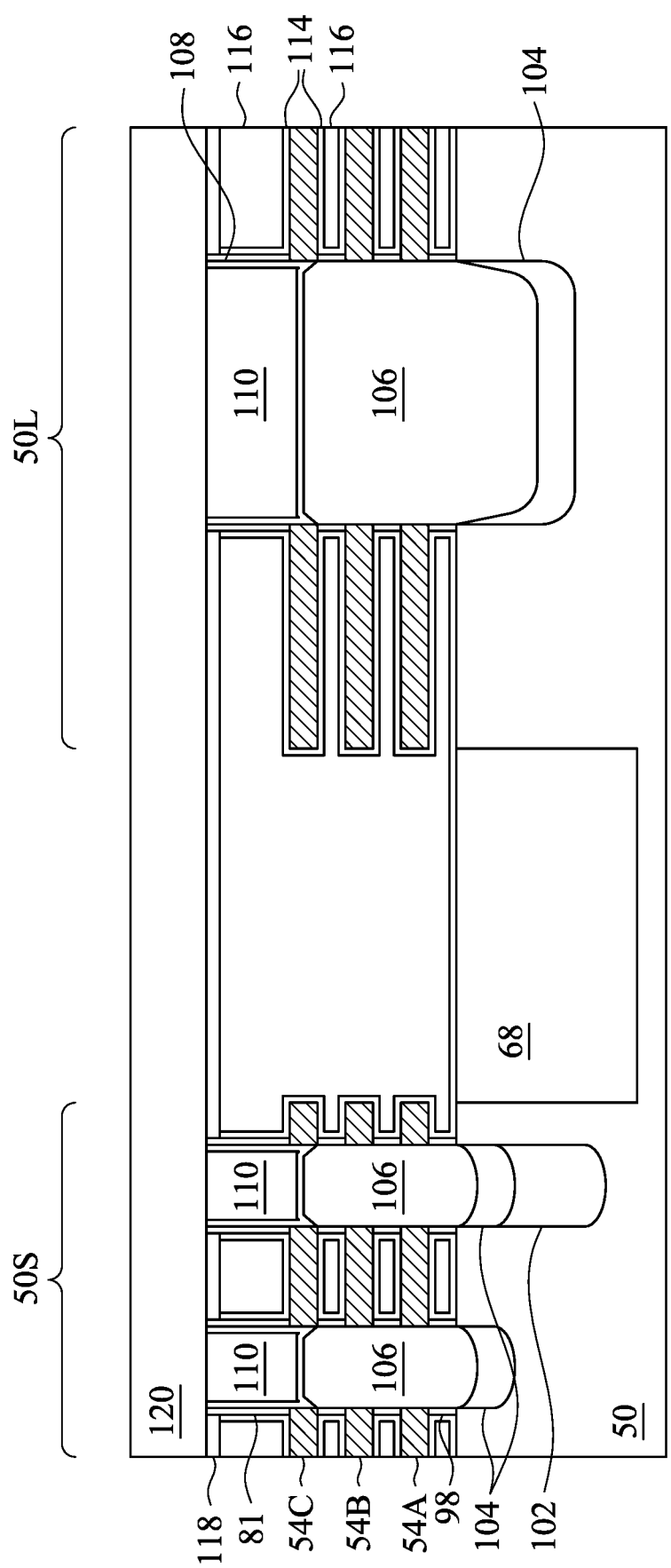
Figure 21C:
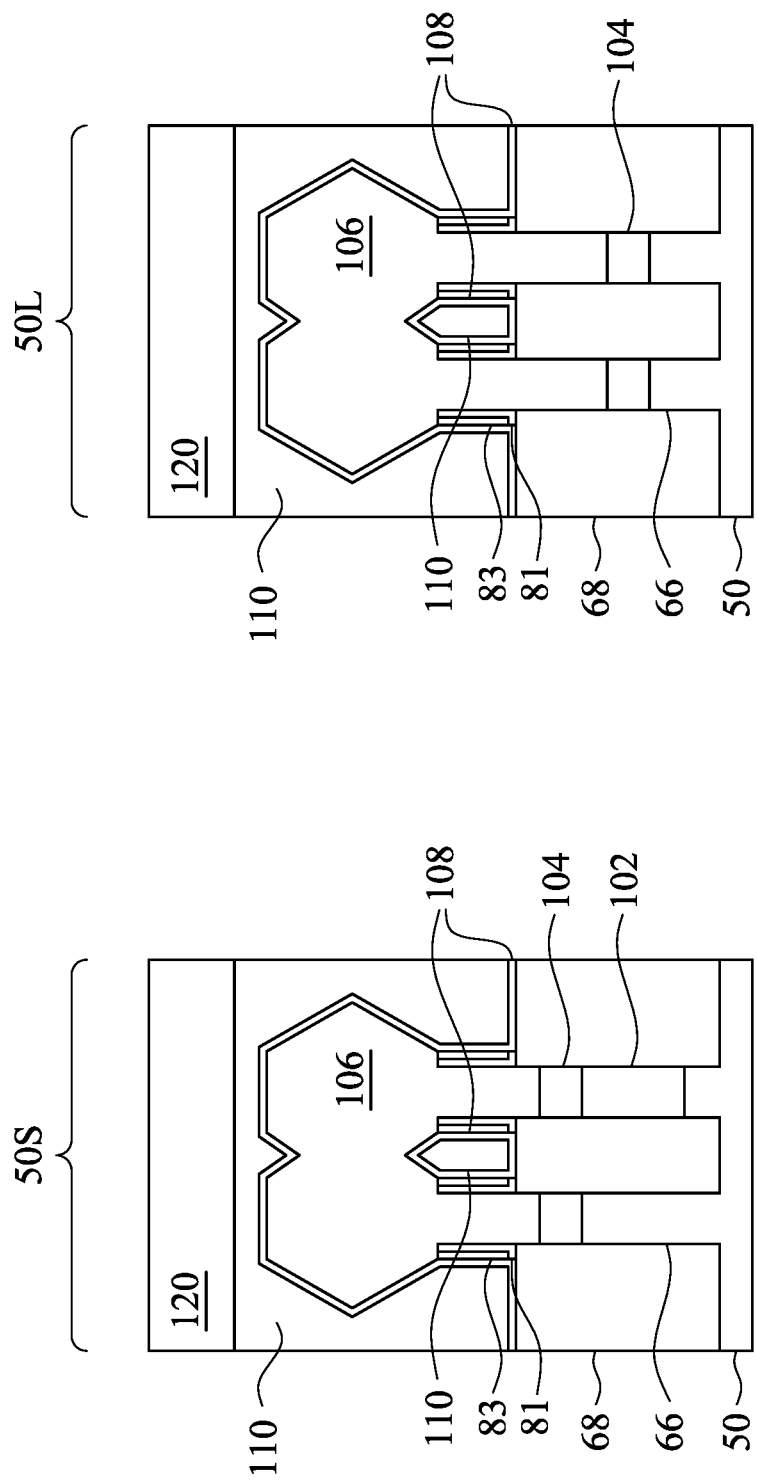

In FIGS. 21A through 21C, the gate structures (including the gate dielectric layers 114 and the corresponding overlying gate electrodes 116) are recessed, so that recesses are formed directly over the gate structures and between opposing portions of first spacers 81. Gate masks 118 including one or more layers of dielectric material, such as silicon nitride, silicon oxynitride, or the like, are filled in the recesses, followed by a planarization process to remove excess portions of the dielectric material extending over the first ILD 110. Subsequently formed gate contacts (such as the gate contacts 126, discussed below with respect to FIGS. 23A through 23C) penetrate through the gate masks 118 to contact top surfaces of the recessed gate electrodes 116.

As further illustrated by FIGS. 21A through 21C, a second ILD 120 is deposited over the first ILD 110, the gate masks 118, the first spacers 81, and the CESL 108. In some embodiments, the second ILD 120 is a flowable film formed by FCVD. In some embodiments, the second ILD 120 is formed of a dielectric material such as PSG, BSG, BPSG, USG, or the like, and may be deposited by any suitable method, such as CVD, PECVD, or the like. In some embodiments, the second ILD 120 may comprise silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), silicon (Si), zirconium nitride (ZrN), silicon carbonitride (SiCN), combinations or multiple layers thereof, or the like.

Figure 22A:
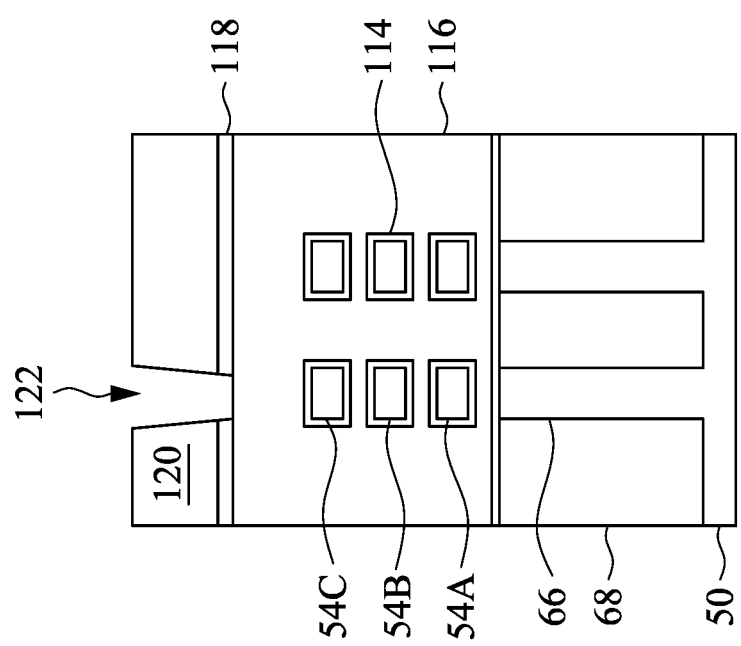
Figure 22B:
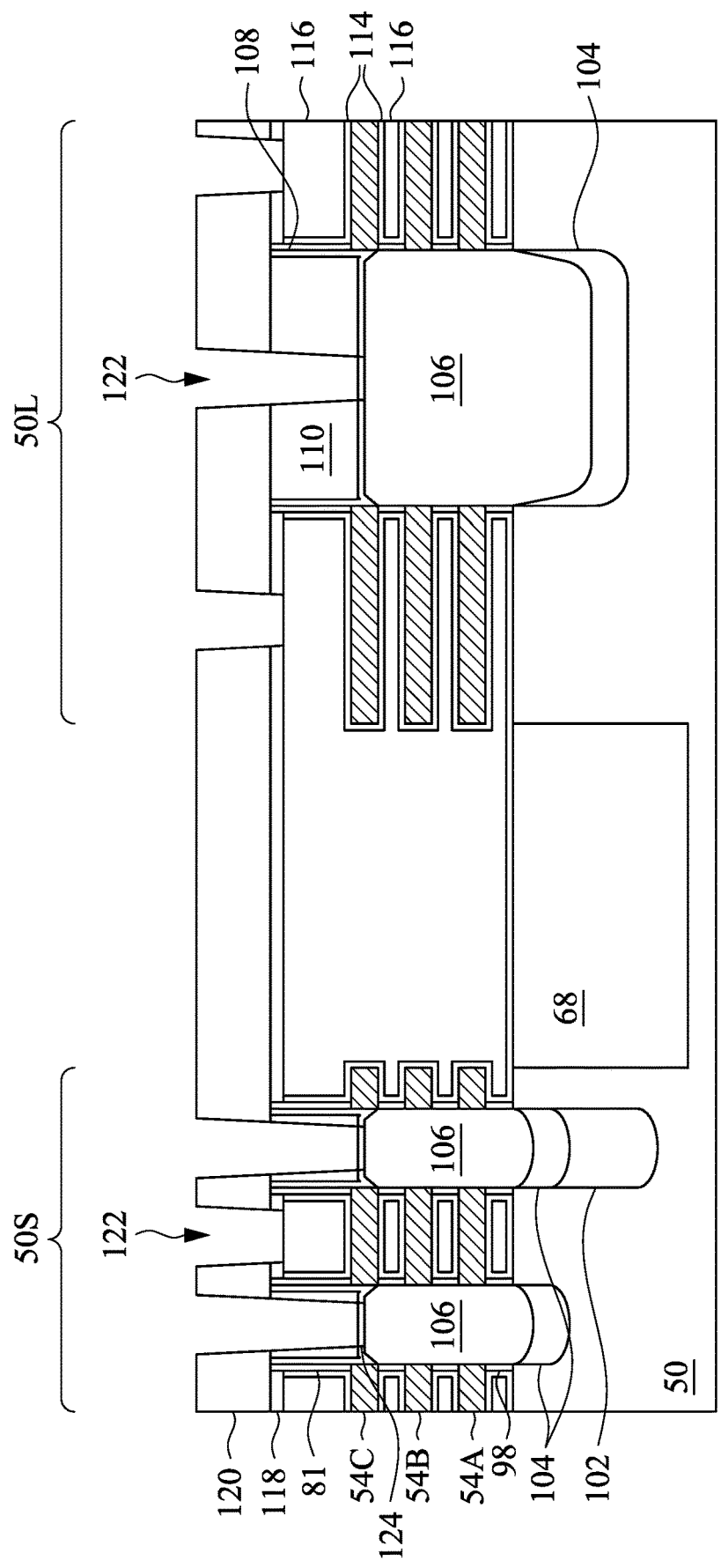
Figure 22C:
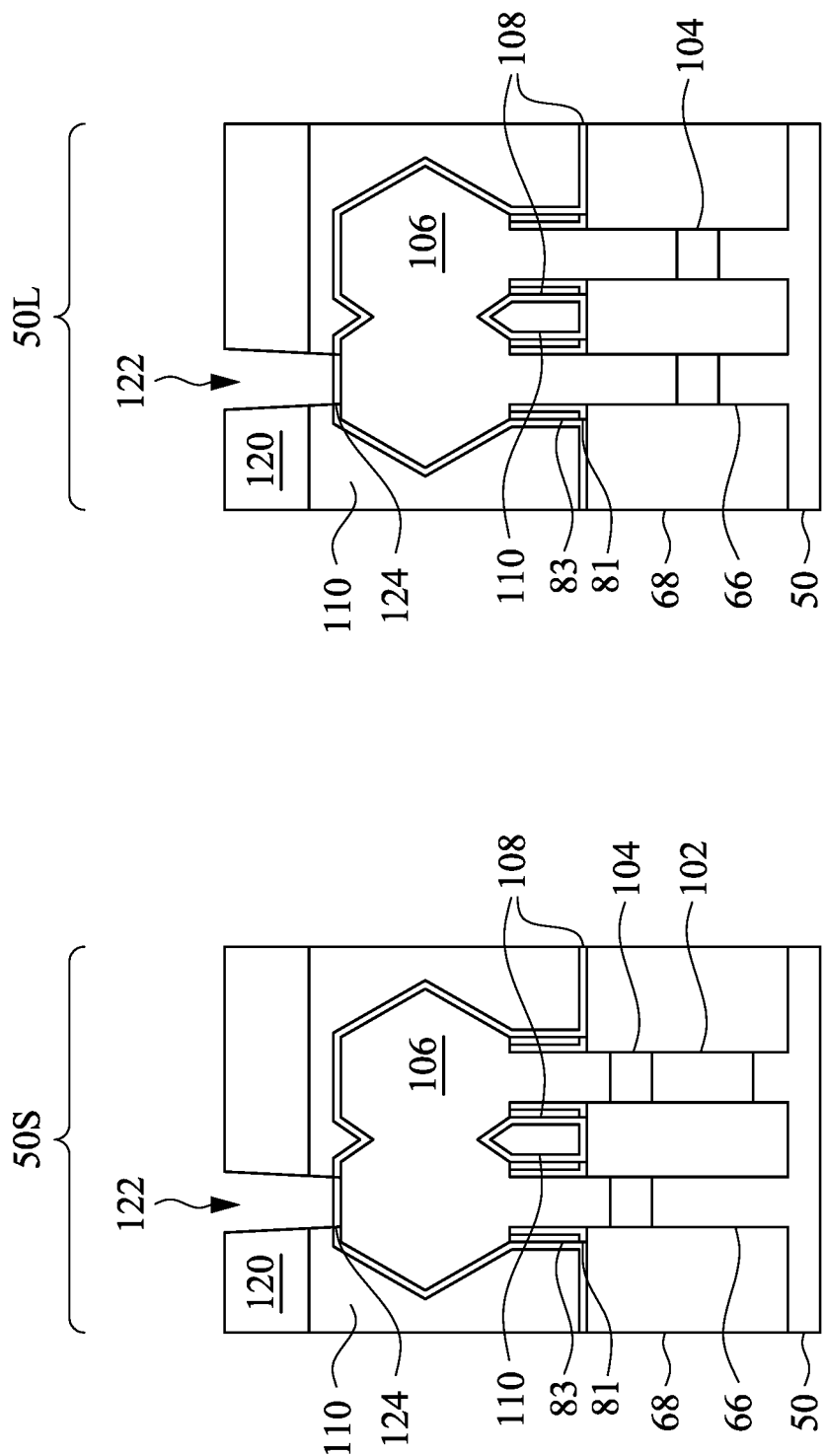

In FIGS. 22A through 22C, the second ILD 120, the first ILD 110, the CESL 108, and the gate masks 118 are etched to form fifth recesses 122 exposing surfaces of the epitaxial source/drain regions 106 and/or the gate structures. The fifth recesses 122 may be formed by etching using an anisotropic etching process, such as RIE, NBE, or the like. In some embodiments, the fifth recesses 122 may be etched through the second ILD 120 and the first ILD 110 using a first etching process; may be etched through the gate masks 118 using a second etching process; and may then be etched through the CESL 108 using a third etching process. A mask, such as a photoresist, may be formed and patterned over the second ILD 120 to mask portions of the second ILD 120 from the first etching process and the second etching process. In some embodiments, the etching process may over-etch, and therefore, the fifth recesses 122 extend into the epitaxial source/drain regions 106 and/or the gate structures, and a bottom of the fifth recesses 122 may be level with (e.g., at a same level, or having a same distance from the substrate), or lower than (e.g., closer to the substrate) top surfaces of the epitaxial source/drain regions 106 and/or the gate structures. Although FIG. 22B illustrates the fifth recesses 122 as exposing the epitaxial source/drain regions 106 and the gate structures in a same cross-section, in various embodiments, the epitaxial source/drain regions 106 and the gate structures may be exposed in different cross-sections, thereby reducing the risk of shorting subsequently formed contacts.

After the fifth recesses 122 are formed, first silicide regions 124 are formed over the epitaxial source/drain regions 106. In some embodiments, the first silicide regions 124 are formed by first depositing a metal (not separately illustrated) capable of reacting with the semiconductor materials of the underlying epitaxial source/drain regions 106 (e.g., silicon, silicon germanium, germanium, or the like) to form silicide or germanide regions. The metal may include nickel, cobalt, titanium, tantalum, platinum, tungsten, other noble metals, other refractory metals, rare earth metals or their alloys. The metal may be deposited over the exposed portions of the epitaxial source/drain regions 106. A thermal anneal process may then be performed to form the first silicide regions 124. The un-reacted portions of the deposited metal are then removed, e.g., by an etching process. Although the first silicide regions 124 are referred to as silicide regions, the first silicide regions 124 may be germanide regions or silicon germanide regions (e.g., regions including silicide, germanide, or combinations thereof). The first silicide regions 124 may have a thickness from about 1 nm to about 10 nm. In some embodiments, the first silicide regions 124 in the n-type regions 50N may include titanium silicide (TiSi), chromium silicide (CrSi), tantalum silicide (TaSi), molybdenum silicide (MoSi), zirconium silicide (ZrSi), hafnium silicide (HfSi), scandium silicide (ScSi), yttrium silicide (YSi), holmium silicide (HoSi), terbium silicide (TbSi), silicide gadolinium (GdSi), lutetium silicide (LuSi), dysprosium silicide (DySi), erbium silicide (ErSi), ytterbium silicide (YbSi), combinations thereof, or the like. In some embodiments, the first silicide regions 124 in the p-type regions 50P may include nickel silicide (NiSi), cobalt silicide (CoSi), manganese silicide (MnSi), tungsten silicide (WSi), iron silicide (FeSi), rhodium silicide (RhSi), palladium silicide (PdSi), ruthenium silicide (RuSi), platinum silicide (PtSi), iridium silicide (IrSi), osmium silicide (OsSi), combinations thereof, or the like.

Figure 23A:
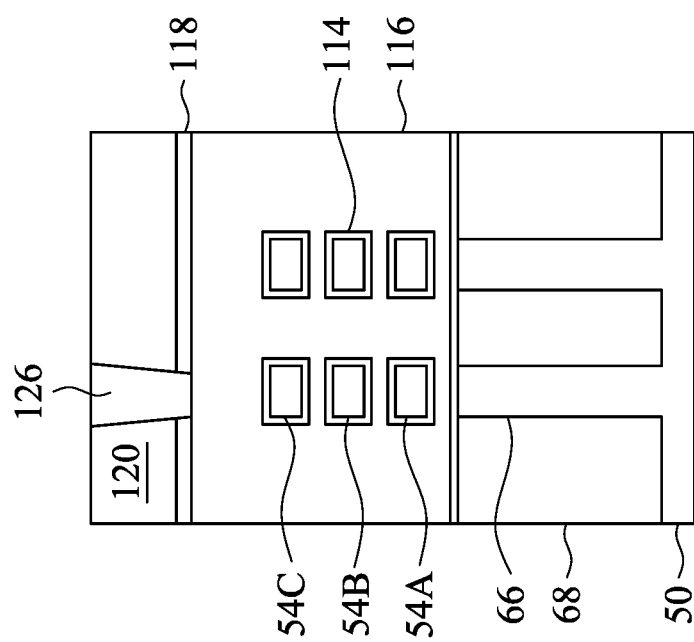
Figure 23B:
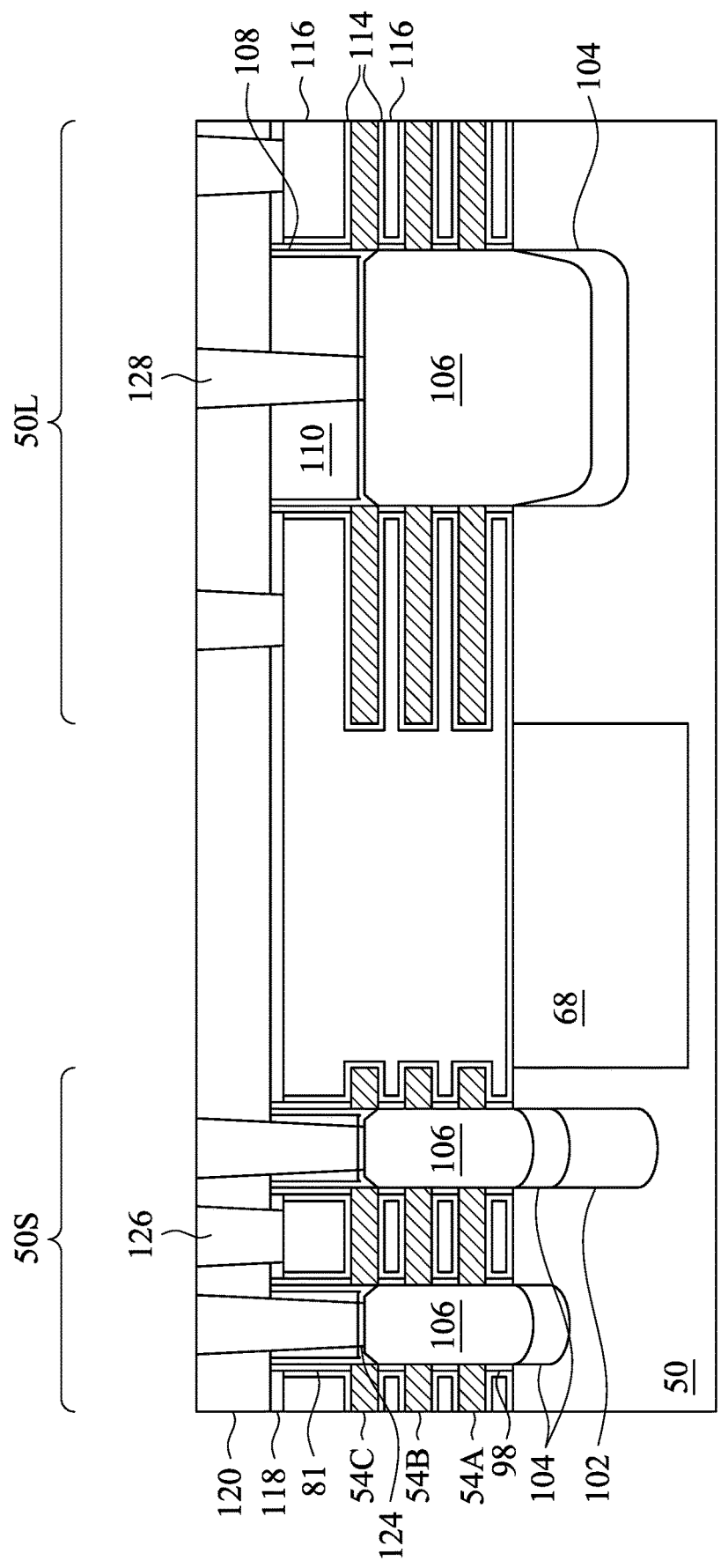
Figure 23C:
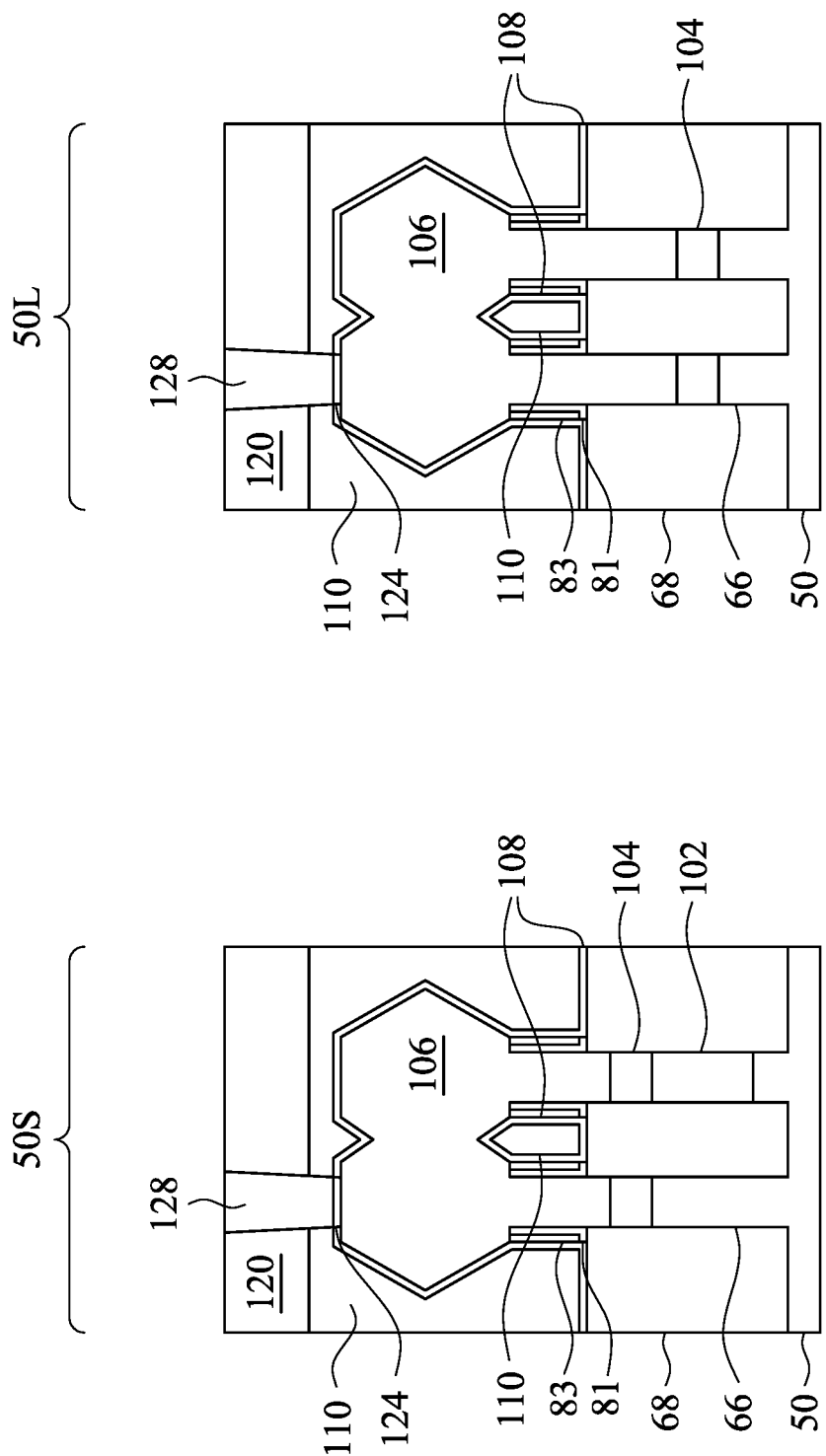

In FIGS. 23A through 23C, source/drain contacts 128 and gate contacts 126 (each of which may alternatively be referred to as contact plugs) are formed in the fifth recesses 122. The source/drain contacts 128 and the gate contacts 126 may each comprise one or more layers, such as barrier layers, diffusion layers, and fill materials. For example, in some embodiments, the source/drain contacts 128 and the gate contacts 126 may each include a barrier layer and a conductive material, and may be electrically coupled to an underlying conductive feature (e.g., the gate structures and/or the first silicide regions 124). The gate contacts 126 are electrically coupled to the gate electrodes 116 and the source/drain contacts 128 are electrically coupled to the first silicide regions 124. The barrier layer may include titanium, titanium nitride, tantalum, tantalum nitride, or the like. The conductive material may be copper (Cu), a copper alloy, silver (Ag), gold (Au), tungsten (W), cobalt (Co), aluminum (Al), nickel (Ni), ruthenium (Ru), titanium (Ti), titanium nitride (TiN), tantalum (Ta), tantalum nitride (TaN), molybdenum (Mo) or the like. In some embodiments, a planarization process, such as a CMP, may be performed to remove excess material from surfaces of the second ILD 120.

Although FIGS. 23A through 23C illustrate a source/drain contact 128 extending to each of the epitaxial source/drain regions 106, the source/drain contacts 128 may be omitted from certain ones of the epitaxial source/drain regions 106. For example, as explained in greater detail below, backside vias (e.g., power rails) may be subsequently attached through a backside of one or more of the epitaxial source/drain regions 106. For these particular epitaxial source/drain regions 106, the source/drain contacts 128 may be omitted or may be dummy contacts that are not electrically connected to any overlying conductive lines.

Figure 24A:
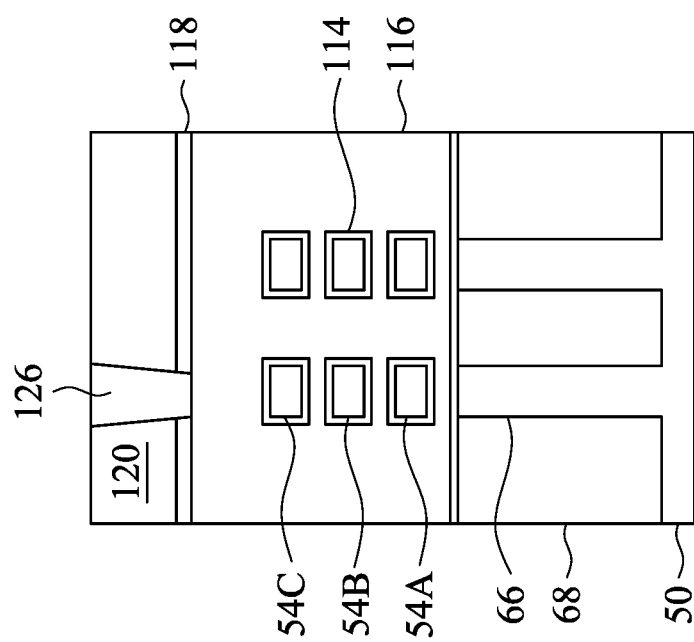
Figure 24B:
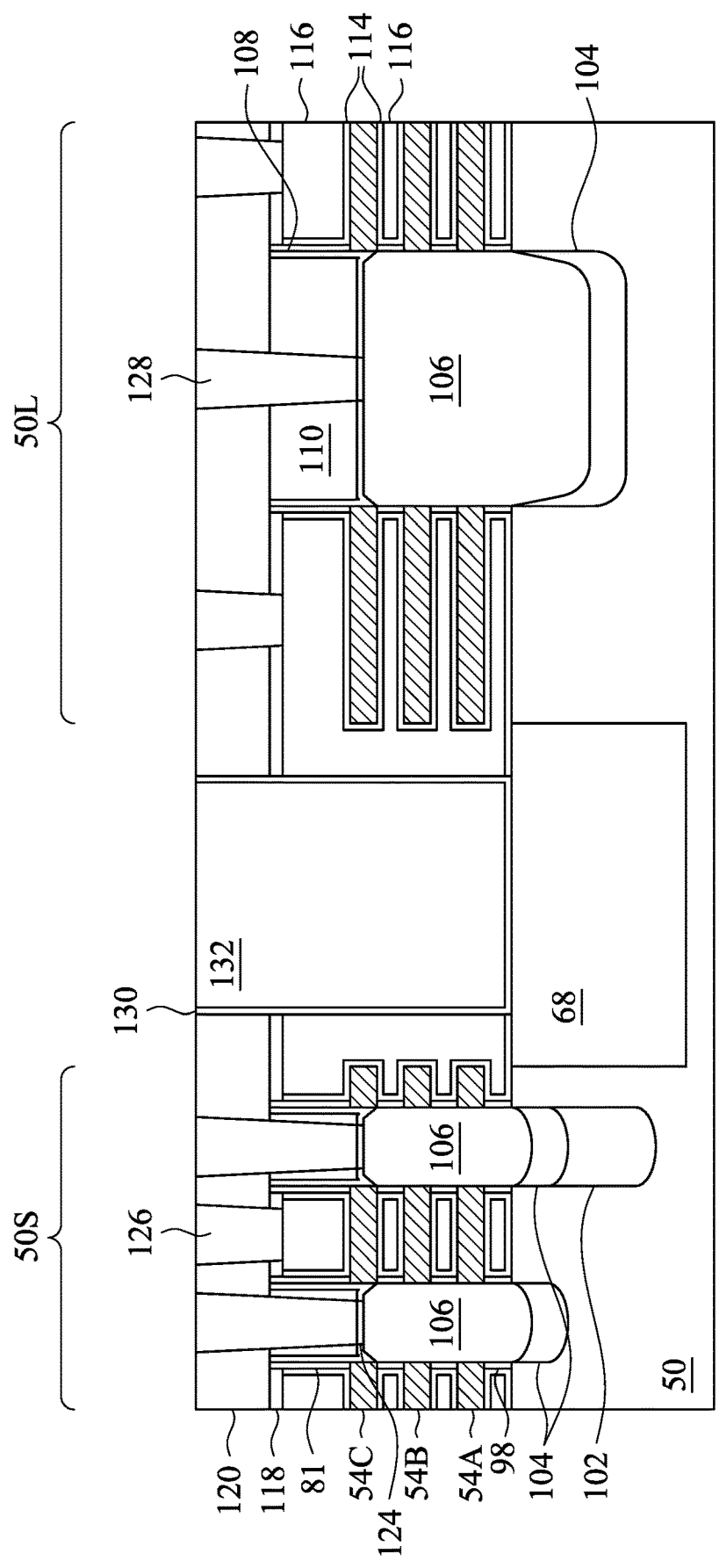
Figure 24C:
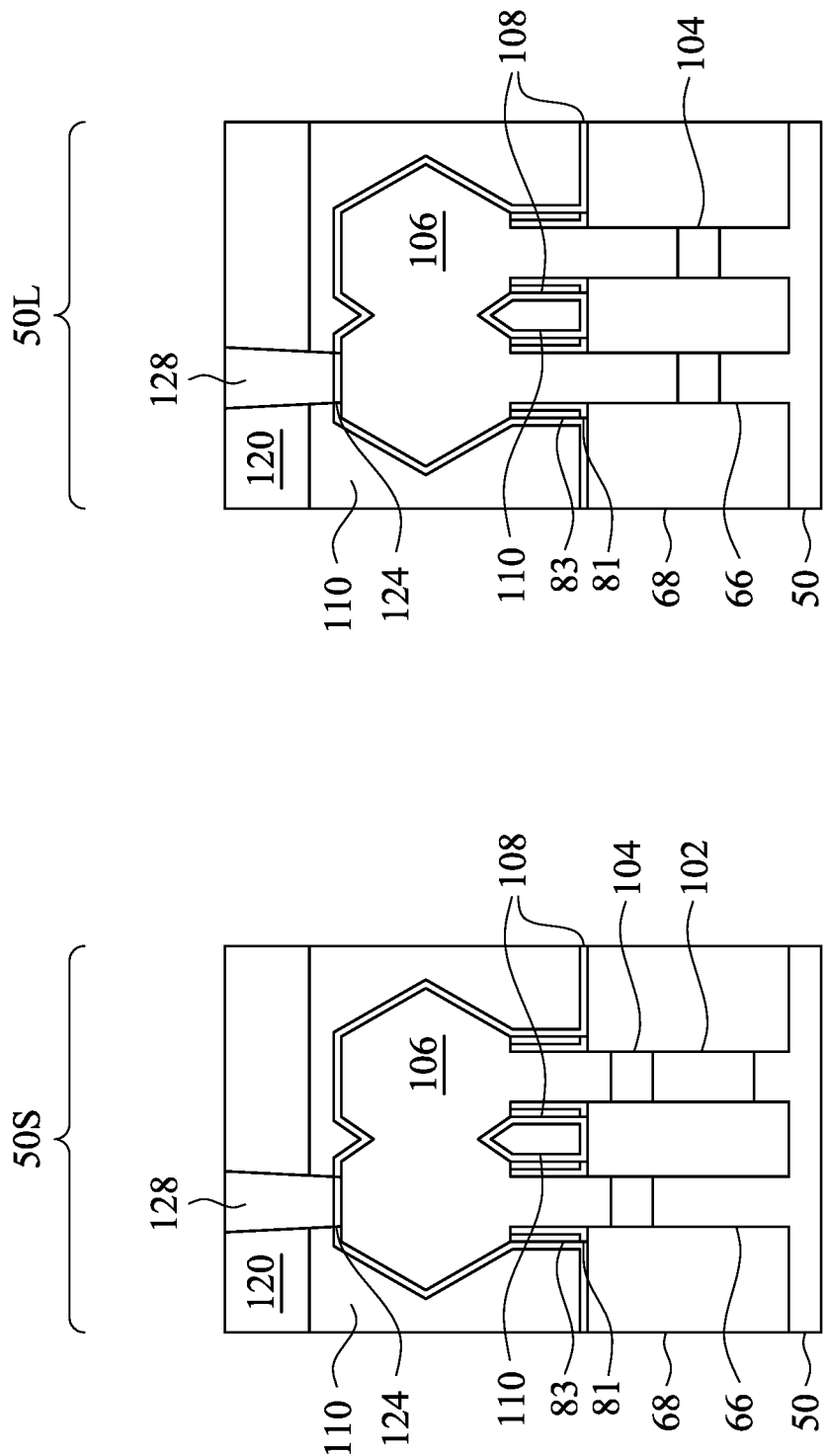

In FIGS. 24A through 24C, the second ILD 120, the gate masks 118, and the gate structures are etched so that recesses are formed between gate structures in the short-channel region 50S and gate structures in the long-channel region 50L and a third ILD 132 is filled in the recesses. The recesses may be formed through the second ILD 120, the gate masks 118, and the gate structures by etching using an anisotropic etching process, such as RIE, NBE, or the like. A mask, such as a photoresist, may be formed and patterned over the second ILD 120 to mask portions of the second ILD 120 from the etching process. The recesses may extend through the gate structures and may expose the STI regions 68. In some embodiments, the recesses may extend at least partially into the STI regions 68.

The third ILD 132 may then be filled in the recesses. In some embodiments, the third ILD 132 is a flowable film formed by FCVD. In some embodiments, the third ILD 132 is formed of a dielectric material such as PSG, BSG, BPSG, USG, or the like, and may be deposited by any suitable method, such as CVD, PECVD, or the like. In some embodiments, the third ILD 132 may comprise silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), silicon (Si), zirconium nitride (ZrN), silicon carbonitride (SiCN), combinations or multiple layers thereof, or the like. In some embodiments, a first liner layer 130 is disposed between the third ILD 132 and the second ILD 120, the gate masks 118, the gate structures, and the STI regions 68. The first liner layer 130 may include a dielectric material, such as, silicon nitride, silicon oxide, silicon oxynitride, or the like. In some embodiments, the first liner layer 130 may include a material having a different etch rate than the material of the overlying third ILD 132. A CMP process or the like may be used to remove material of the third ILD 132 and the first liner layer 130 such that top surfaces of the third ILD 132 and the first liner layer 130 are level with top surfaces of the second ILD 120, the source/drain contacts 128, and the gate contacts 126.

FIGS. 25A through 40C illustrate intermediate steps of forming front-side and back-side interconnect structures on the transistor structures 109. The front-side and back-side interconnect structures may each comprise conductive features that are electrically connected to the nano-FETs formed in the transistor structures 109. Further, as noted above, a backside via (e.g., a power rail) may be connected to one or more of the epitaxial source/drain regions 106 in the long-channel regions 50L and the short-channel regions 50S. As such, front-side source/drain contacts 128 may be optionally omitted from the epitaxial source/drain regions 106.

Figure 25A:
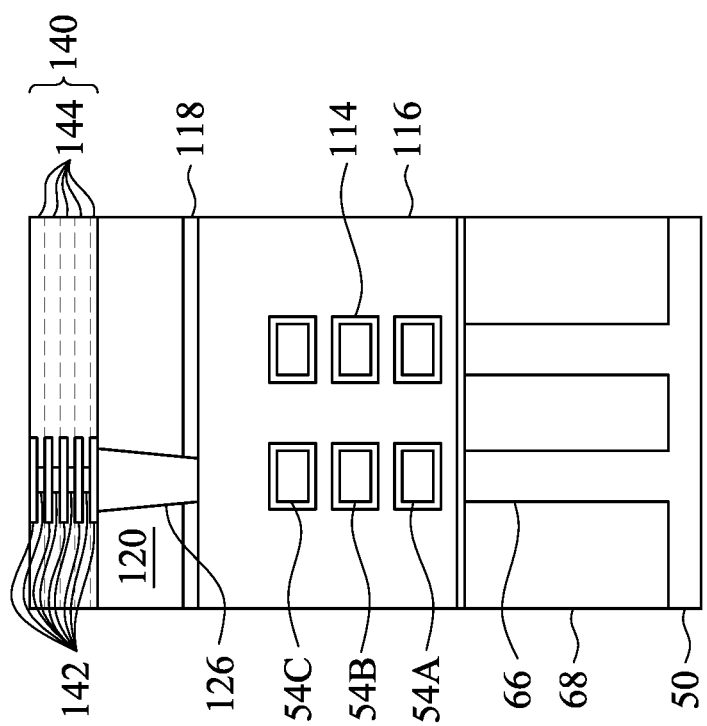
Figure 25B:
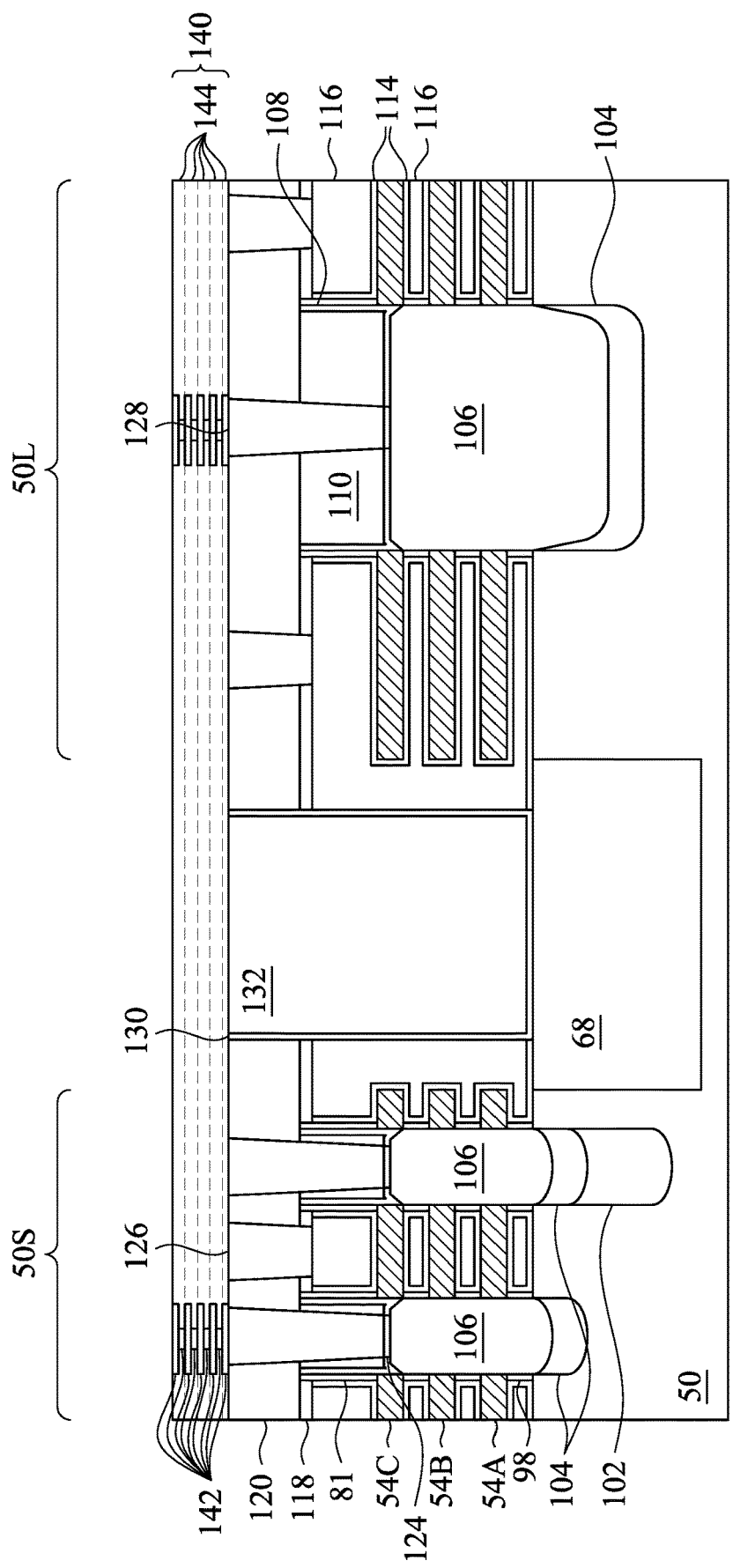
Figure 25C:
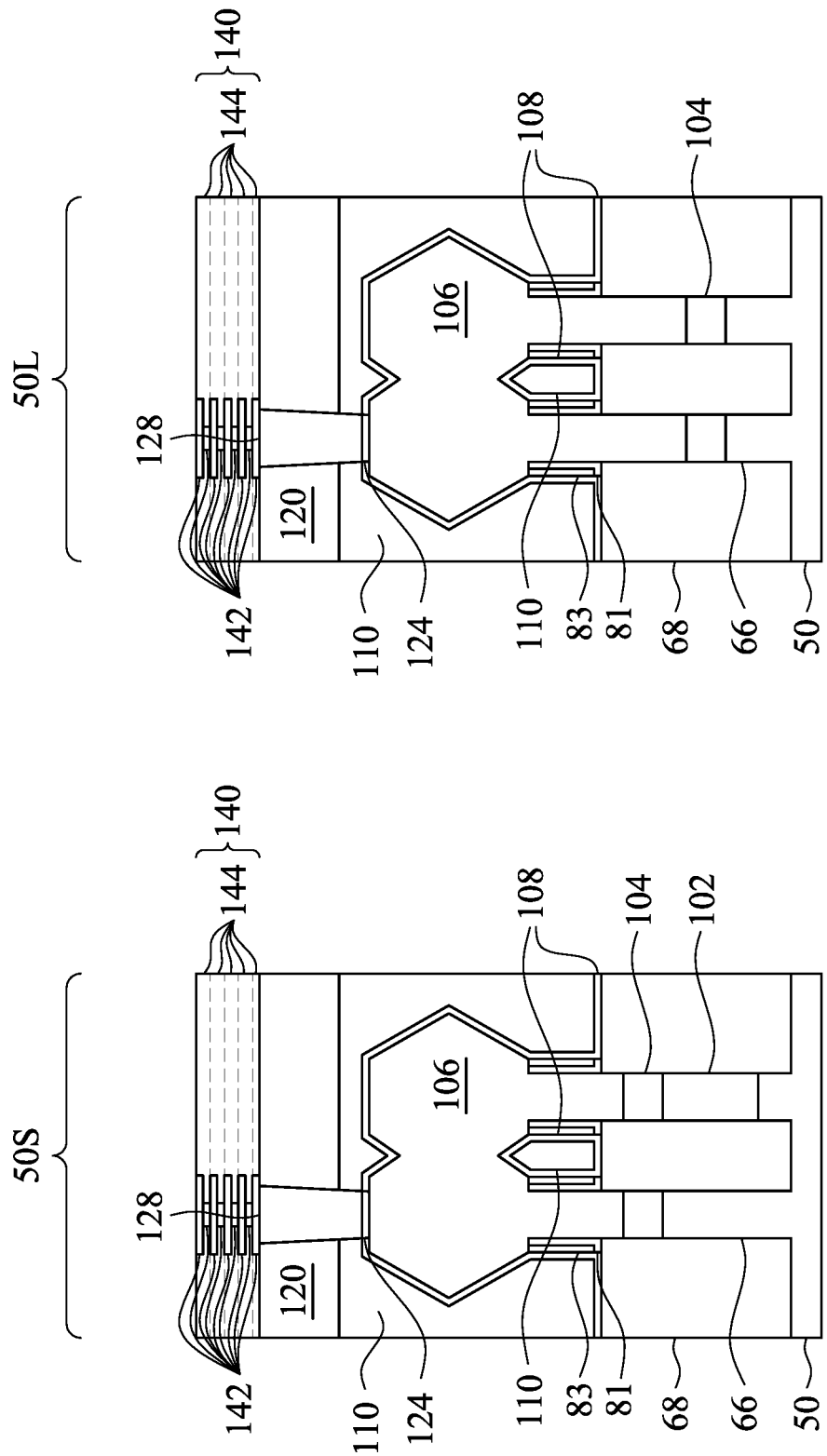

In FIGS. 25A through 25C, a front-side interconnect structure 140 is formed on the second ILD 120 and the third ILD 132. The front-side interconnect structure 140 may be referred to as a front-side interconnect structure because it is formed on a front-side of the substrate 50 (e.g., a side of the substrate 50 on which active devices are formed). The front-side interconnect structure 140 may include one or more layers of conductive features 142 formed in one or more stacked first dielectric layers 144. Each of the stacked first dielectric layers 144 may include a dielectric material, such as a low-k dielectric material, an extra low-k (ELK) dielectric material, or the like. The first dielectric layers 144 may be deposited using appropriate processes, such as, CVD, ALD, PVD, PECVD, or the like.

The conductive features 142 may include conductive lines and conductive vias interconnecting layers of the conductive lines. The conductive vias may extend through respective ones of the first dielectric layers 144 to provide vertical connections between layers of the conductive lines. The conductive features 142 may be formed through any acceptable process, such as a damascene process, a dual damascene process, or the like.

In some embodiments, the conductive features 142 may be formed using a damascene process in which a respective first dielectric layer 144 is patterned utilizing a combination of photolithography and etching techniques to form trenches corresponding to the desired pattern of the conductive features 142. An optional diffusion barrier and/or optional adhesion layer may be deposited in the trenches and the trenches may then be filled with a conductive material. Suitable materials for the barrier layer include titanium, titanium nitride, titanium oxide, tantalum, tantalum nitride, titanium oxide, or other alternatives. Suitable materials for the conductive material include copper, silver, gold, tungsten, aluminum, combinations thereof, or the like. In an embodiment, the conductive features 142 may be formed by depositing a seed layer of copper or a copper alloy, and filling the trenches using electroplating. A CMP process or the like may be used to remove excess conductive material from surfaces of the respective first dielectric layer 144 and to planarize surfaces of the conductive features 142 and the first dielectric layer 144 for subsequent processing.

FIGS. 25A through 25C illustrate five layers of the conductive features 142 and the first dielectric layers 144. However, it should be appreciated that the front-side interconnect structure 140 may include any number of the conductive features 142 disposed in any number of the first dielectric layers 144. The front-side interconnect structure 140 may be electrically connected to the gate contacts 126 and the source/drain contacts 128 to form functional circuits. In some embodiments, the functional circuits formed by the front-side interconnect structure 140 may include logic circuits, memory circuits, image sensor circuits, or the like.

Figure 26A:
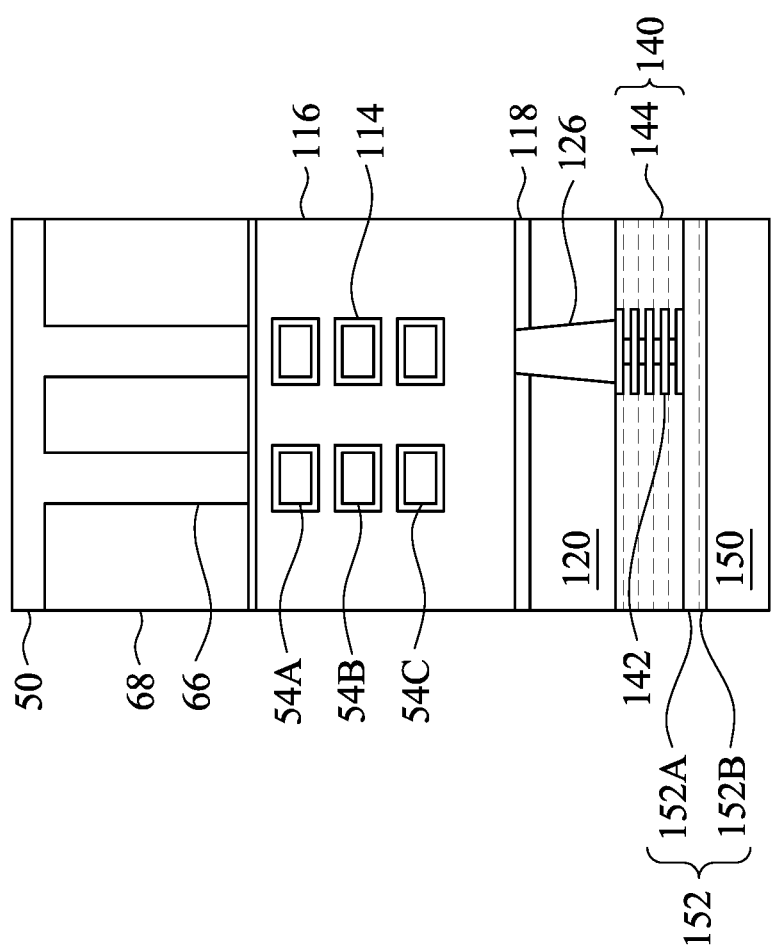
Figure 26B:
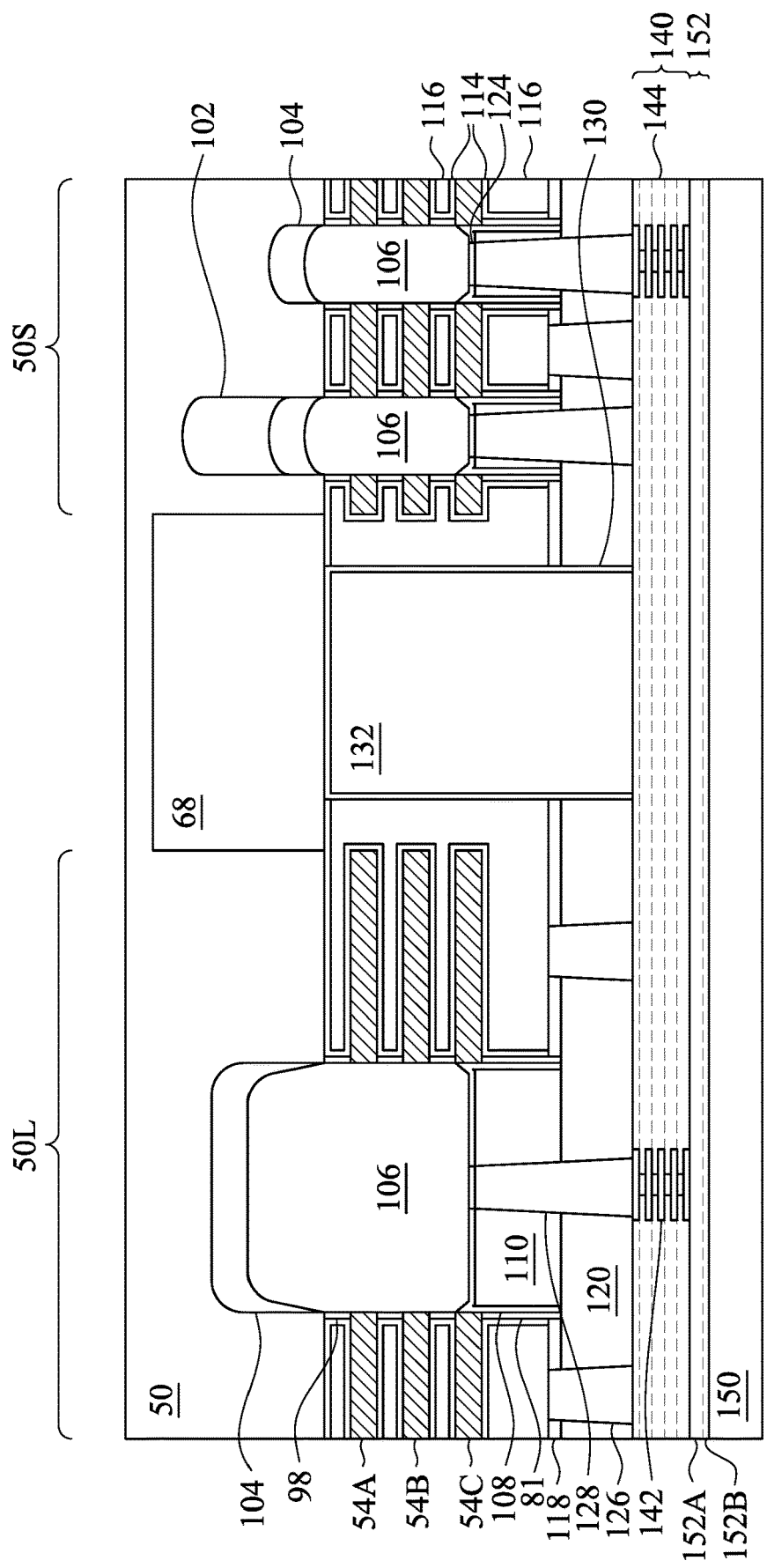
Figure 26C:
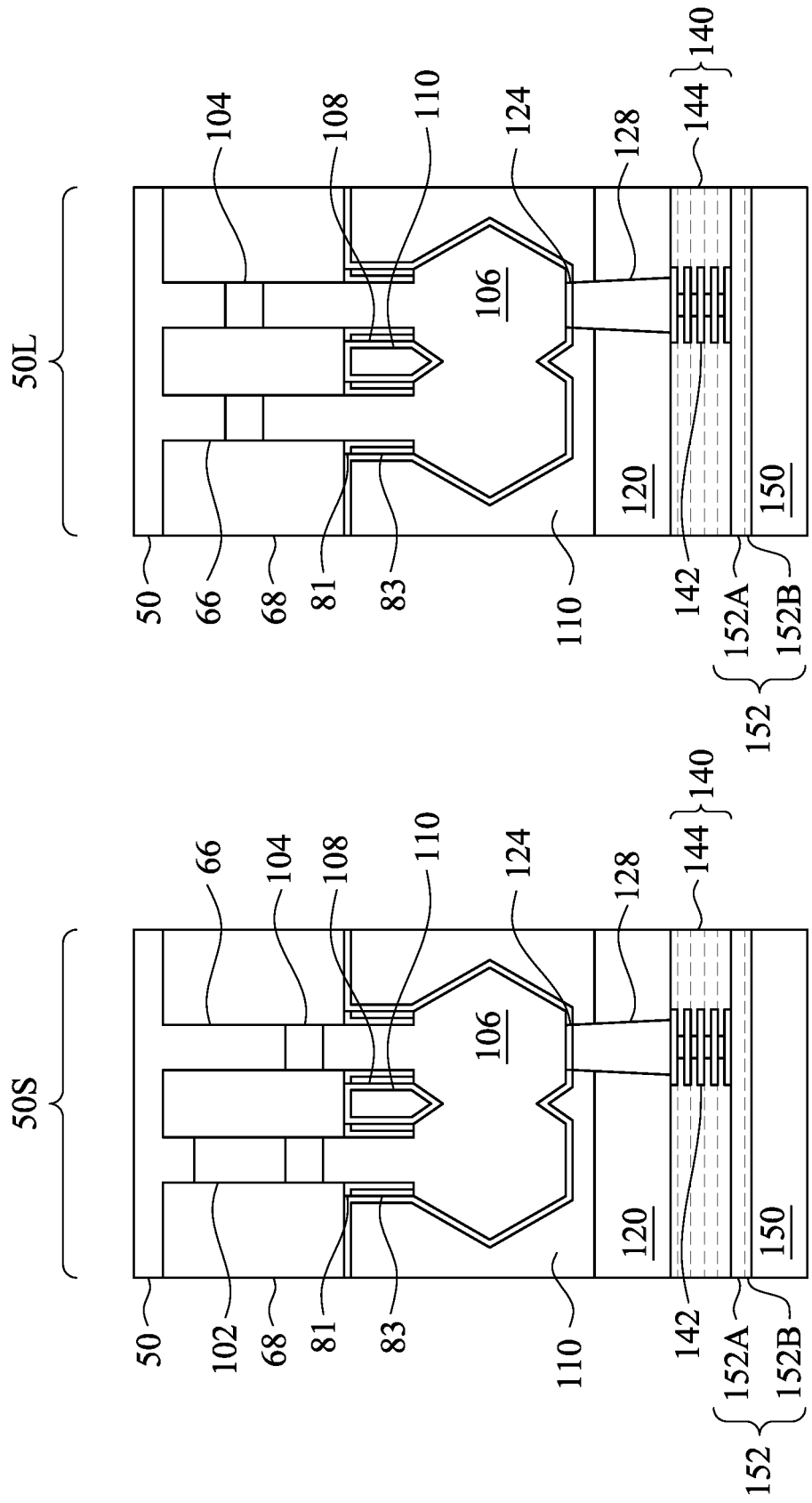

In FIGS. 26A through 26C, a carrier substrate 150 is bonded to a top surface of the front-side interconnect structure 140 by a first bonding layer 152A and a second bonding layer 152B (collectively referred to as a bonding layer 152). The carrier substrate 150 may be a glass carrier substrate, a ceramic carrier substrate, a wafer (e.g., a silicon wafer), or the like. The carrier substrate 150 may provide structural support during subsequent processing steps and in the completed device.

In some embodiments, the carrier substrate 150 may be bonded to the front-side interconnect structure 140 using a suitable technique such as dielectric-to-dielectric bonding, or the like. Dielectric-to-dielectric bonding may include depositing the first bonding layer 152A on the front-side interconnect structure 140. In some embodiments, the first bonding layer 152A includes silicon oxide (e.g., a high density plasma (HDP) oxide or the like) that is deposited by CVD, ALD, PVD, or the like. The second bonding layer 152B may be an oxide layer that is formed on a surface of the carrier substrate 150 prior to bonding using, for example, CVD, ALD, PVD, thermal oxidation, or the like. Other suitable materials may be used as well for the first bonding layer 152A and the second bonding layer 152B.

The dielectric-to-dielectric bonding process may further include applying a surface treatment to one or more of the bonding layers 152. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The carrier substrate 150 is then aligned with the front-side interconnect structure 140 and the two are pressed against each other to initiate a pre-bonding of the carrier substrate 150 to the front-side interconnect structure 140. The pre-bonding may be performed at room temperature (e.g., between about 21° C. and about 25° C.). After the pre-bonding, an annealing process may be applied by, for example, heating the front-side interconnect structure 140 and the carrier substrate 150 to a temperature of about 170° C. to about 500° C.

As further illustrated in FIGS. 26A through 26C, after the carrier substrate 150 is bonded to the front-side interconnect structure 140, the device may be flipped such that a backside of the substrate 50 faces upwards. The backside of the substrate 50 may refer to a side opposite the front-side of the substrate 50 on which active devices are formed.

Figure 27A:
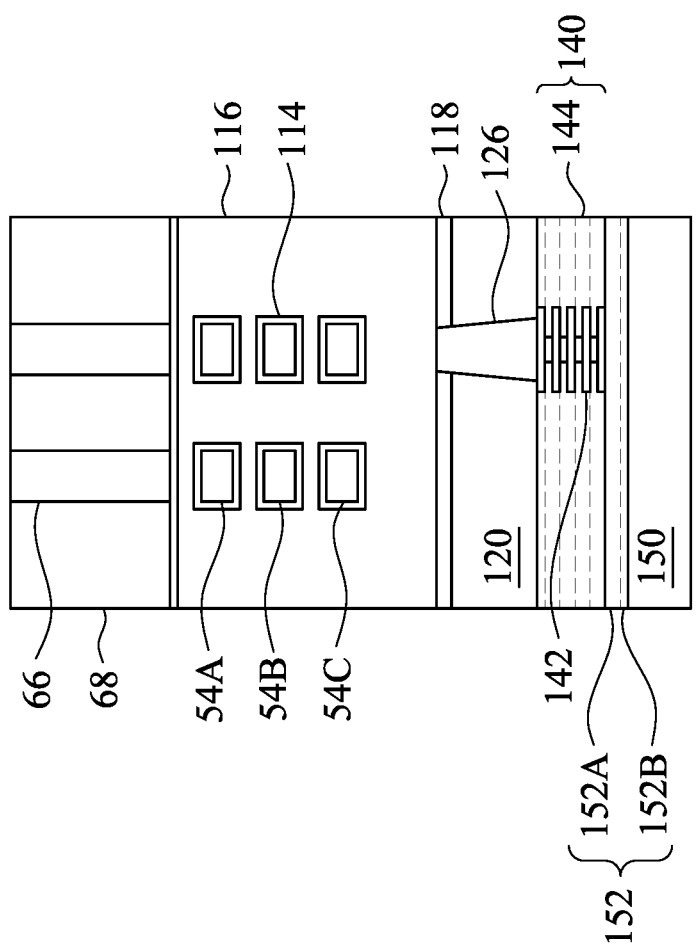
Figure 27B:
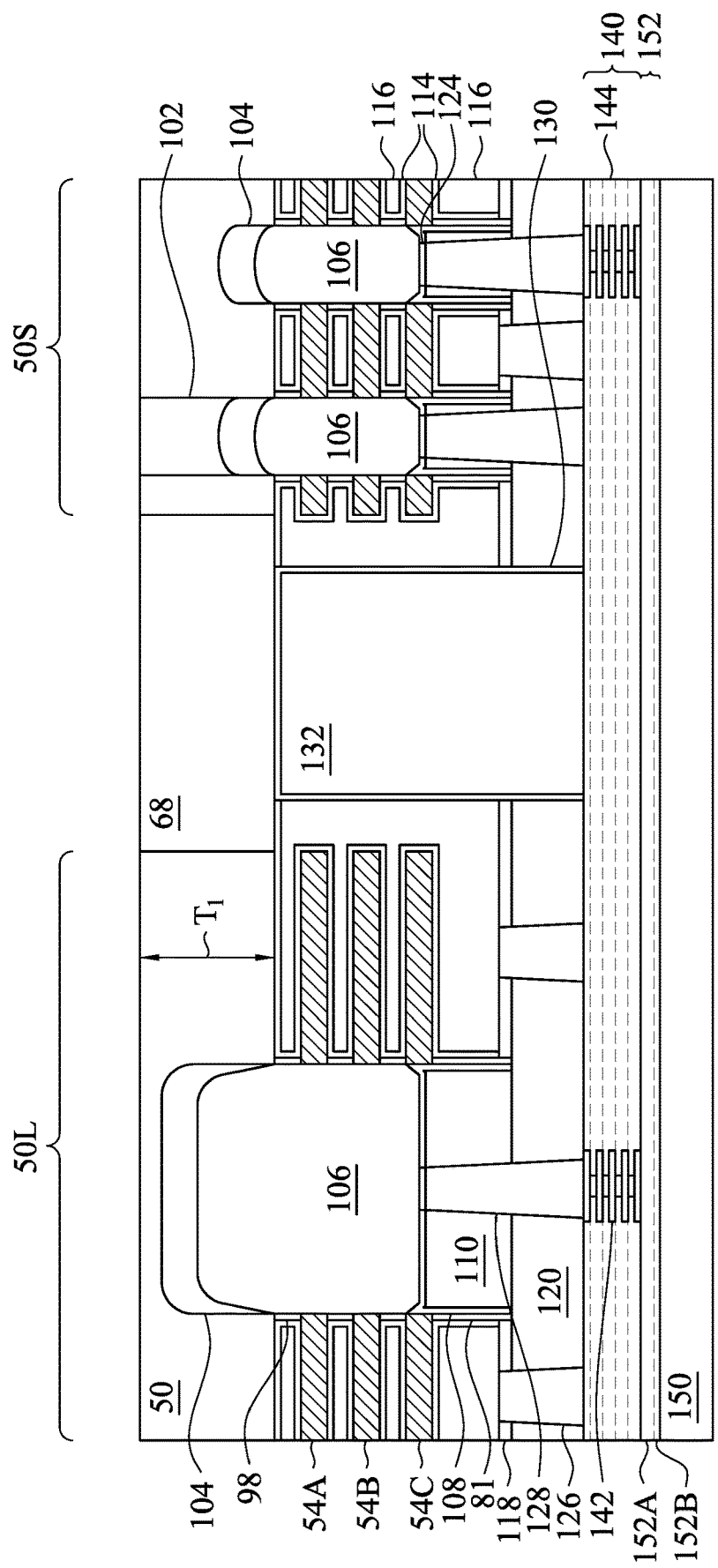
Figure 27C:
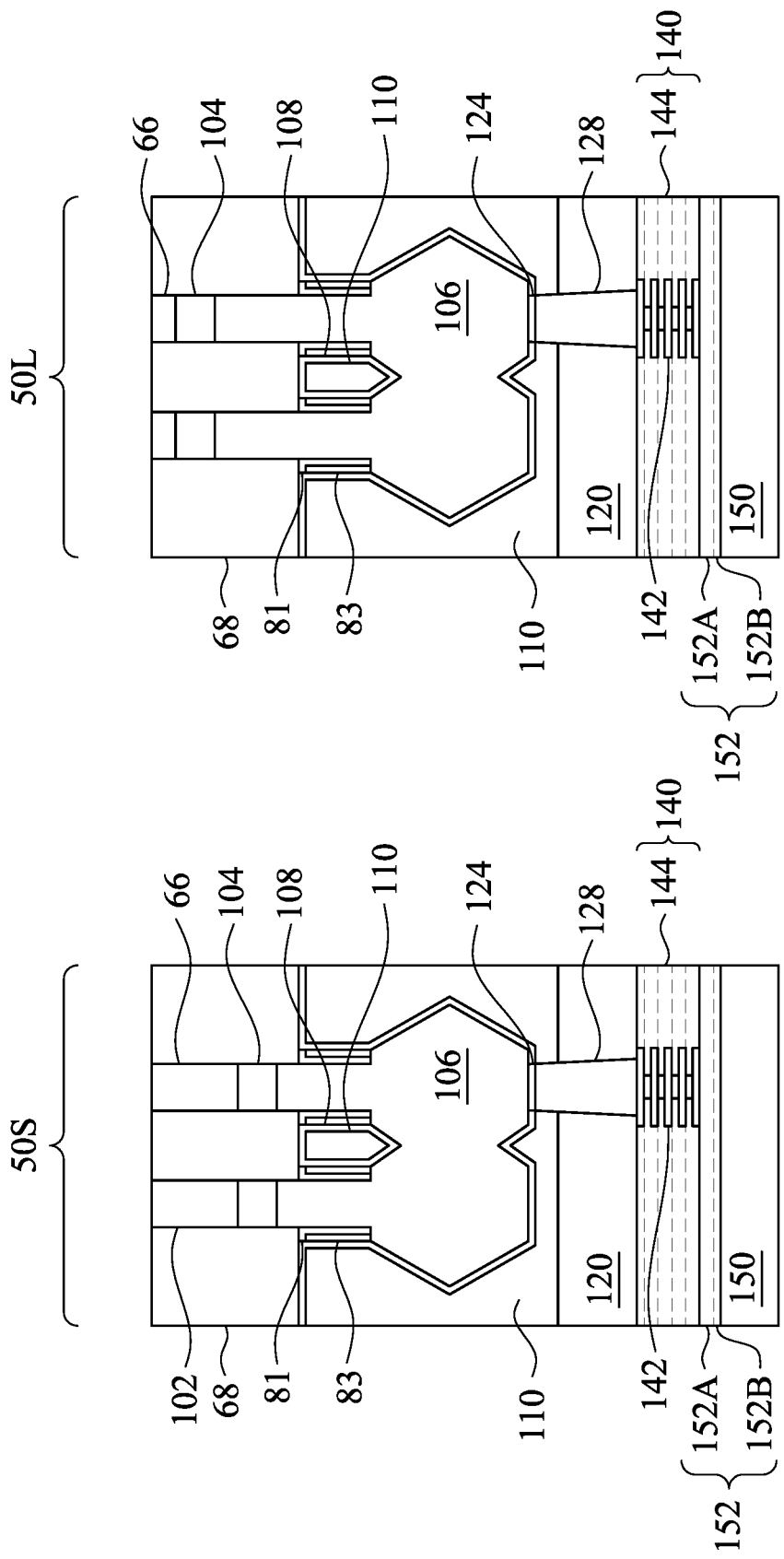

In FIGS. 27A through 27C, a thinning process is applied to the backside of the substrate 50. The thinning process may include a planarization process (e.g., a mechanical grinding, a CMP, or the like), an etch-back process, combinations thereof, or the like. The thinning process may expose surfaces of the first epitaxial material 102, the fins 66, and the STI regions 68 opposite the front-side interconnect structure 140. Further, a portion of the substrate 50 may remain over the gate structure (e.g., gate electrodes 116 and the gate dielectric layers 114) and the nanostructures 55 after the thinning process. Following the thinning process, the substrate 50 may have a thickness $T_1$ over the gate structures ranging from about 70 nm to about 150 nm. The thickness of the substrate 50 following the thinning process may be controlled in order to control the length of subsequently formed backside vias.

Figure 28A:
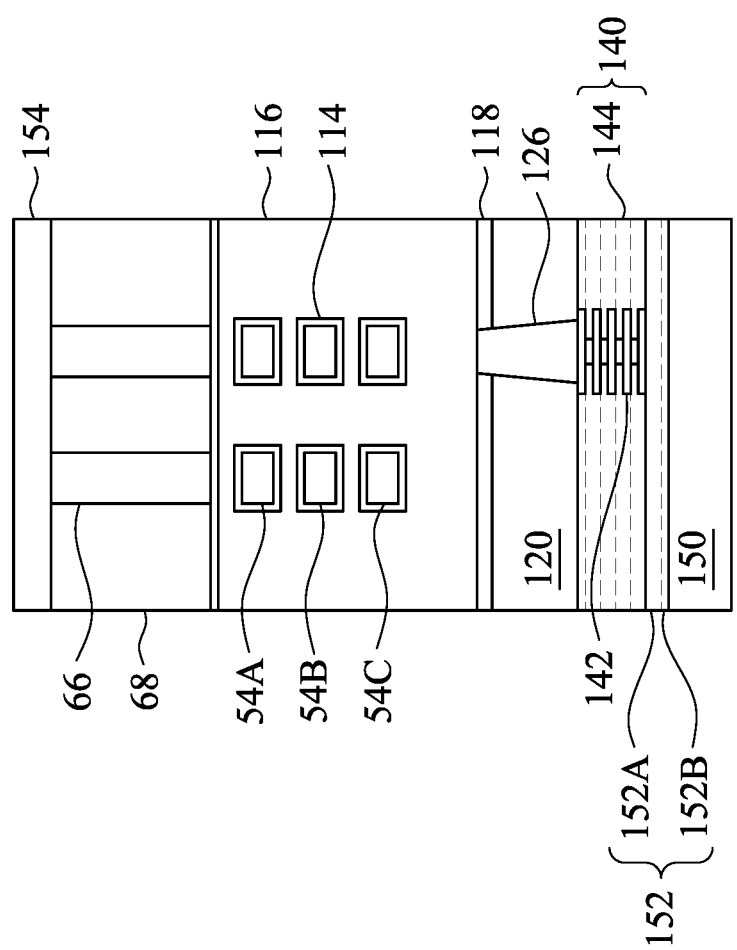
Figure 28B:
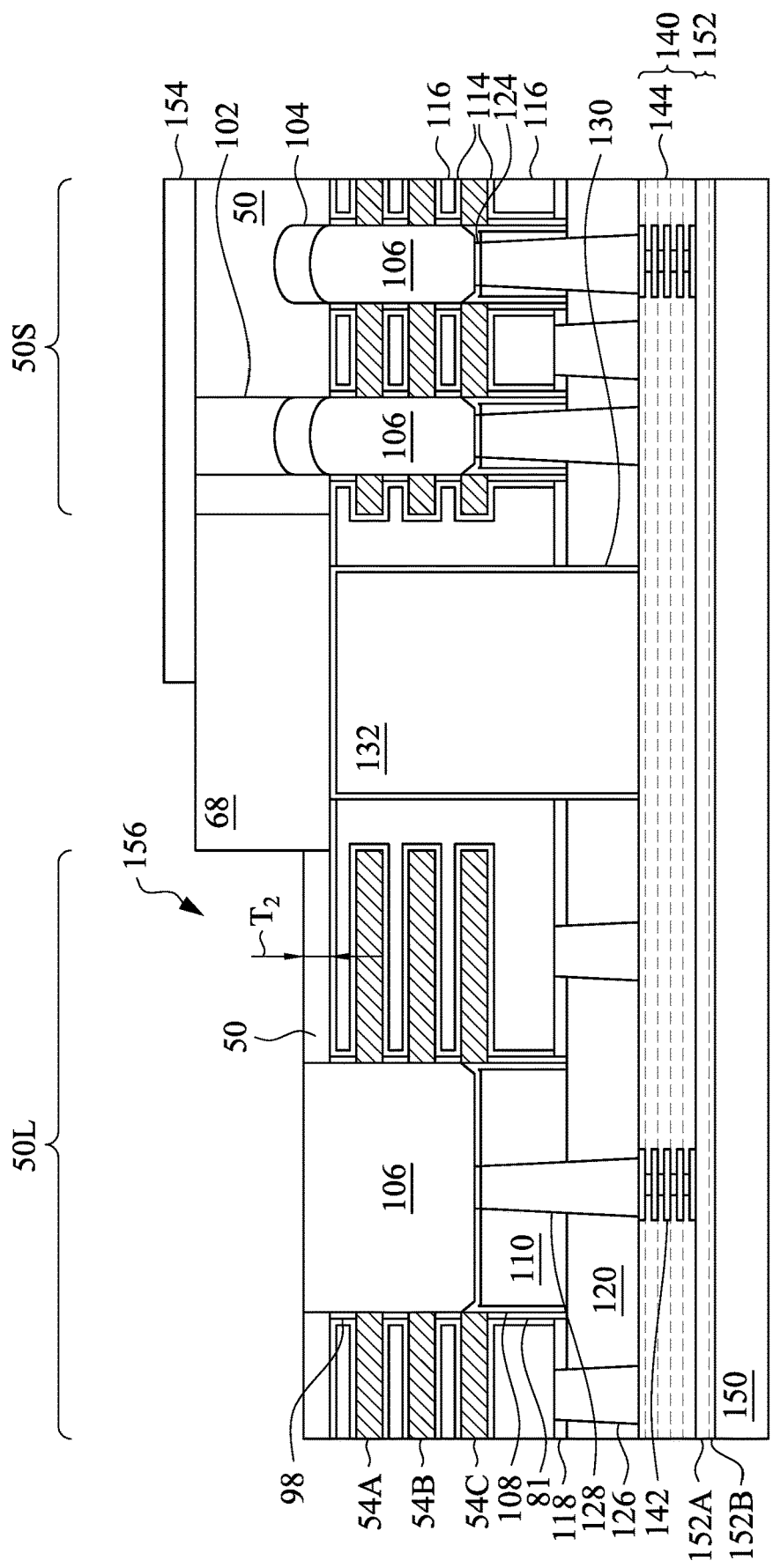
Figure 28C:
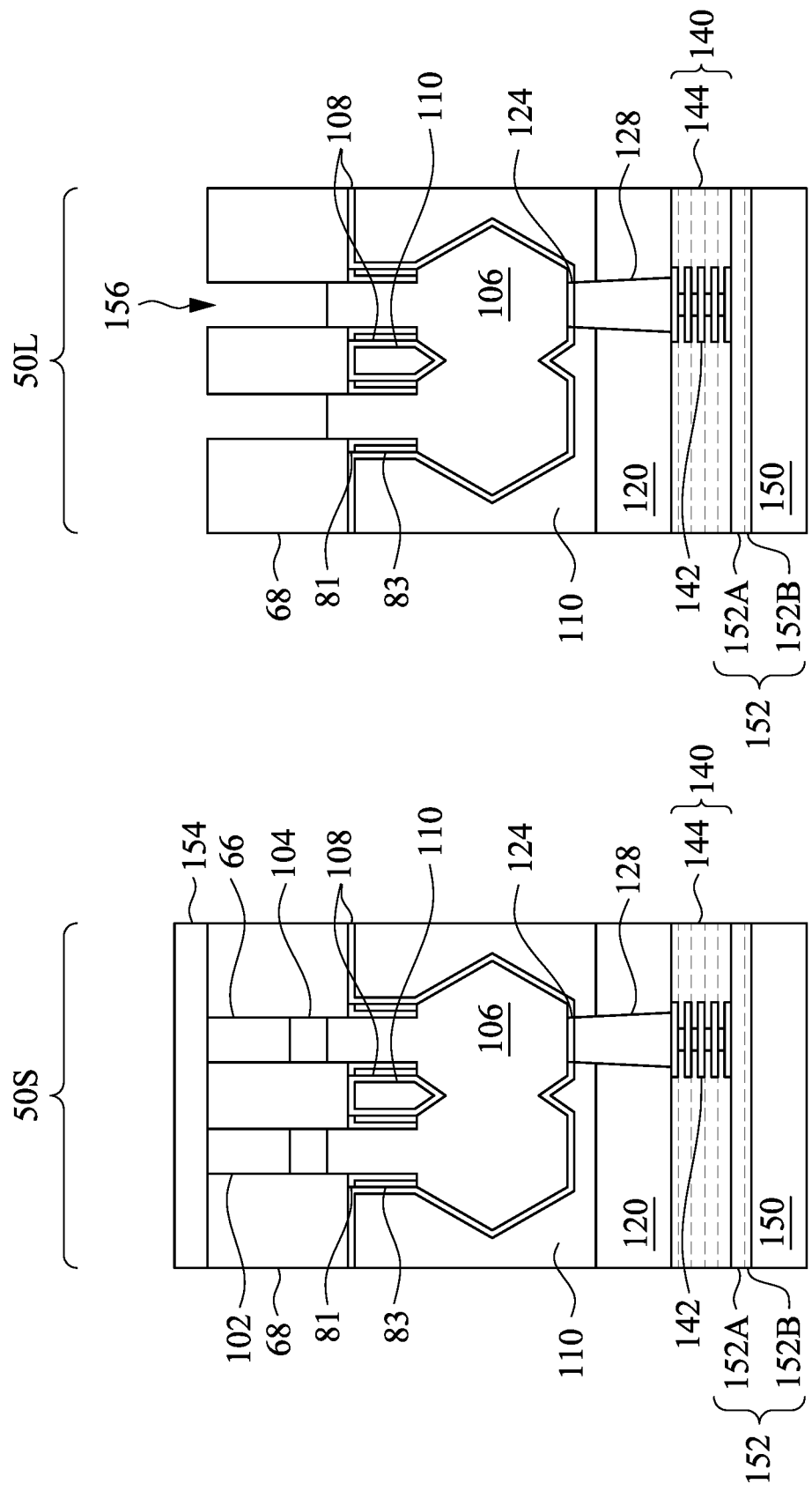

In FIGS. 28A through 28C, a fifth patterned mask 154 is formed over the structures illustrated in FIGS. 27A through 27C and the substrate 50, the fins 66, the second epitaxial material 104, and the epitaxial source/drain regions 106 are etched to form sixth recesses 156 using the fifth patterned mask 154 as a mask. The fifth patterned mask 154 may be formed by depositing a photoresist layer using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the fifth patterned mask 154.

Portions of the substrate 50, the fins 66, the second epitaxial material 104, and the epitaxial source/drain regions 106 exposed by the fifth patterned mask 154 are then etched by an etching process to form the sixth recesses 156. The etching process may be performed using process gases selected from, and not limited to, chlorine-based and/or fluorine-based gases. For example, the etching gas may include $Cl_2$, $BCl_3$, $CH_4$, $CF_4$, $CHF_3$, $CH_2F_2$, $H_2$, or combinations thereof. A carrier gas such as Ar or He may be added. In some embodiments, oxygen ($O_2$) is added into the etching gas to oxidize the portions of the substrate 50, the fins 66, the second epitaxial material 104, and the epitaxial source/drain regions 106 that are being etched. The etching process may include plasma generation and a bias voltage may be applied so that the etching process is anisotropic. The bias voltage may be from about 100 V to about 300 V. The fifth patterned mask 154 may then be removed. Following the etching process, the substrate 50 may have a thickness $T_2$ over the gate structures in the long-channel regions 50L ranging from about 0.5 nm to about 20 nm. The thickness of the substrate 50 in the long-channel regions 50L following the etching process may be controlled in order to control the length of subsequently formed backside vias. The sixth recesses 156 may expose backside surfaces and sidewalls of the second epitaxial material 104.

Conventional processes may etch the substrate 50 in the long-channel regions 50L and the short-channel regions 50S at the same time. Etching the substrate 50, the second epitaxial material 104, and the epitaxial source/drain regions 106 in the long-channel regions 50L according to the above-described processes while masking the short-channel regions 50S with the fifth patterned mask 154 may prevent the epitaxial source/drain regions 106 in the long-channel regions 50L from being damaged by processes used to etch the substrate 50. This reduces device defects and improves device performance.

Figure 29A:
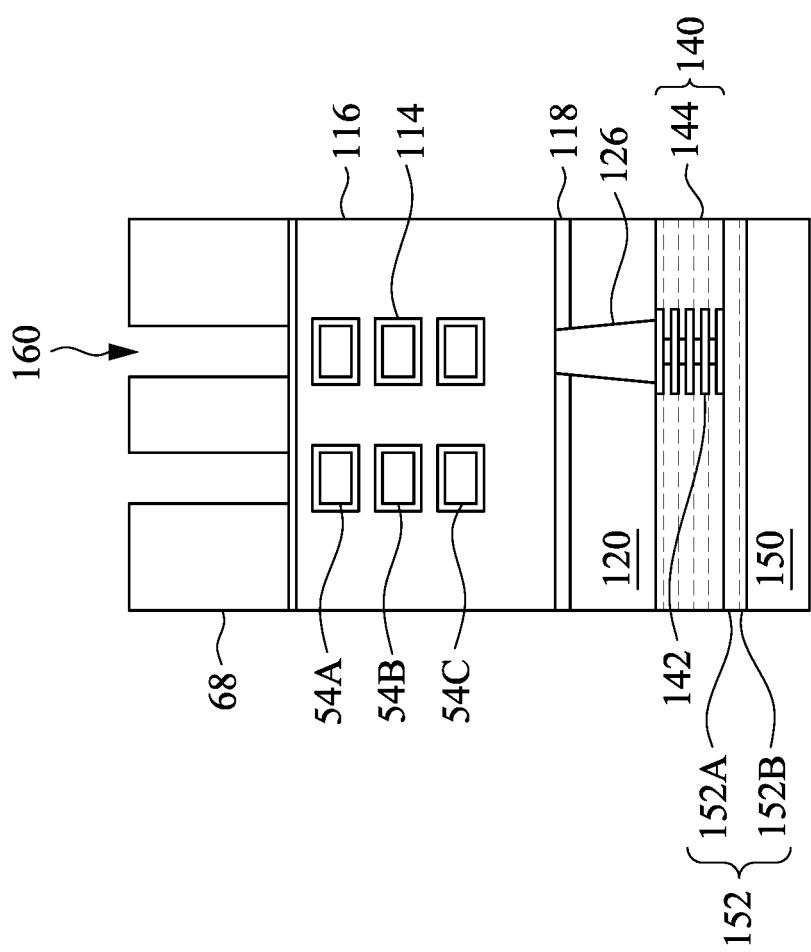
Figure 29B:
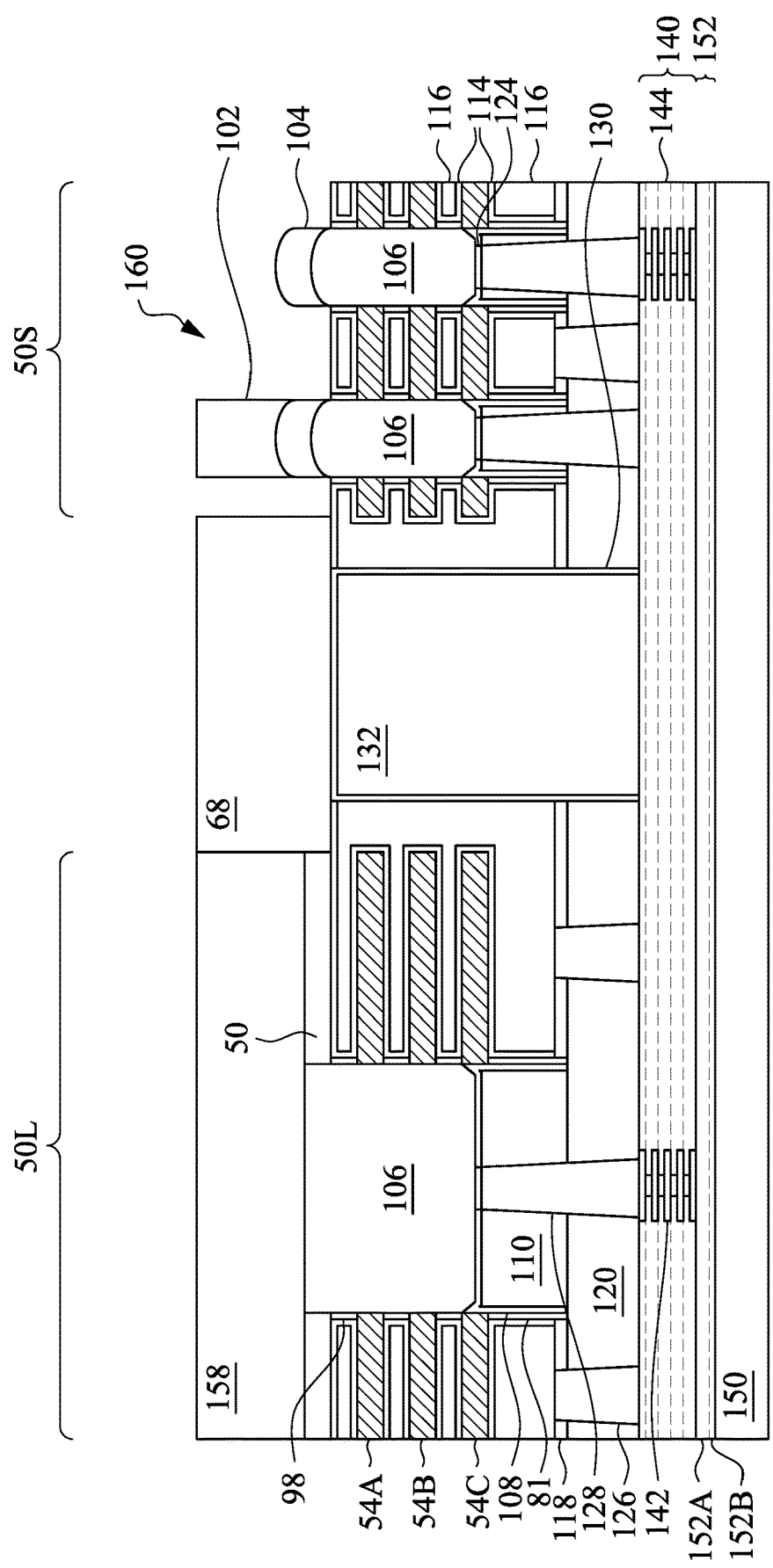
Figure 29C:
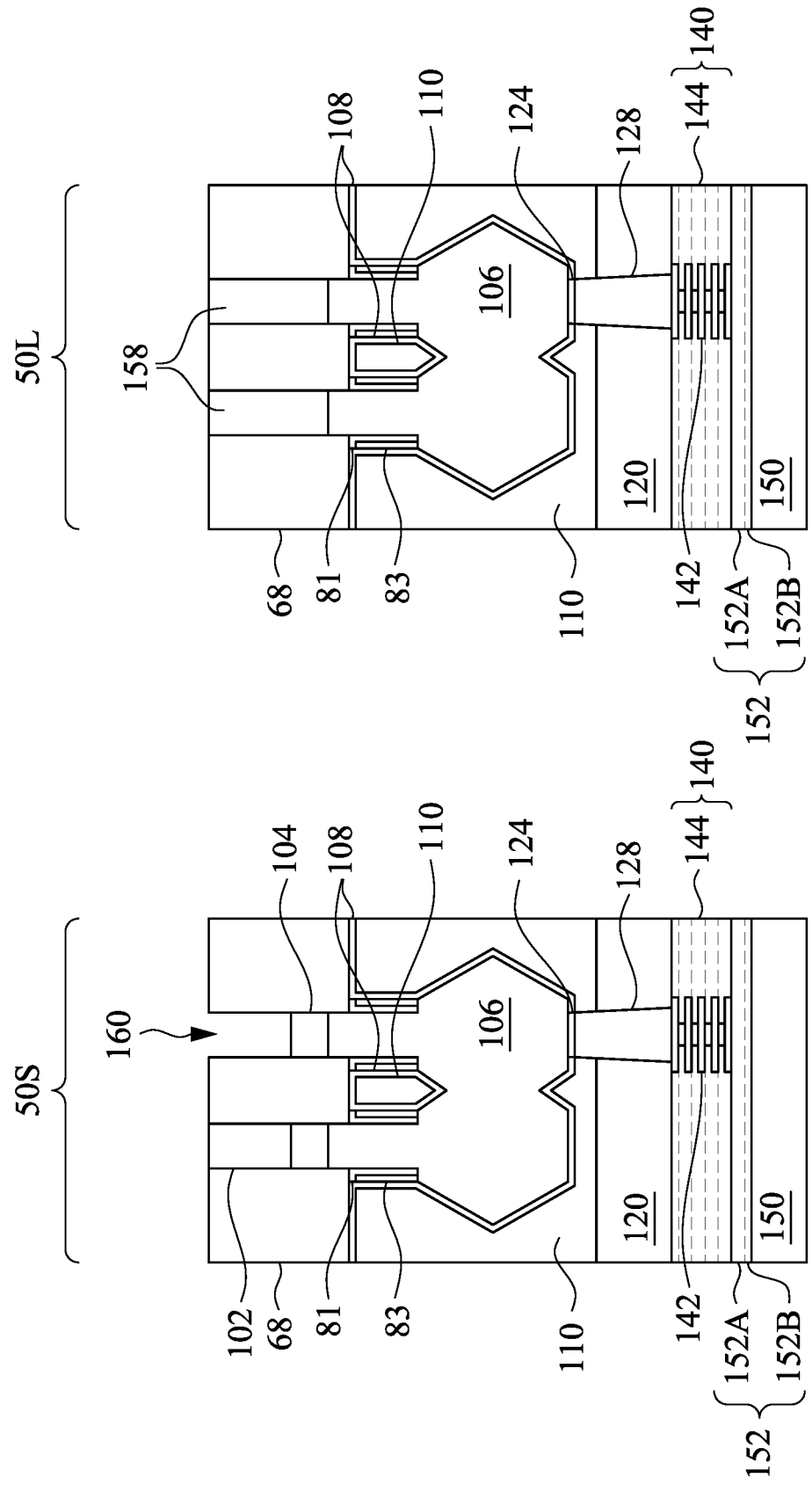

In FIGS. 29A through 29C, a fourth ILD 158 is formed in the sixth recesses 156 and the substrate 50 is etched in the short-channel regions 50S to form seventh recesses 160. The fourth ILD 158 may be a dielectric material such as silicon nitride, silicon oxide, silicon oxynitride, a low-k dielectric material, combinations of these, or the like. The fourth ILD 158 may be deposited by a process such as CVD, PVD, ALD, combinations or multiples thereof, or the like. In some embodiments, the fourth ILD 158 is a flowable film formed by FCVD. In some embodiments, the fourth ILD 158 is formed of a dielectric material such as PSG, BSG, BPSG, USG, or the like. In some embodiments, the fourth ILD 158 may comprise silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), silicon (Si), zirconium nitride (ZrN), silicon carbonitride (SiCN), combinations or multiple layers thereof, or the like. A CMP process or the like may be used to remove material of the fourth ILD 158 such that top surfaces of the fourth ILD 158 are level with top surfaces of the STI regions 68, the first epitaxial material 102, and the substrate 50. The fourth ILD 158 may have a thickness from about 5 nm to about 40 nm.

Portions of the substrate 50 and the fins 66 in the short-channel regions 50S are then etched by an etching process to form the seventh recesses 160. The etching process may be performed using process gases selected from, and not limited to, chlorine-based and/or fluorine-based gases. For example, the etching gas may include $Cl_2$, $BCl_3$, $CH_4$, $CF_4$, $CHF_3$, $CH_2F_2$, $H_2$, or combinations thereof. A carrier gas such as Ar or He may be added. In some embodiments, oxygen ($O_2$) is added into the etching gas to oxidize the portions of the substrate 50 and the fins 66 that are being etched. The etching process may include plasma generation and a bias voltage may be applied so that the etching process is anisotropic. The bias voltage may be from about 100 V to about 300 V. As illustrated in FIGS. 29A through 29C, the substrate 50 and the fins 66 may be removed in the short-channel regions 50S. The seventh recesses 160 may expose sidewalls and backside surfaces of the first epitaxial material 102, sidewalls and backside surfaces of the second epitaxial material 104, backside surfaces of the first inner spacers 98, and backside surfaces of the gate dielectric layers 114.

Figure 30A:
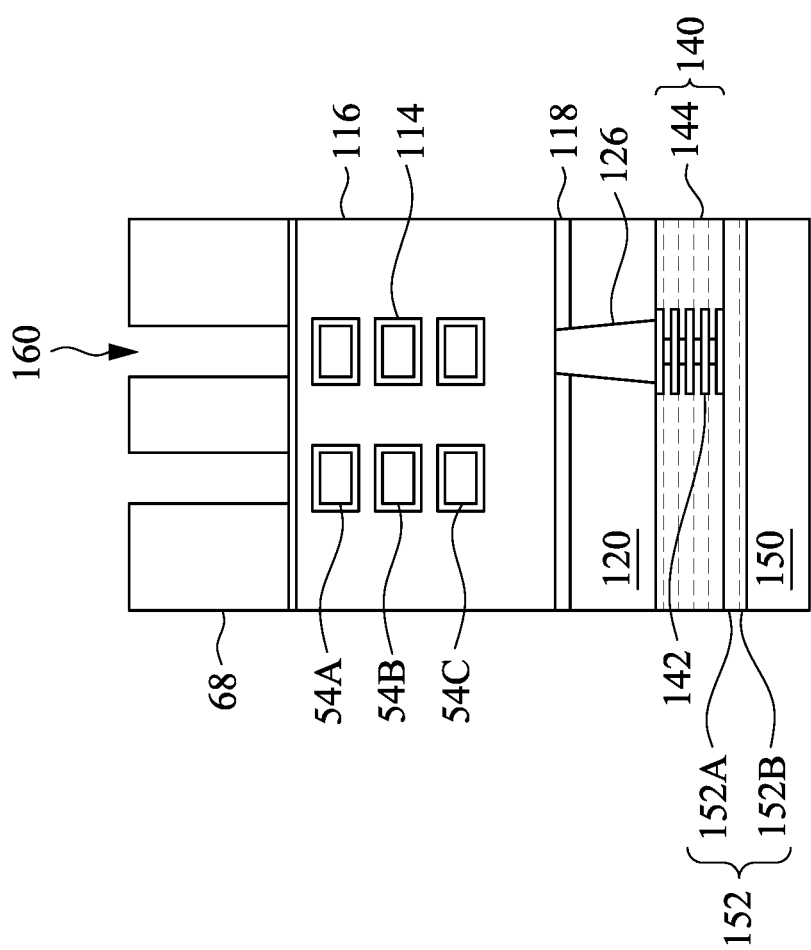
Figure 30B:
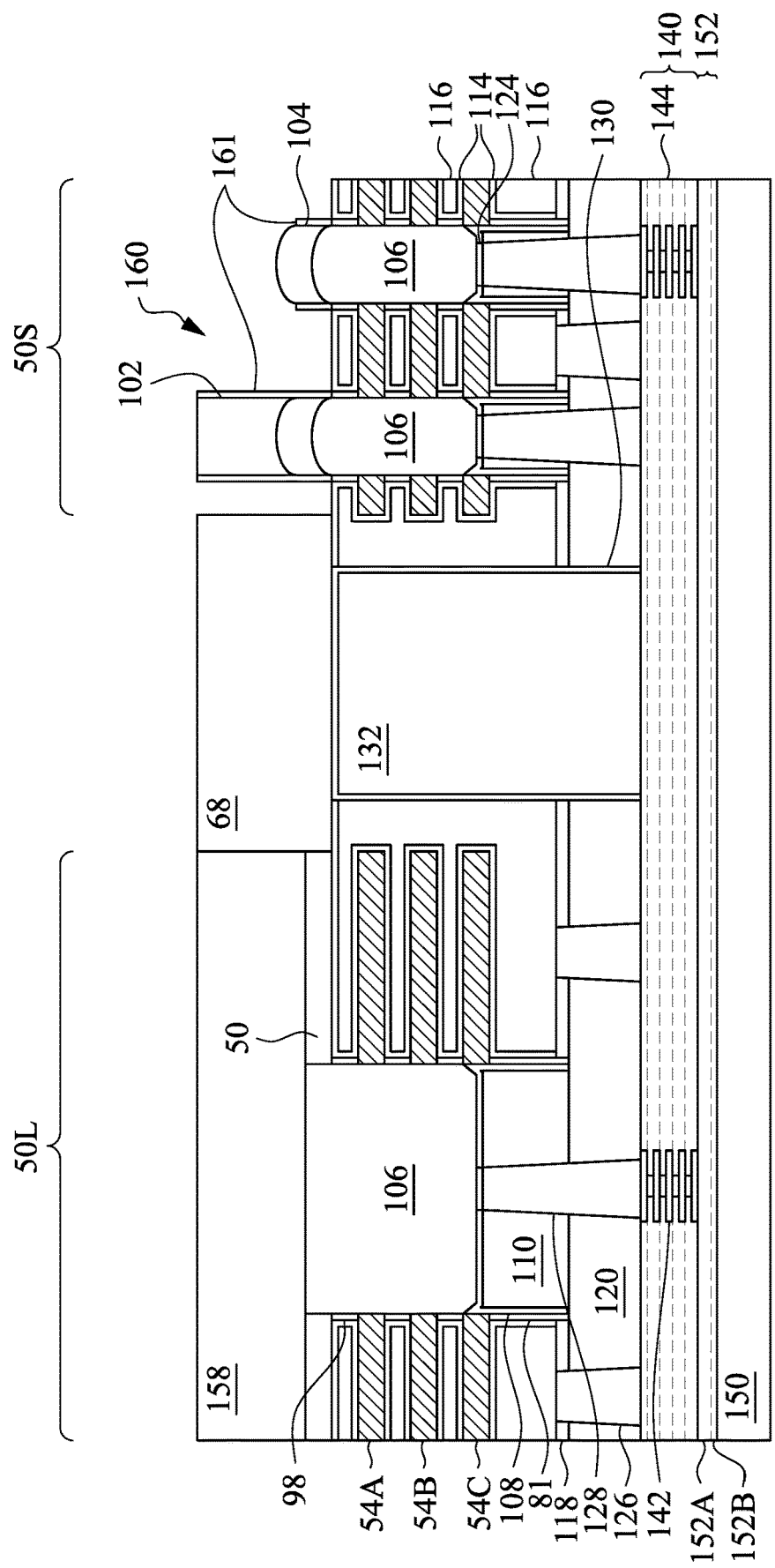
Figure 30C:
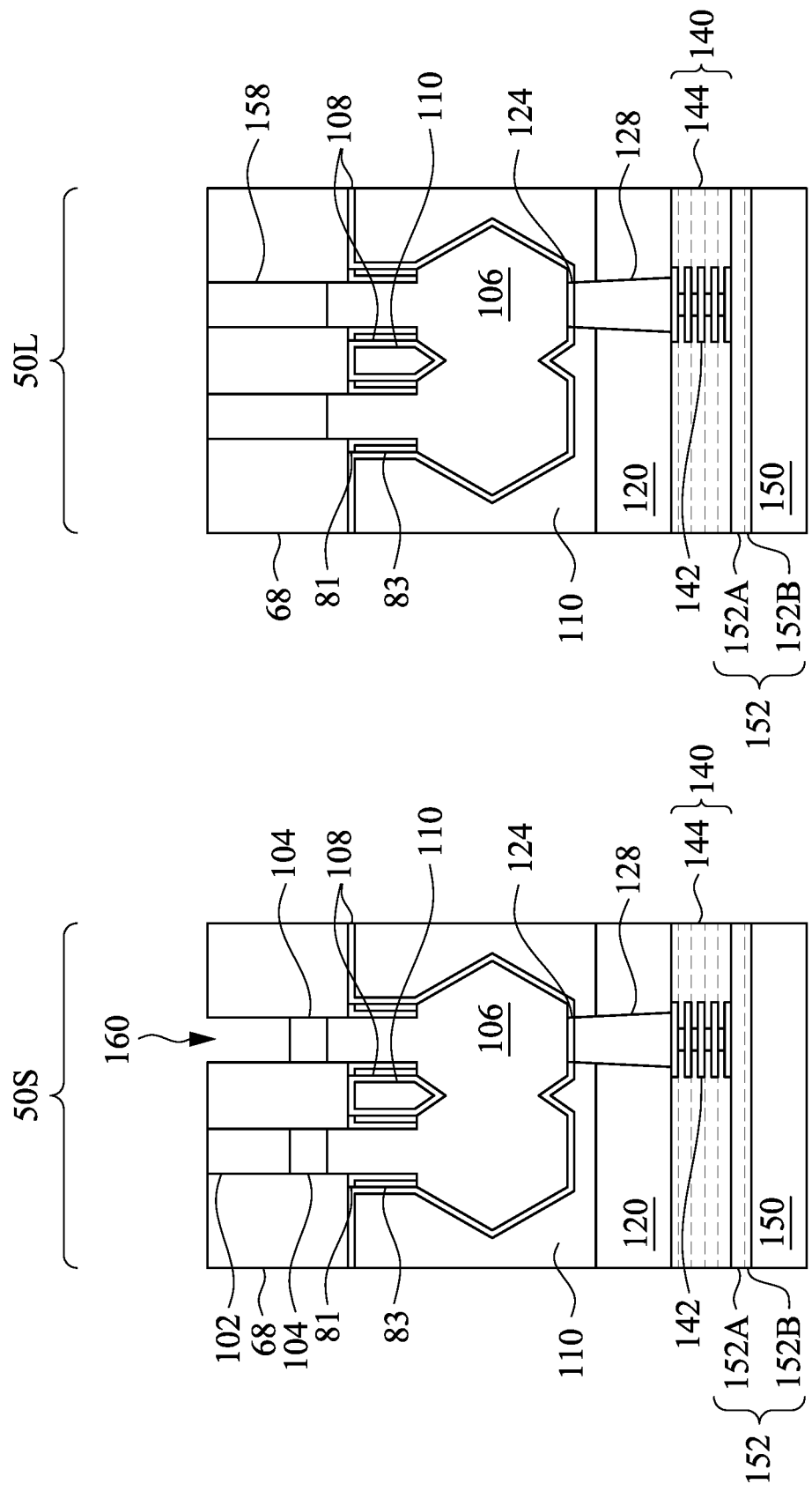

In FIGS. 30A through 30C, third spacers 161 are formed along sidewalls of the first epitaxial material 102 and the second epitaxial material 104 in the short-channel regions 50S. The third spacers 161 may be formed by depositing a third spacer layer (not separately illustrated) over the structures illustrated in FIG. 29A through 29C. The third spacer layer may be deposited by CVD, ALD, or the like. The third spacer layer may be formed of silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), silicon (Si), zirconium nitride (ZrN), silicon carbonitride (SiCN), combinations or multiple layers thereof, or the like. The material of the third spacer layer may be selected in order to protect sidewalls of the first epitaxial material 102 and the second epitaxial material 104 from subsequent etching processes, such as the etching processes discussed below with respect to FIGS. 31A through 31C. The third spacer layer may be deposited to a thickness ranging from about 1 nm to about 10 nm.

The third spacer layer is then etched to form the third spacers 161. The third spacer layer may be etched using suitable etching processes, such as isotropic etching processes (e.g., wet etching processes), anisotropic etching processes (e.g., dry etching processes), multiple processes or combinations thereof, or the like.

Figure 31A:
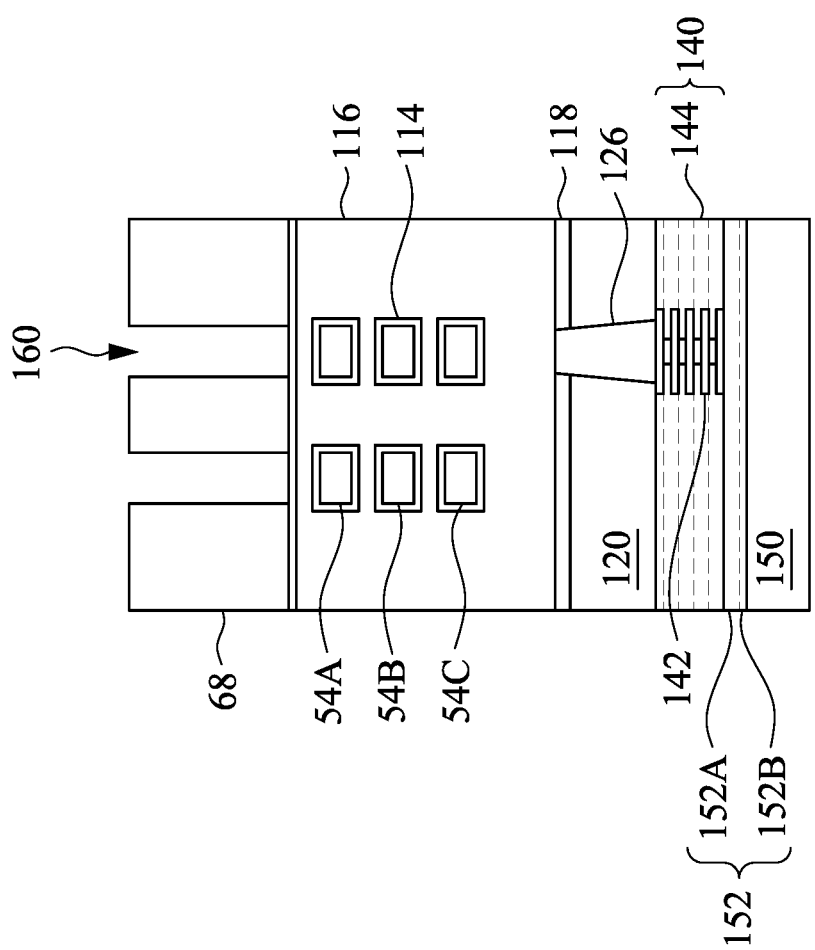
Figure 31B:
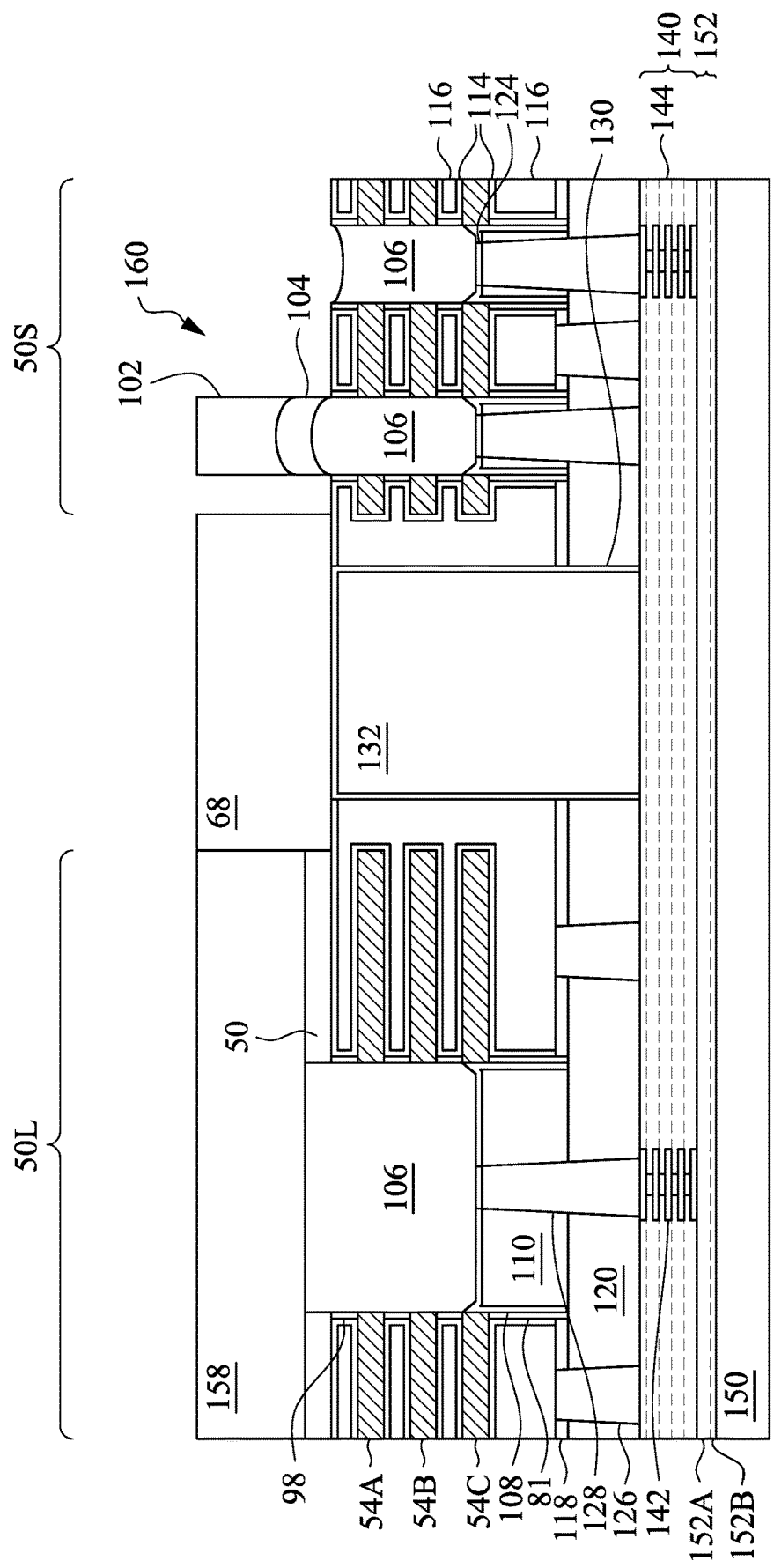
Figure 31C:
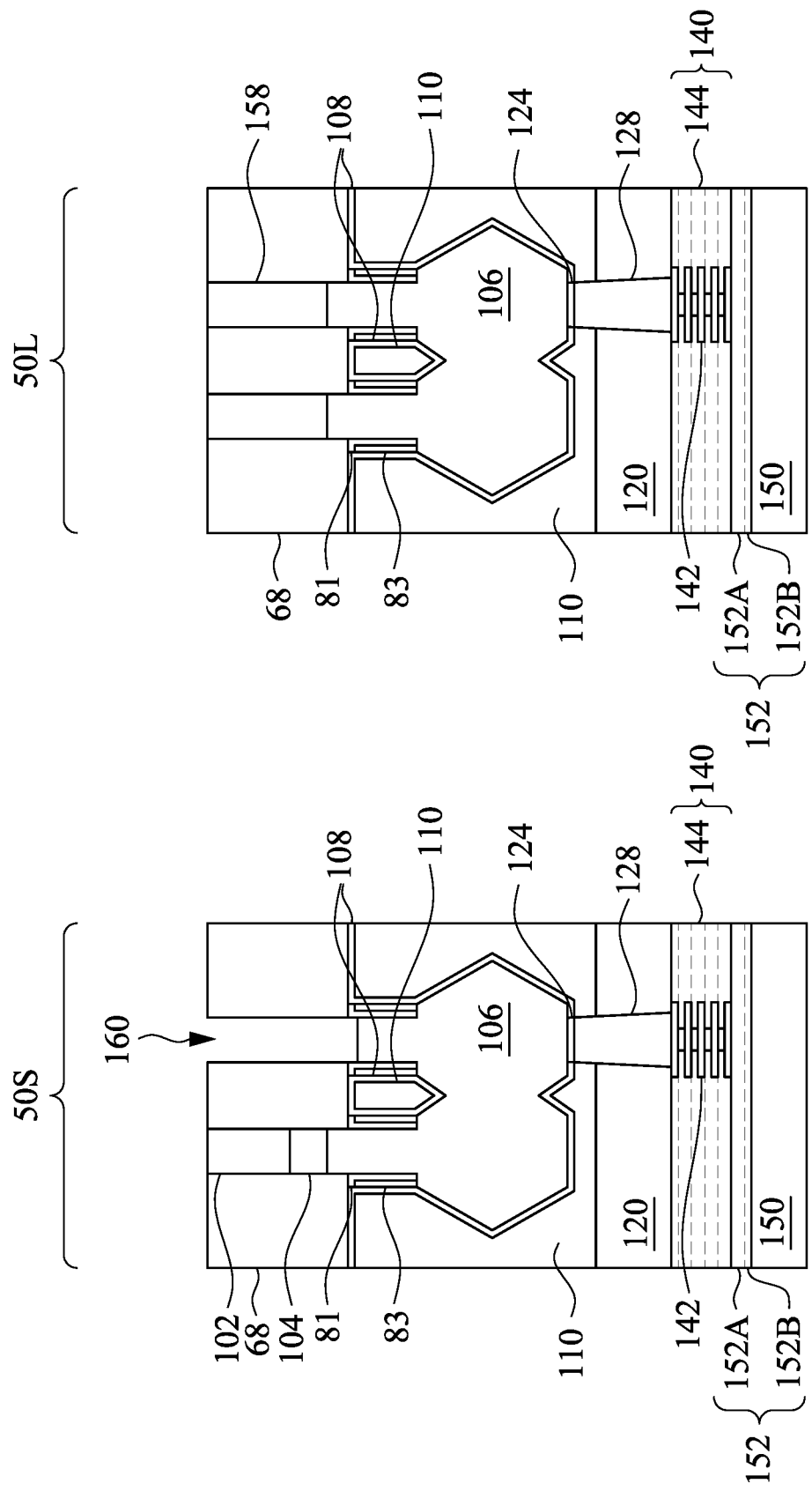

In FIGS. 31A through 31C, the second epitaxial material 104 which is not protected by the first epitaxial material 102 in the short-channel region 50S is etched and the third spacers 161 are removed. The second epitaxial material 104 and the third spacers 161 may be etched by suitable etching processes, which may be isotropic etching processes, such as wet etching processes. The etching processes used to etch the second epitaxial material 104 may have a high etch selectivity to materials of the third spacers 161, the epitaxial source/drain regions 106, the STI regions 68, the fourth ILD 158, the first epitaxial material 102, and the gate dielectric layers 114. As such, the second epitaxial material 104 may be removed without significantly removing materials of the third spacers 161, the epitaxial source/drain regions 106, the STI regions 68, the fourth ILD 158, the first epitaxial material 102, and the gate dielectric layers 114. As illustrated in FIG. 31B, in some embodiments, the etching processes used to remove the second epitaxial material 104 may etch portions of the epitaxial source/drain regions 106 such that backside surfaces of the epitaxial source/drain regions 106 are concave and are disposed below backside surfaces of the gate structures.

The etching processes used to etch the third spacers 161 may have a high etch selectivity to materials of the first epitaxial material 102, the second epitaxial material 104, the epitaxial source/drain regions 106, the STI regions 68, the fourth ILD 158, and the gate dielectric layers 114. As such, the third spacers 161 may be removed without significantly removing materials of the first epitaxial material 102, the second epitaxial material 104, the epitaxial source/drain regions 106, the STI regions 68, the fourth ILD 158, and the gate dielectric layers 114.

Figure 32A:
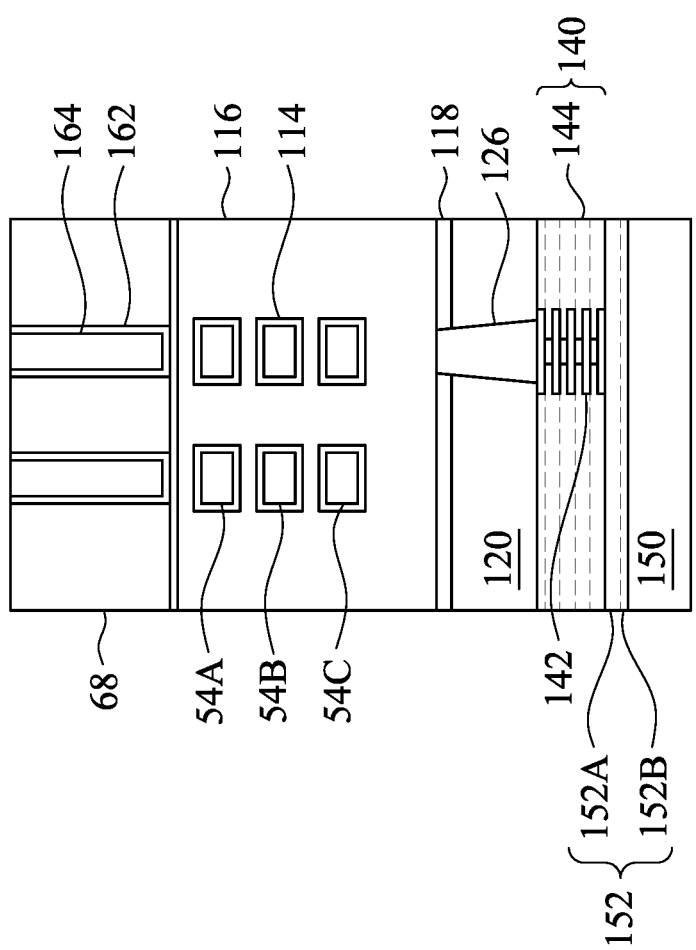
Figure 32B:
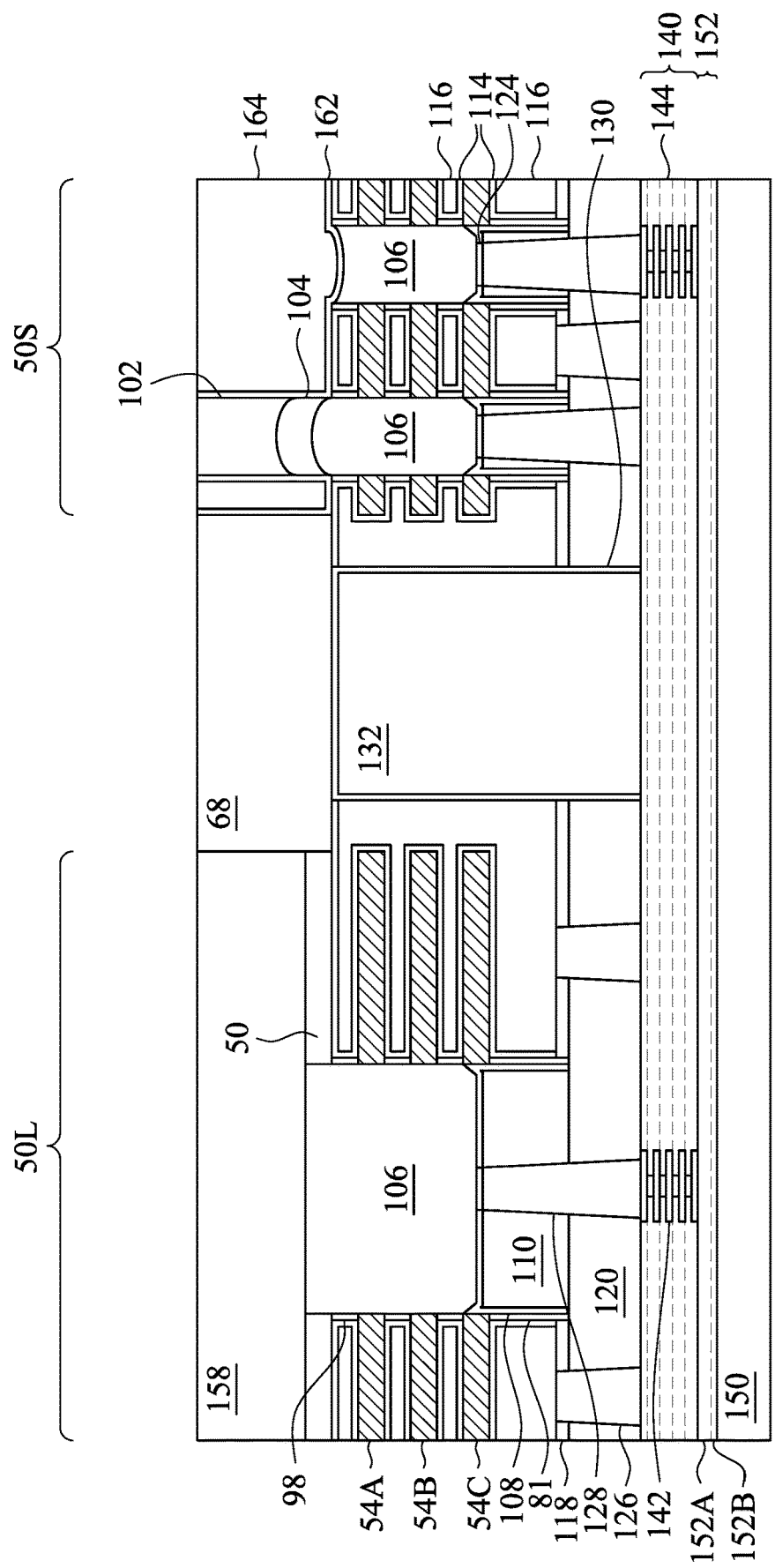
Figure 32C:
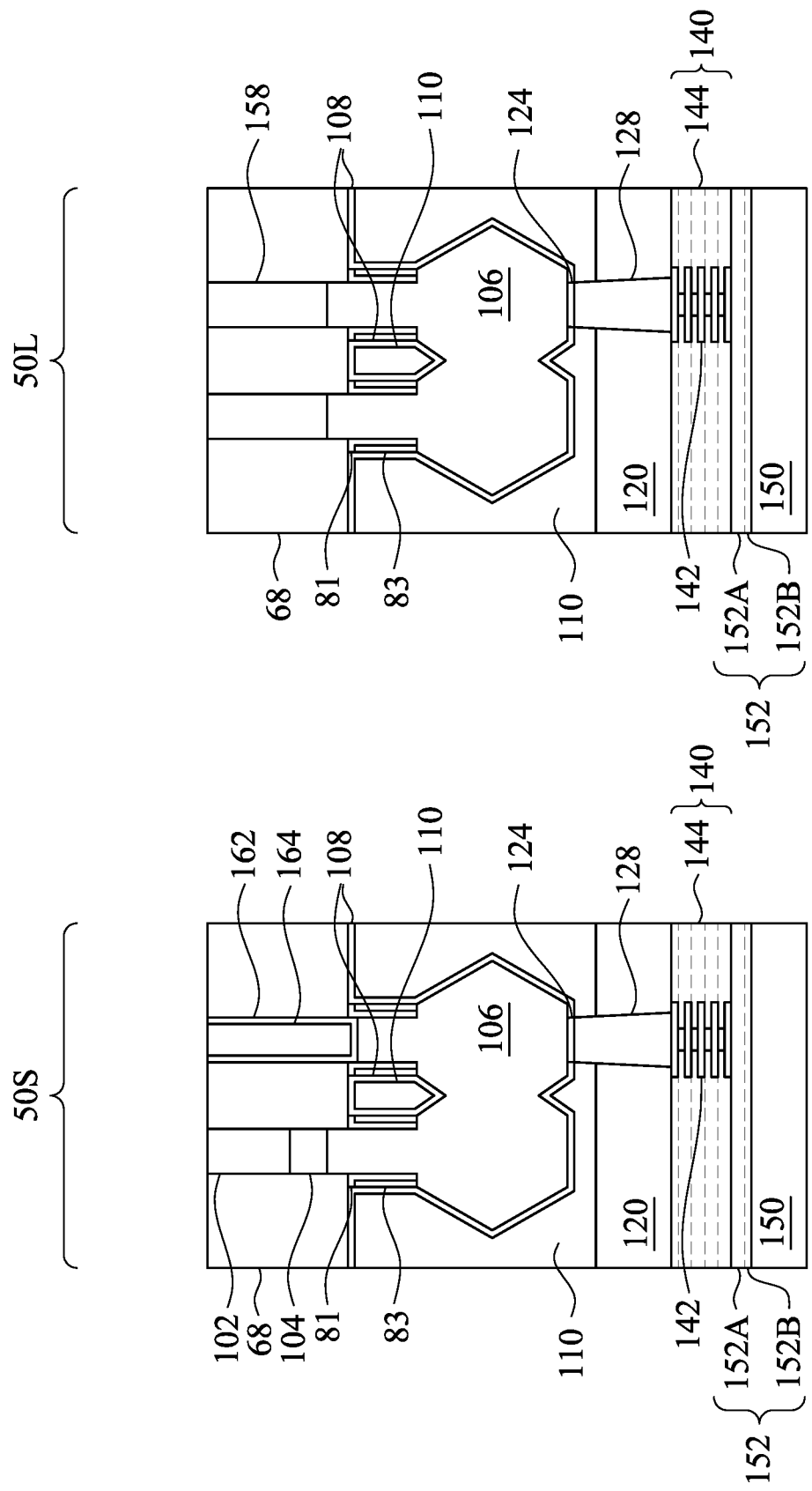

In FIGS. 32A through 32C, a fifth ILD 164 is filled in the seventh recesses 160. In some embodiments, the fifth ILD 164 is a flowable film formed by FCVD. In some embodiments, the fifth ILD 164 is formed of a dielectric material such as PSG, BSG, BPSG, USG, or the like, and may be deposited by any suitable method, such as CVD, PECVD, or the like. In some embodiments, the fifth ILD 164 may comprise silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), silicon (Si), zirconium nitride (ZrN), silicon carbonitride (SiCN), combinations or multiple layers thereof, or the like. In some embodiments, a second liner layer 162 is disposed between the fifth ILD 164 and the STI regions 68, the gate dielectric layers 114, the first epitaxial material 102, the second epitaxial material 104, and the epitaxial source/drain regions 106. The second liner layer 162 may include a dielectric material, such as, silicon nitride, silicon oxide, silicon oxynitride, or the like. In some embodiments, the second liner layer 162 may include a material having a different etch rate than the material of the overlying fifth ILD 164. A CMP process or the like may be used to remove material of the fifth ILD 164 and the second liner layer 162 such that top surfaces of the fifth ILD 164 and the second liner layer 162 are level with top surfaces of the STI regions 68, the first epitaxial material 102, and the fourth ILD 158. In some embodiments, a sum of a height of the substrate 50 and the fourth ILD 158 may be equal to a height of the fifth ILD 164.

Figure 33A:
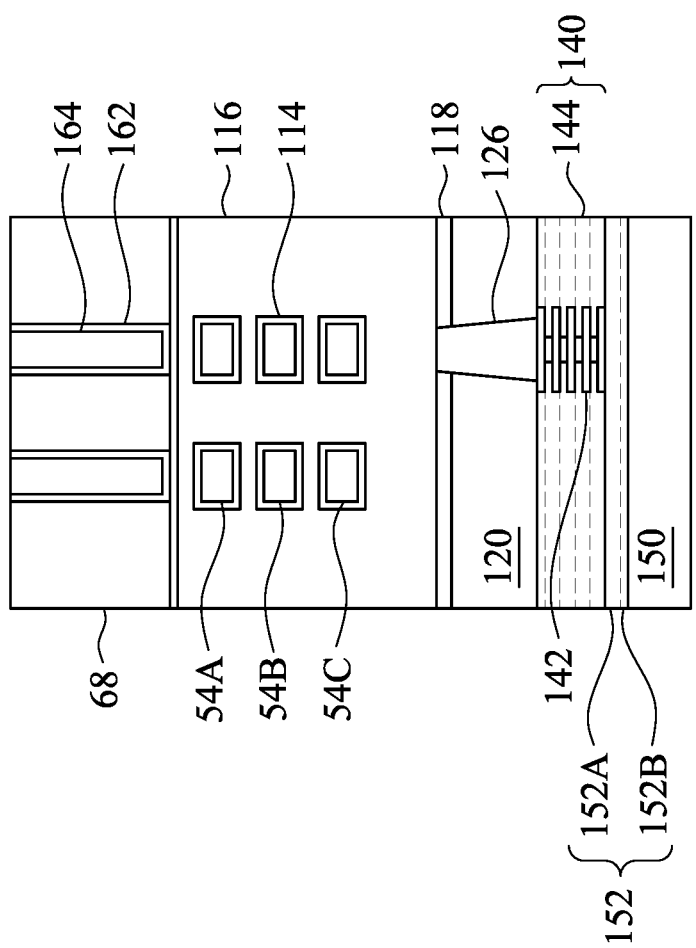
Figure 33B:
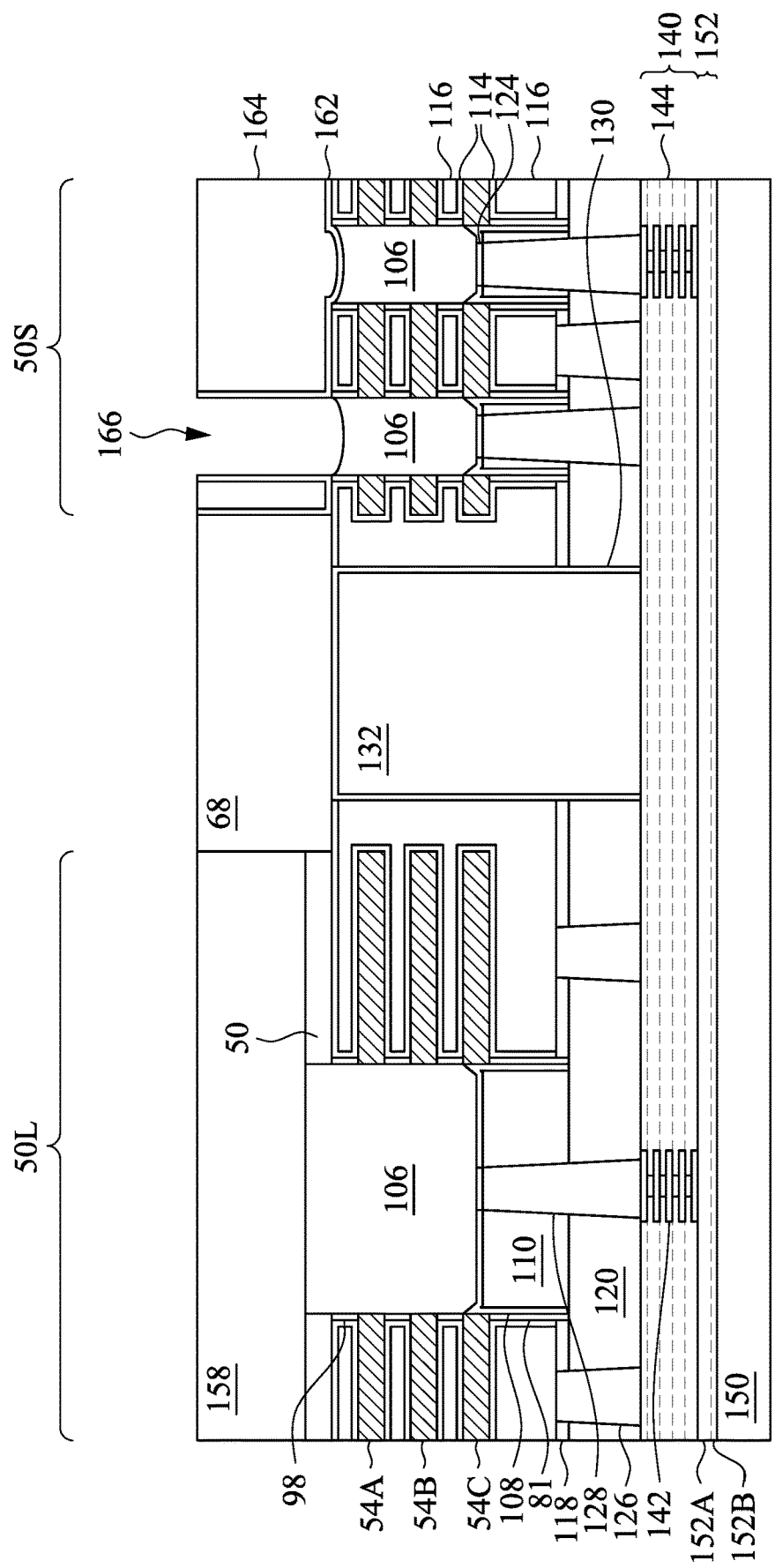
Figure 33C:
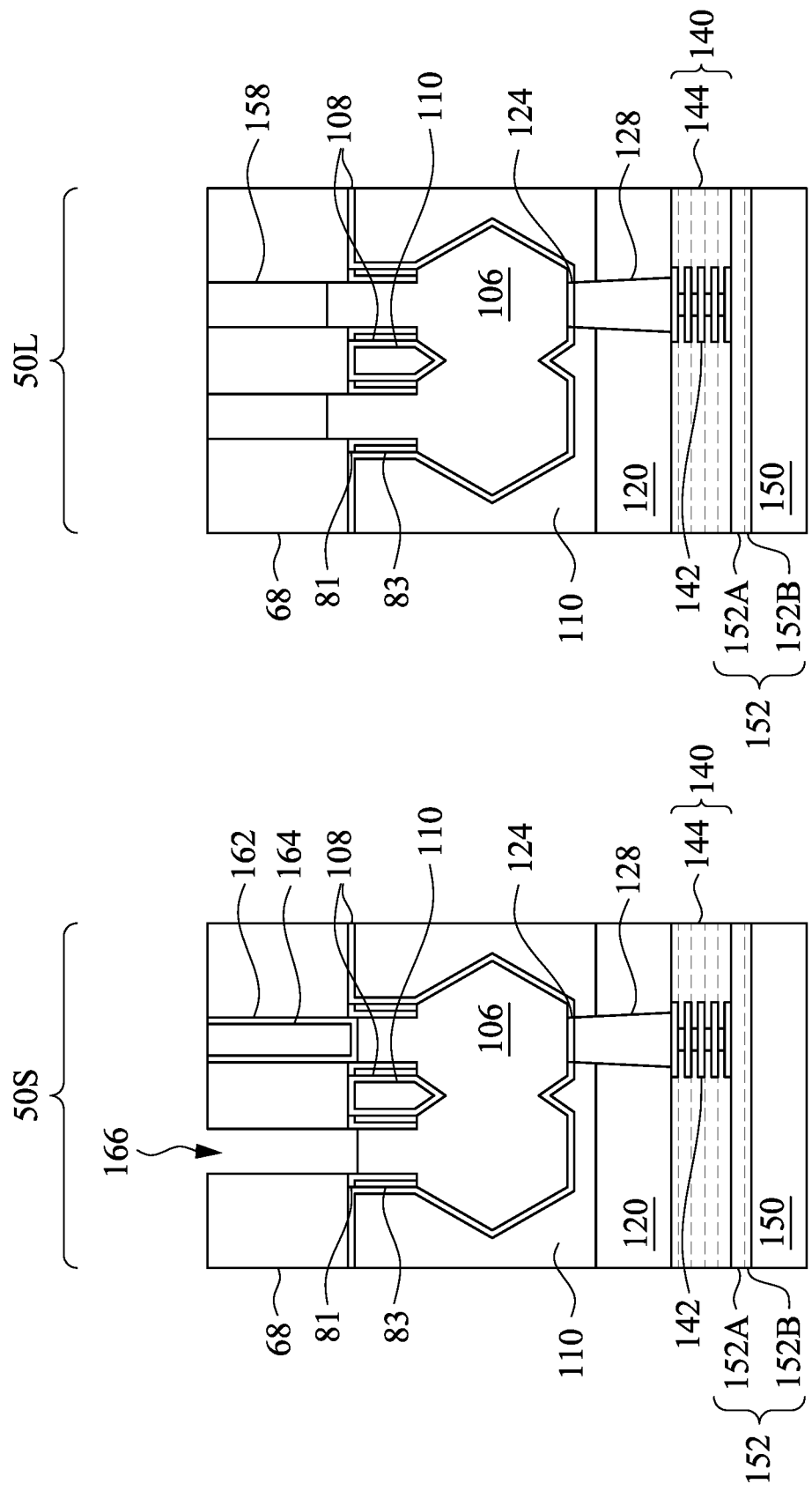

In FIGS. 33A through 33C, the first epitaxial material 102 and the second epitaxial material 104 in the short-channel regions 50S are etched to form eighth recesses 166 exposing the epitaxial source/drain regions 106. The first epitaxial material 102 and the second epitaxial material 104 may be etched by suitable etching processes, which may be isotropic etching processes, such as wet etching processes. The etching processes used to etch the first epitaxial material 102 and the second epitaxial material 104 may have a high etch selectivity to materials of the second liner layer 162, the fifth ILD 164, the STI regions 68, the fourth ILD 158, and the epitaxial source/drain regions 106. As such, the first epitaxial material 102 and the second epitaxial material 104 may be removed without significantly removing materials of the second liner layer 162, the fifth ILD 164, the STI regions 68, the fourth ILD 158, and the epitaxial source/drain regions 106. As illustrated in FIG. 33B, in some embodiments, the etching processes used to remove the first epitaxial material 102 and the second epitaxial material 104 may etch portions of the epitaxial source/drain regions 106 such that backside surfaces of the epitaxial source/drain regions 106 are concave and are disposed below backside surfaces of the gate structures.

Figure 34A:
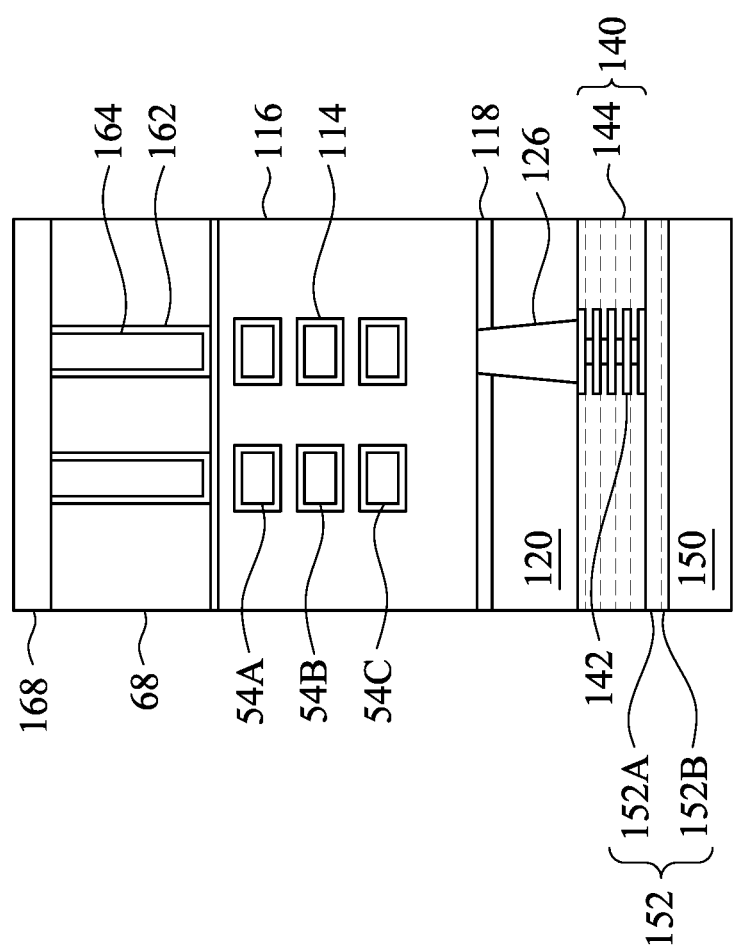
Figure 34B:
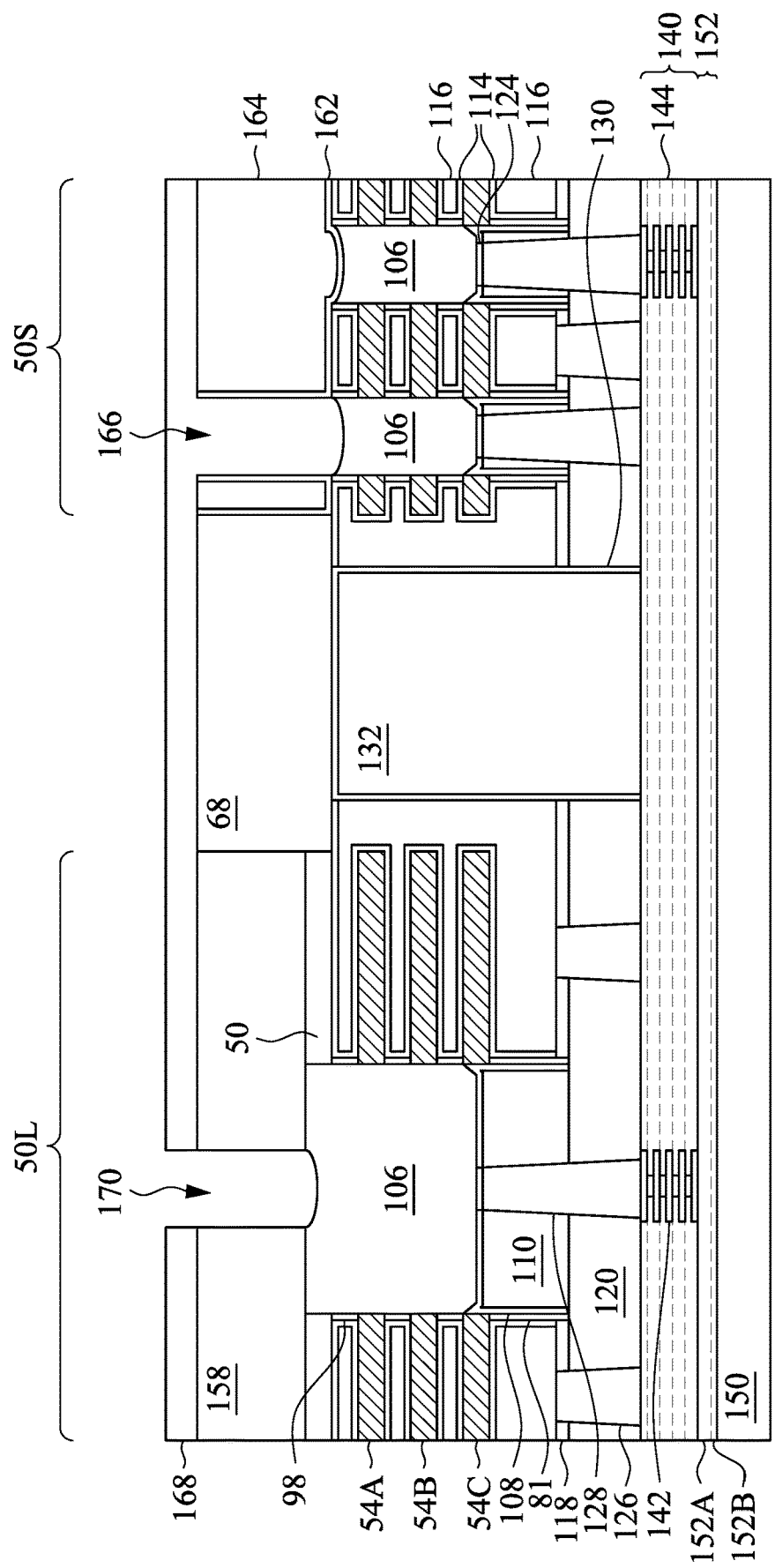
Figure 34C:
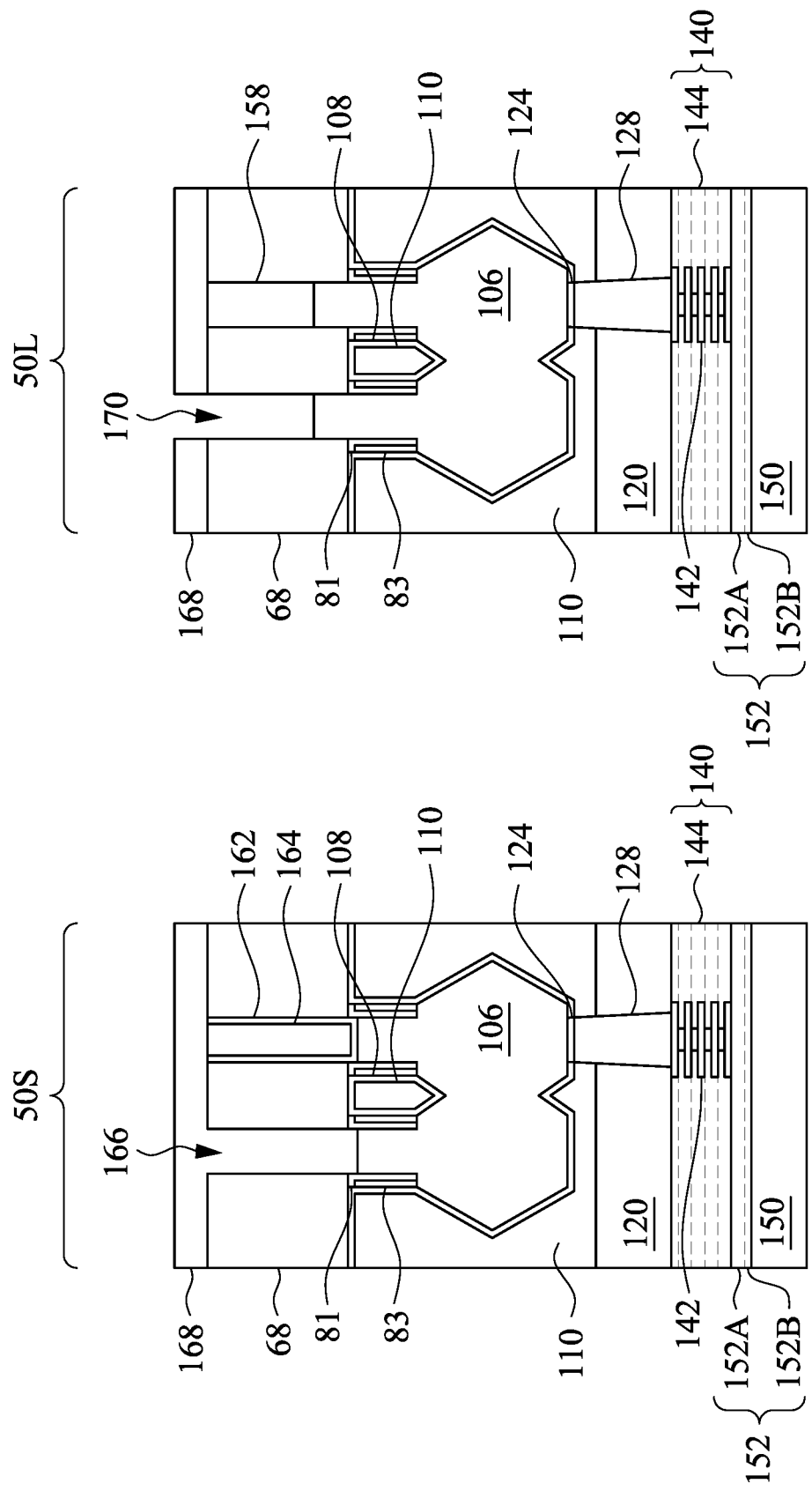

In FIGS. 34A through 34C, a sixth patterned mask 168 is formed over the structures illustrated in FIGS. 33A through 33C and the fourth ILD 158 in the long-channel regions 50L is etched to form ninth recesses 170 exposing the epitaxial source/drain regions 106. The sixth patterned mask 168 may be formed by depositing a photoresist layer using spin-on coating or the like. The photoresist layer may then be patterned by exposing the photoresist layer to a patterned energy source (e.g., a patterned light source) and developing the photoresist layer to remove an exposed or unexposed portion of the photoresist layer, thereby forming the sixth patterned mask 168.

Portions of the fourth ILD 158 exposed by the sixth patterned mask 168 are then etched by an etching process to form the ninth recesses 170 exposing the epitaxial source/drain regions 106 in the long-channel regions 50L. The fourth ILD 158 may be etched by a suitable etching process, such as an anisotropic etching process, which may include RIE, NBE, or the like. The ninth recesses 170 may extend through the fourth ILD 158 and at least partially into the epitaxial source/drain regions 106. For example, as illustrated in FIG. 34B, in some embodiments, the etching processes used to etch the fourth ILD 158 may etch portions of the epitaxial source/drain regions 106 such that backside surfaces of the epitaxial source/drain regions 106 are concave and are disposed below backside surfaces of the gate structures. The sixth patterned mask 168 may then be removed.

Figure 35A:
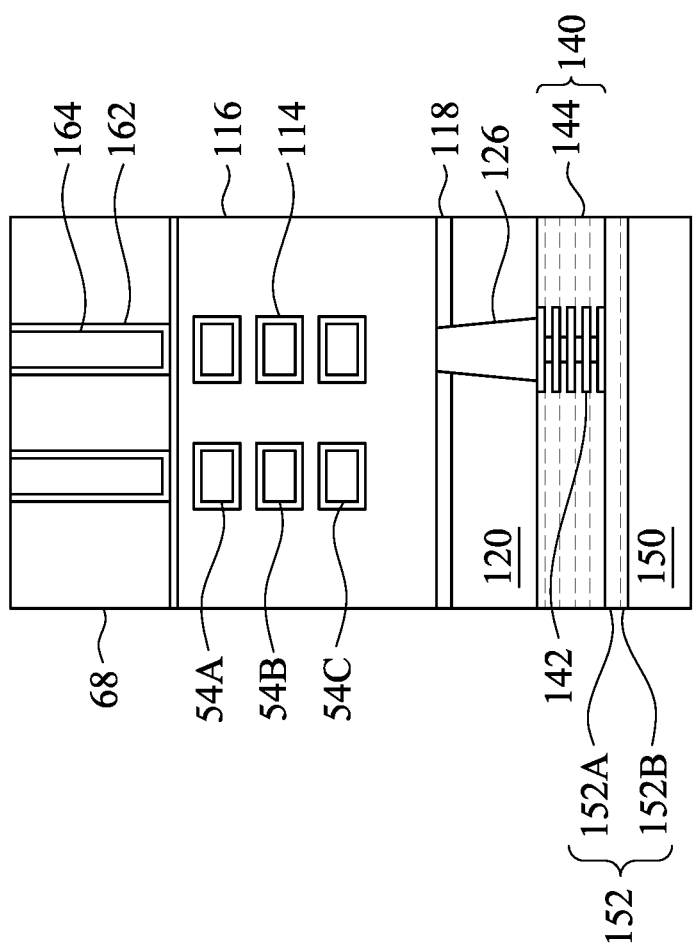
Figure 35B:
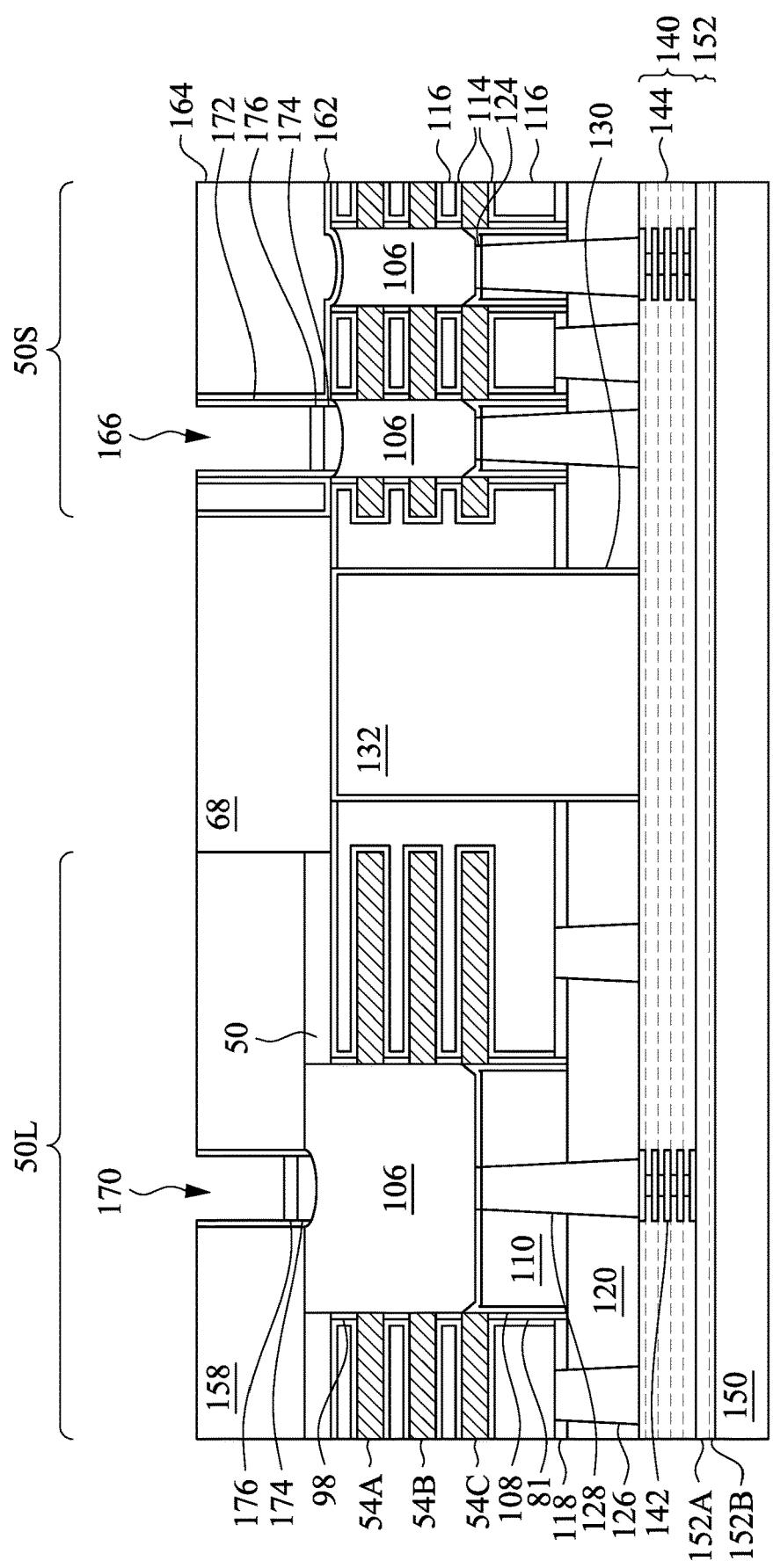
Figure 35C:
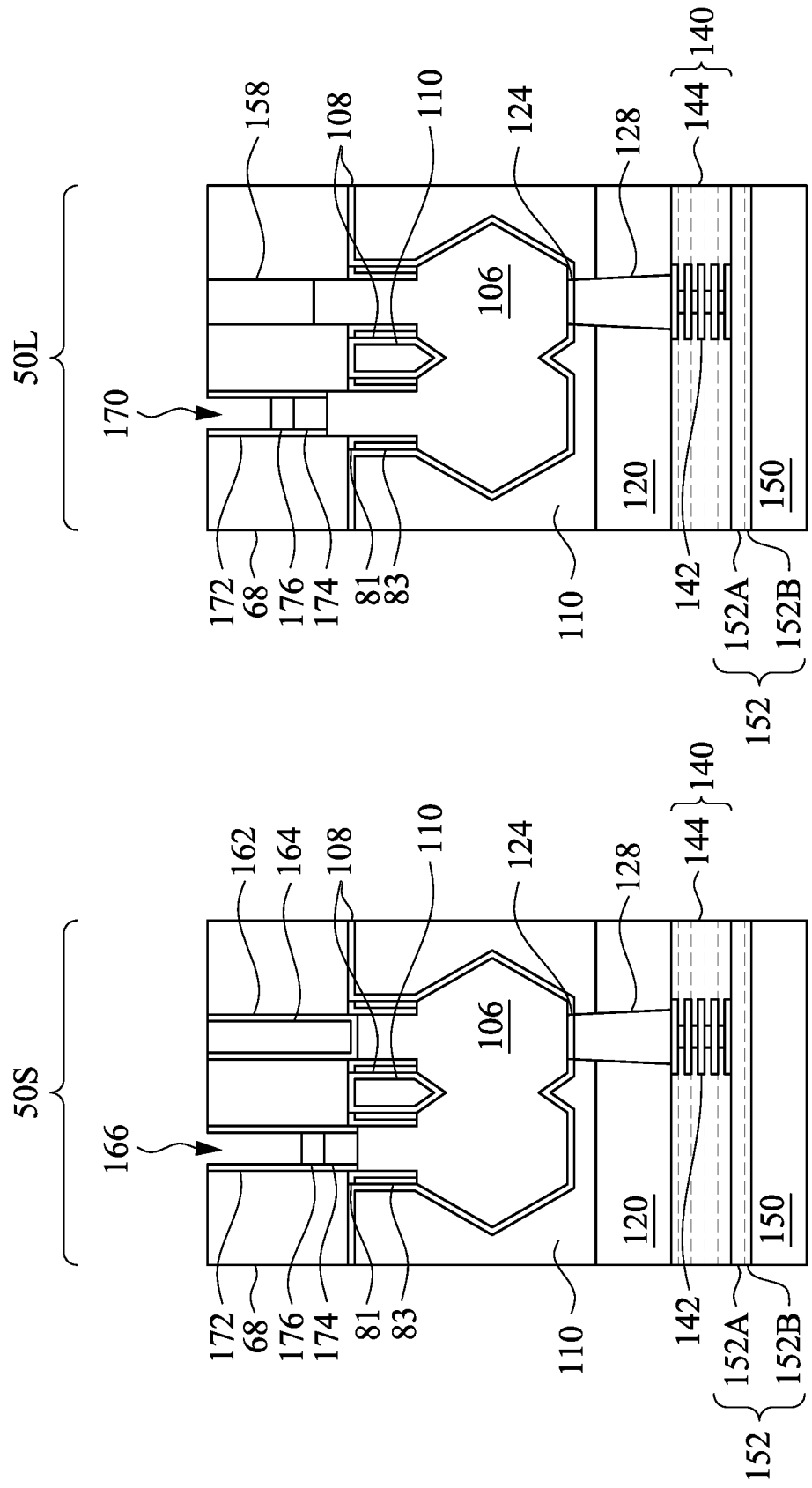

In FIGS. 35A through 35C, fourth spacers 172, backside epitaxial materials 174, and a sacrificial layer 176 are deposited in the eighth recesses 166 and the ninth recesses 170. The fourth spacers 172 are formed along sidewalls of the STI regions 68, the second liner layer 162, and the fourth ILD 158 in the eighth recesses 166 and the ninth recesses 170. The fourth spacers 172 may be formed by depositing a fourth spacer layer (not separately illustrated) over the structures illustrated in FIG. 34A through 34C. The fourth spacer layer may be deposited by CVD, ALD, or the like. The fourth spacer layer may be formed of silicon nitride (SiN), silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), silicon (Si), zirconium nitride (ZrN), silicon carbonitride (SiCN), combinations or multiple layers thereof, or the like. The fourth spacer layer may be deposited to a thickness ranging from about 1 nm to about 5 nm.

The fourth spacer layer is then etched to form the fourth spacers 172. The fourth spacer layer may be etched using suitable etching processes, such as isotropic etching processes (e.g., wet etching processes), anisotropic etching processes (e.g., dry etching processes), multiple processes or combinations thereof, or the like.

The backside epitaxial materials 174 are then formed in the eighth recesses 166 and the ninth recesses 170. The backside epitaxial materials 174 may be epitaxially grown in the eighth recesses 166 and the ninth recesses 170 using a process such as CVD, ALD, VPE, MBE, or the like. The backside epitaxial materials 174 may include any acceptable material, such as silicon, silicon germanium, germanium, boron-doped silicon germanium, or the like. The backside epitaxial materials 174 may be deposited to a thickness from about 5 nm to about 10 nm. Including the backside epitaxial materials 174 may improve the performance of devices including backside vias.

The sacrificial layer 176 is then formed over the backside epitaxial materials 174. The sacrificial layer 176 may be formed of a bottom anti-reflective coating (BARC) material. In some embodiments, sacrificial layer 176 may be formed of, for example, a dielectric, an organic material, or the like, and may be formed by, for example, spin coating, PECVD, CVD, or the like. The sacrificial layer 176 may be formed to a thickness ranging from about 5 nm to about 10 nm. The sacrificial layer 176 may be used in a subsequent process for widening the eighth recesses 166 and the ninth recesses 170, described below with respect to FIG. 36A through 36C, and may be deposited to a desired thickness in order to control the shape of the eighth recesses 166 and the ninth recesses 170 following the widening process.

Figure 36A:
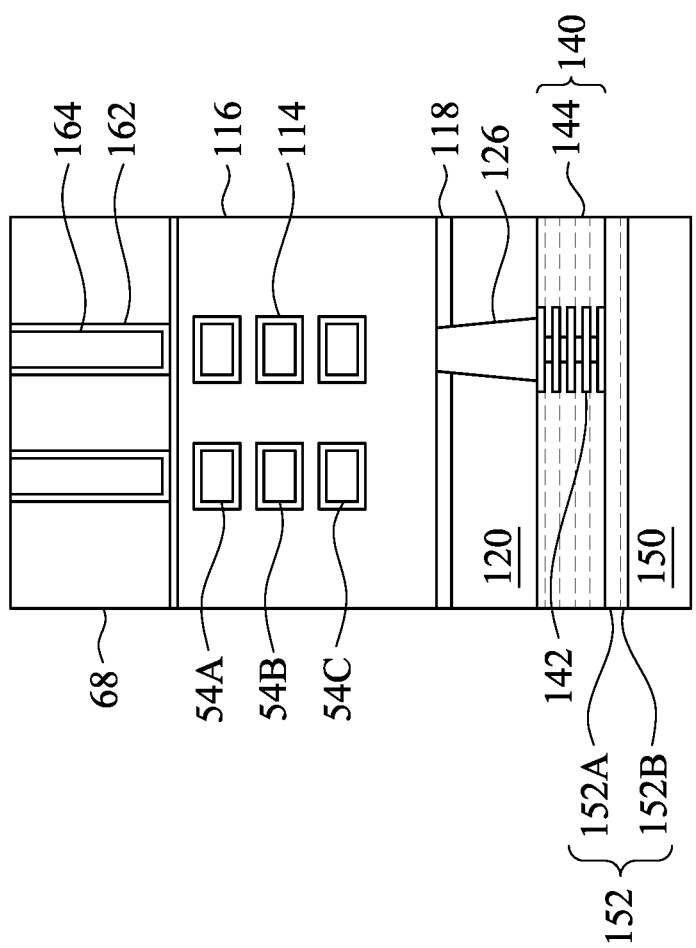
Figure 36B:
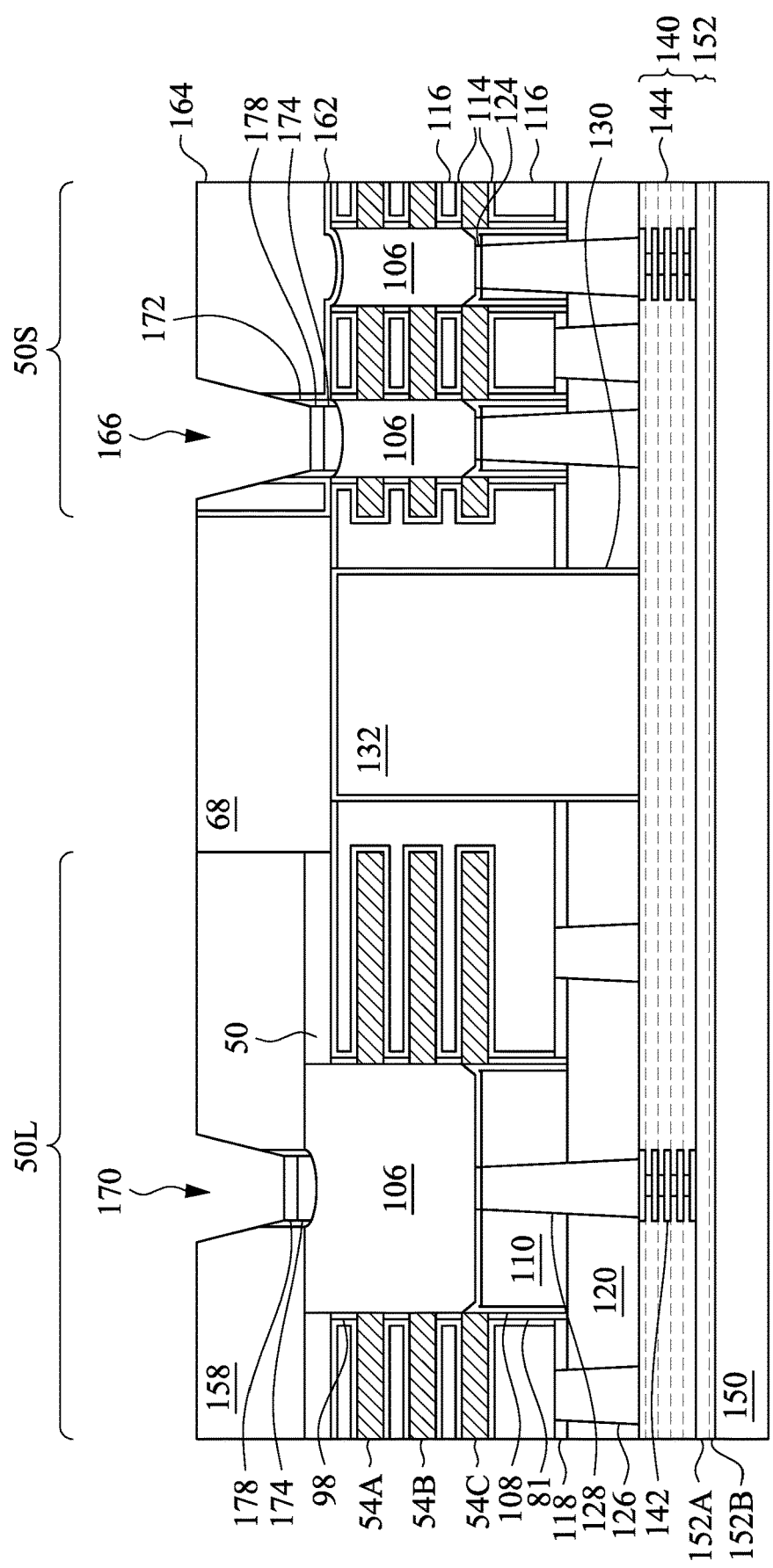
Figure 36C:
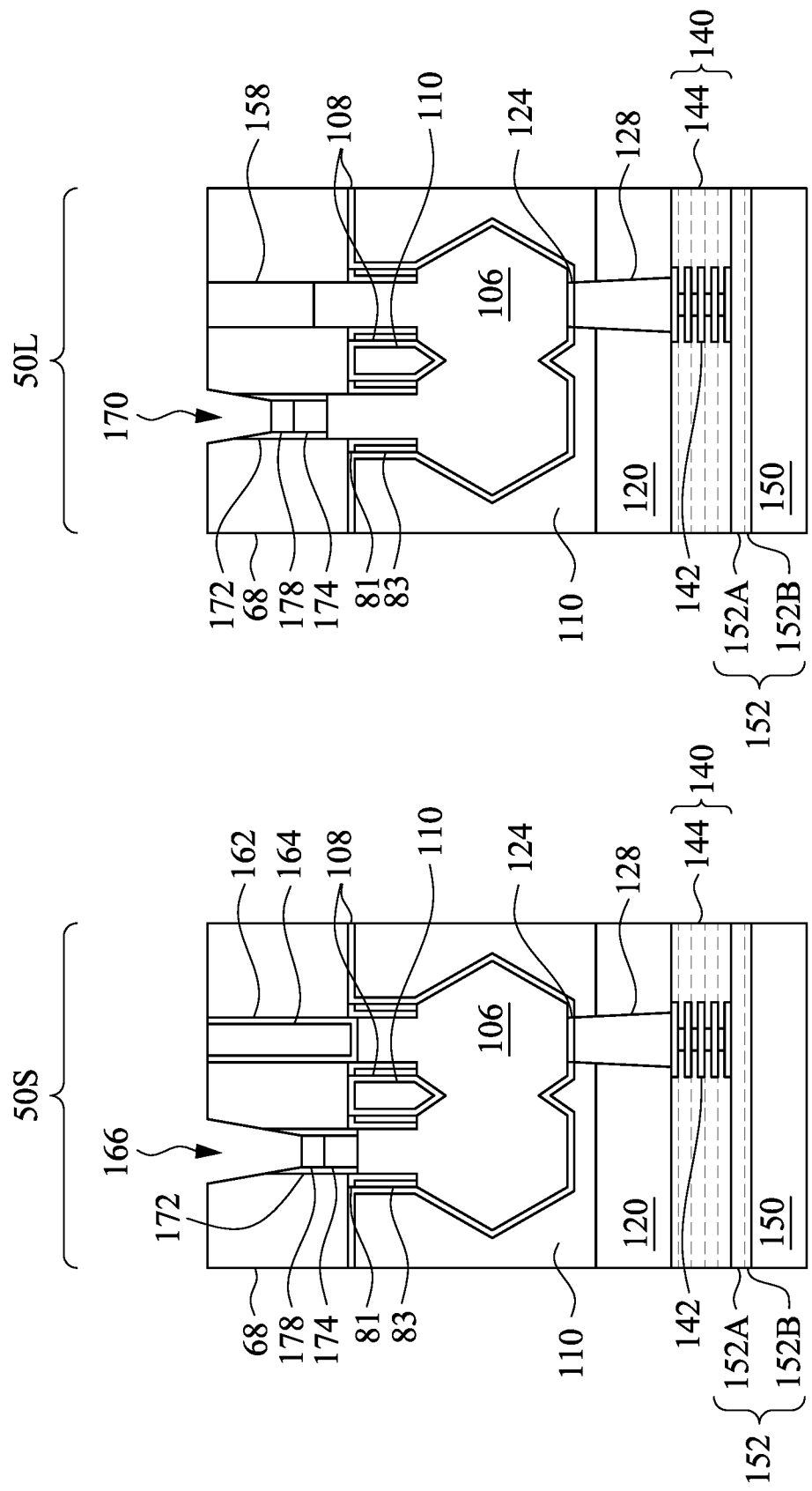

In FIGS. 36A through 36C, the eighth recesses 166 and the ninth recesses 170 are widened, the sacrificial layer 176 is removed, and second silicide regions 178 are formed over the backside epitaxial materials 174. The eighth recesses 166 and the ninth recesses 170 may be widened by a suitable etching process, such as an isotropic etching process, which may be a wet etching processes. The etching process may etch the STI regions 68, the fourth spacers 172, the fourth ILD 158, the fifth ILD 164, and the second liner layer 162. As illustrated in FIGS. 36B and 36C, following the etching process, the eighth recesses 166 and the ninth recesses 170 may have tapered profiles, which become narrower toward the front side of the device. A ratio of a maximum width of the eighth recesses 166 to a minimum width of the eighth recesses 166 may be from about 1.5 to about 1 and a ratio of a maximum width of the ninth recesses 170 to a minimum width of the eighth recesses 166 may be from about 1.5 to about 1. Widening the eighth recesses 166 and the ninth recesses 170 may reduce contact resistance of backside vias subsequently formed in the eighth recesses 166 and the ninth recesses 170 and reduce the likelihood of contacts to the backside vias from being misaligned. The sacrificial layer 176 may then be removed using an ashing process or the like.

The second silicide regions 178 are then formed over the backside epitaxial materials 174 in the eighth recesses 166 and the ninth recesses 170. In some embodiments, the second silicide regions 178 are formed by first depositing a metal (not separately illustrated) capable of reacting with the semiconductor materials of the underlying backside epitaxial materials 174 (e.g., silicon, silicon germanium, germanium, or the like) to form silicide or germanide regions. The metal may include as nickel, cobalt, titanium, tantalum, platinum, tungsten, other noble metals, other refractory metals, rare earth metals or their alloys. The metal may be deposited over the exposed portions of the backside epitaxial materials 174. A thermal anneal process may then be performed to form the second silicide regions 178. The unreacted portions of the deposited metal are then removed, e.g., by an etching process. Although the second silicide regions 178 are referred to as silicide regions, the second silicide regions 178 may be germanide regions or silicon germanide regions (e.g., regions including silicide, germanide, or combinations thereof). The second silicide regions 178 may have a thickness from about 1 nm to about 10 nm. In some embodiments, the second silicide regions 178 in the n-type regions 50N may include titanium silicide (TiSi), chromium silicide (CrSi), tantalum silicide (TaSi), molybdenum silicide (MoSi), zirconium silicide (ZrSi), hafnium silicide (HfSi), scandium silicide (ScSi), yttrium silicide (YSi), holmium silicide (HoSi), terbium silicide (TbSi), silicide gadolinium (GdSi), lutetium silicide (LuSi), dysprosium silicide (DySi), erbium silicide (ErSi), ytterbium silicide (YbSi), combinations thereof, or the like. In some embodiments, the second silicide regions 178 in the p-type regions 50P may include nickel silicide (NiSi), cobalt silicide (CoSi), manganese silicide (MnSi), tungsten silicide (WSi), iron silicide (FeSi), rhodium silicide (RhSi), palladium silicide (PdSi), ruthenium silicide (RuSi), platinum silicide (PtSi), iridium silicide (IrSi), osmium silicide (OsSi), combinations thereof, or the like.

In FIGS. 37A through 37F, backside vias 180 are formed in the eighth recesses 166 and the ninth recesses 170. The backside vias 180 may include one or more layers, such as barrier layers, diffusion layers, and fill materials. The backside vias may be electrically coupled to the epitaxial source/drain regions 106 through the second silicide regions 178 and the backside epitaxial materials 174. The backside vias 180 may include tungsten (W), ruthenium (Ru), cobalt (Co), copper (Cu), titanium (Ti), titanium nitride (TiN), tantalum (Ta), tantalum nitride (TaN), molybdenum (Mo), nickel (Ni), combinations thereof, or the like. A planarization process, such as a CMP, may be performed to remove excess material from surfaces of the STI regions 68, the fourth ILD 158, the fifth ILD 164, and the second liner layer 162.

Figure 37A:
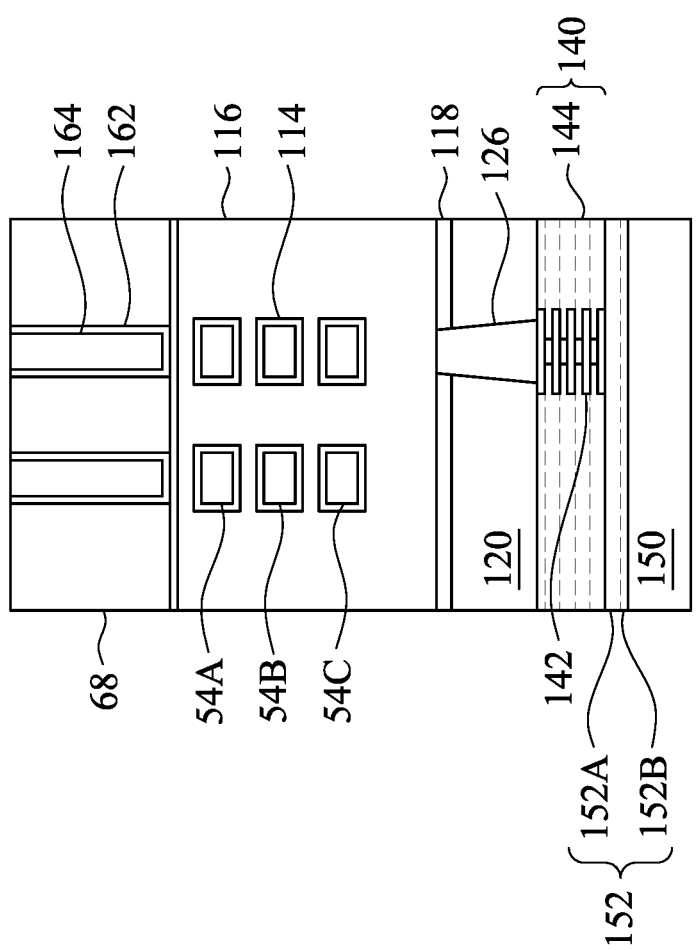
Figure 37B:
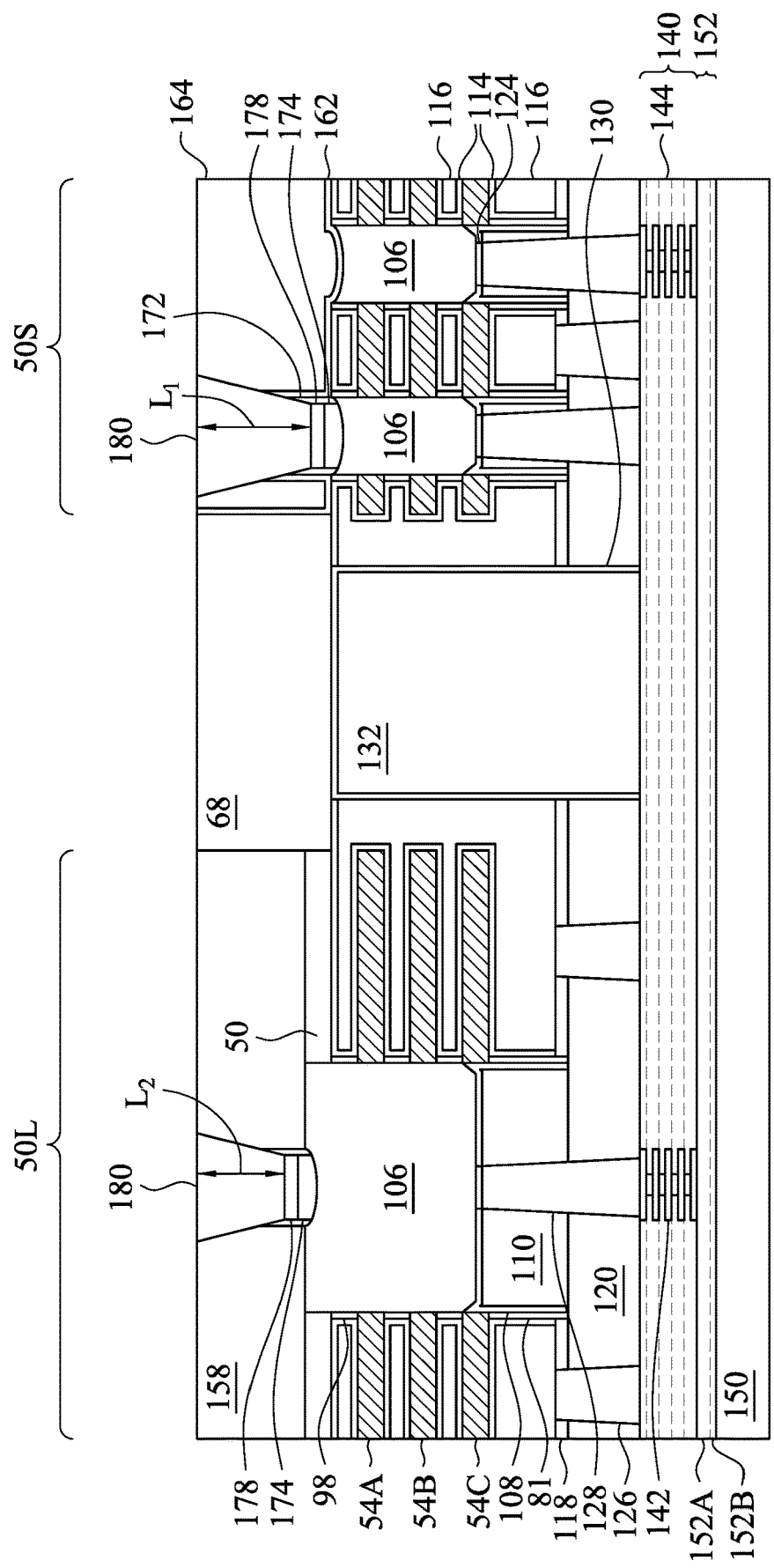
Figure 37C:
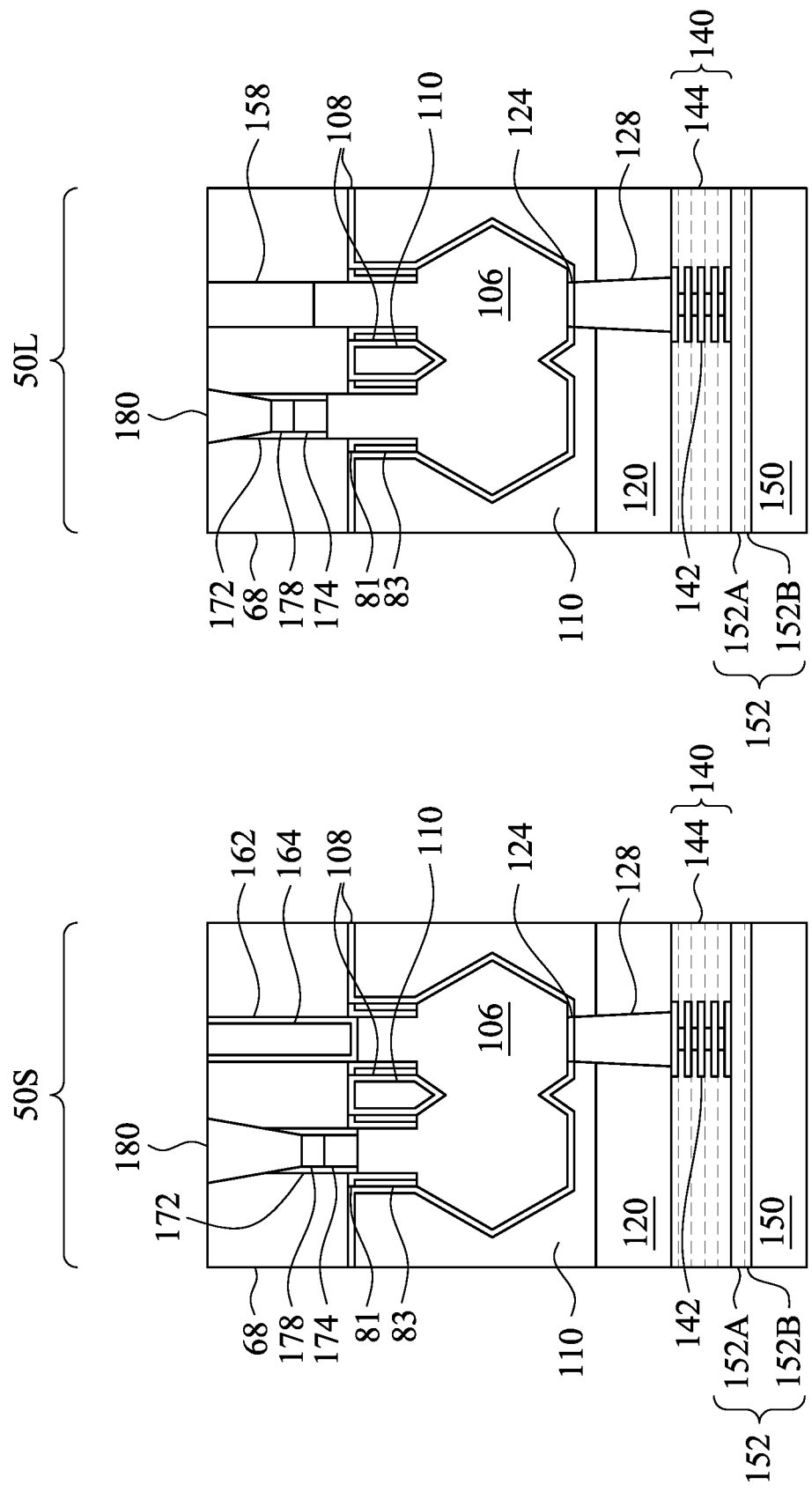

As illustrated in FIGS. 37B and 37C, the backside vias 180 in the short-channel regions 50S may have lengths greater than the backside vias 180 in the long-channel regions 50L. For example, the backside vias 180 in the short-channel regions 50S may have lengths $L_1$ from about 25 nm to about 45 nm, the backside vias 180 in the long-channel regions 50L may have lengths $L_2$ from about 15 nm to about 35 nm, and a ratio of the lengths $L_1$ to the lengths $L_2$ may be from about 1 to about 1.7. Differences between the lengths $L_1$ and the lengths $L_2$ may be equal to the thickness of the substrate 50 remaining over the gate dielectric layers 114 in the long-channel regions 50L.

Conventional devices may not include backside vias in long-channel regions. Including the backside vias 180 in the long-channel regions 50L may reduce depth loading between the short-channel regions 50S and the long-channel regions 50L, which allows for shorter backside vias 180 to be provided in the short-channel regions 50S, which improves short-channel device performance. Providing the backside vias 180 in the long-channel regions 50L further allows for a greater number of devices to be provided in the long-channel regions 50L and improves long-channel device performance.

Figure 37D:
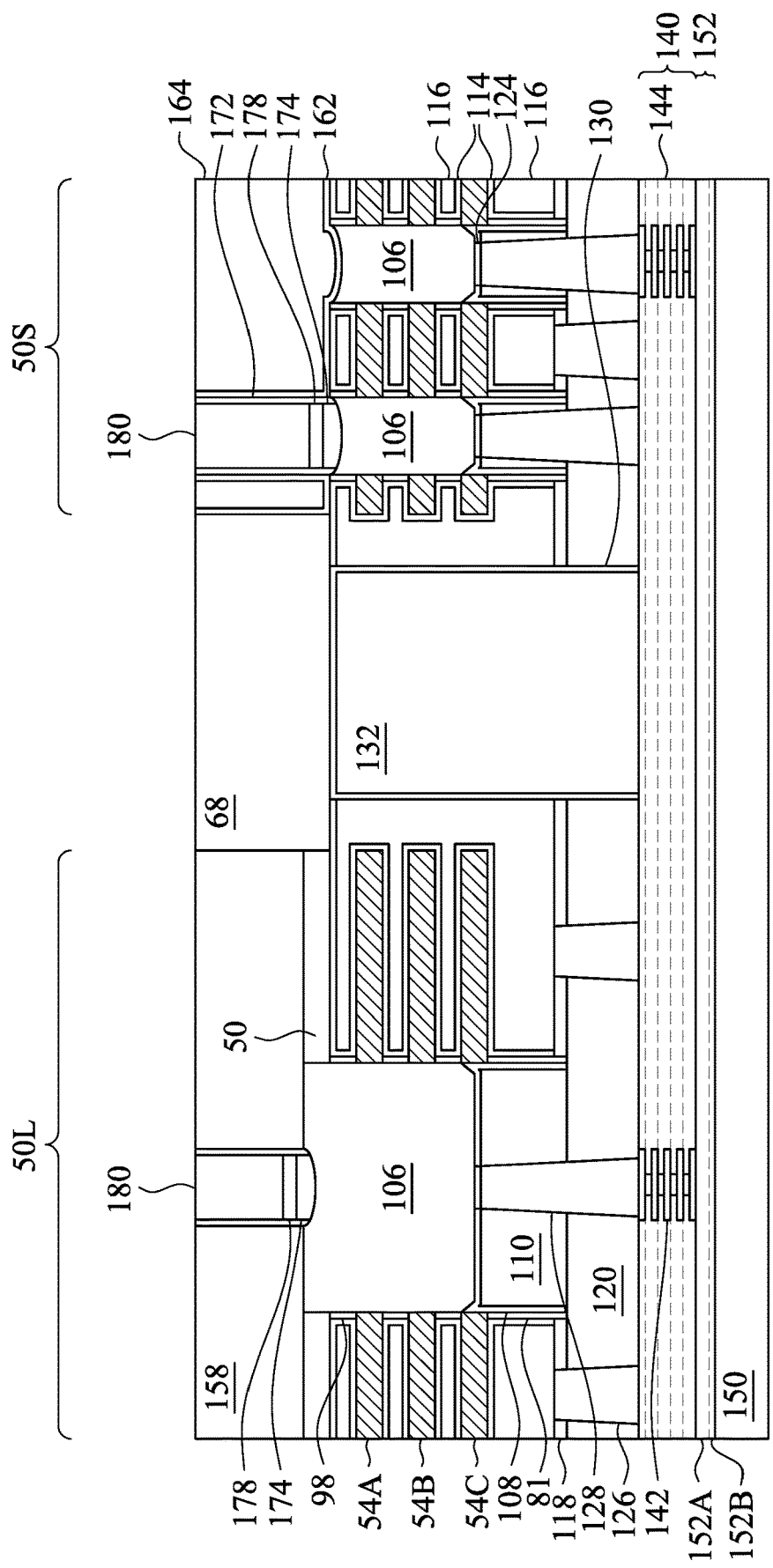
Figure 37E:
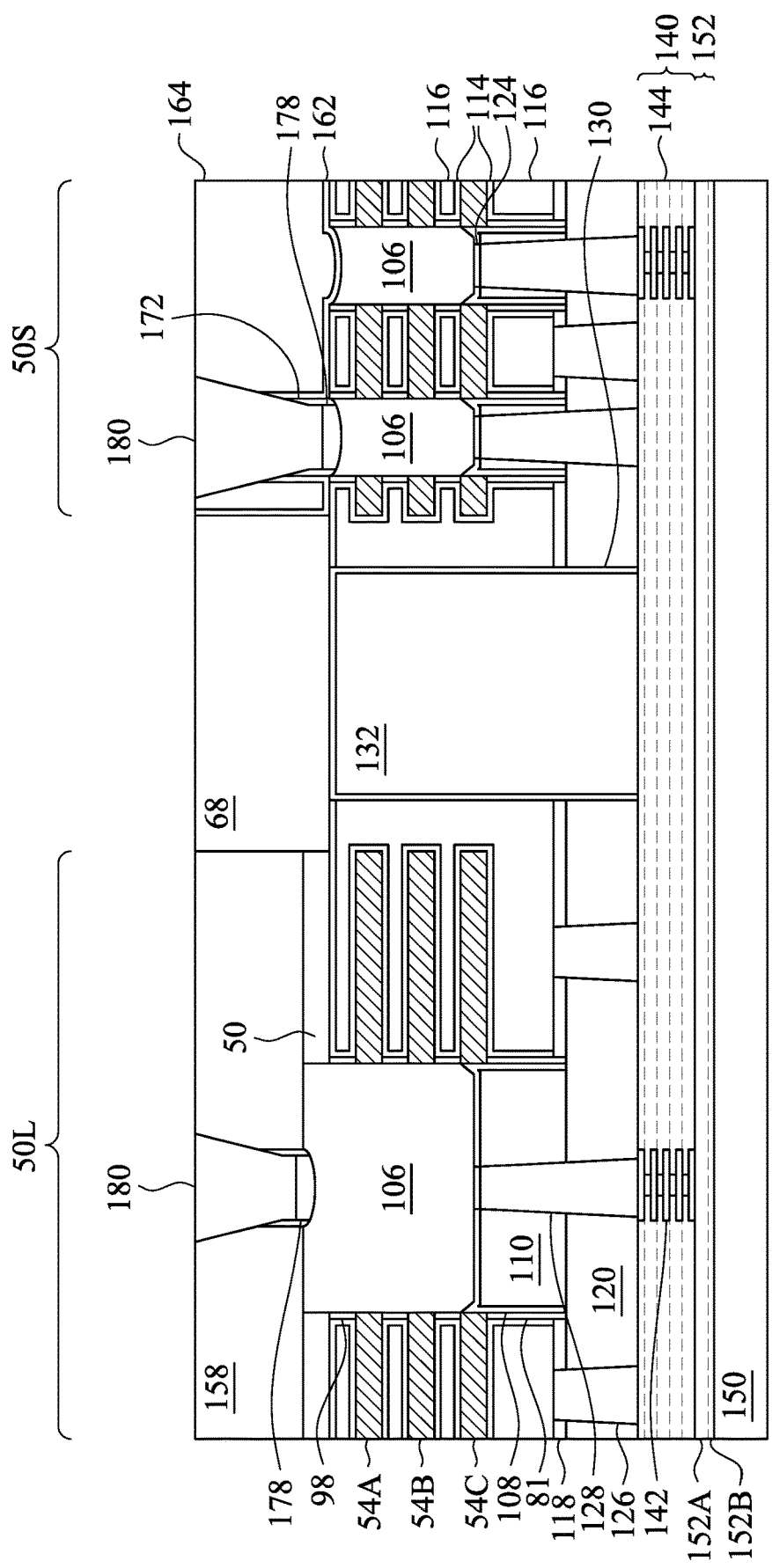
Figure 37F:
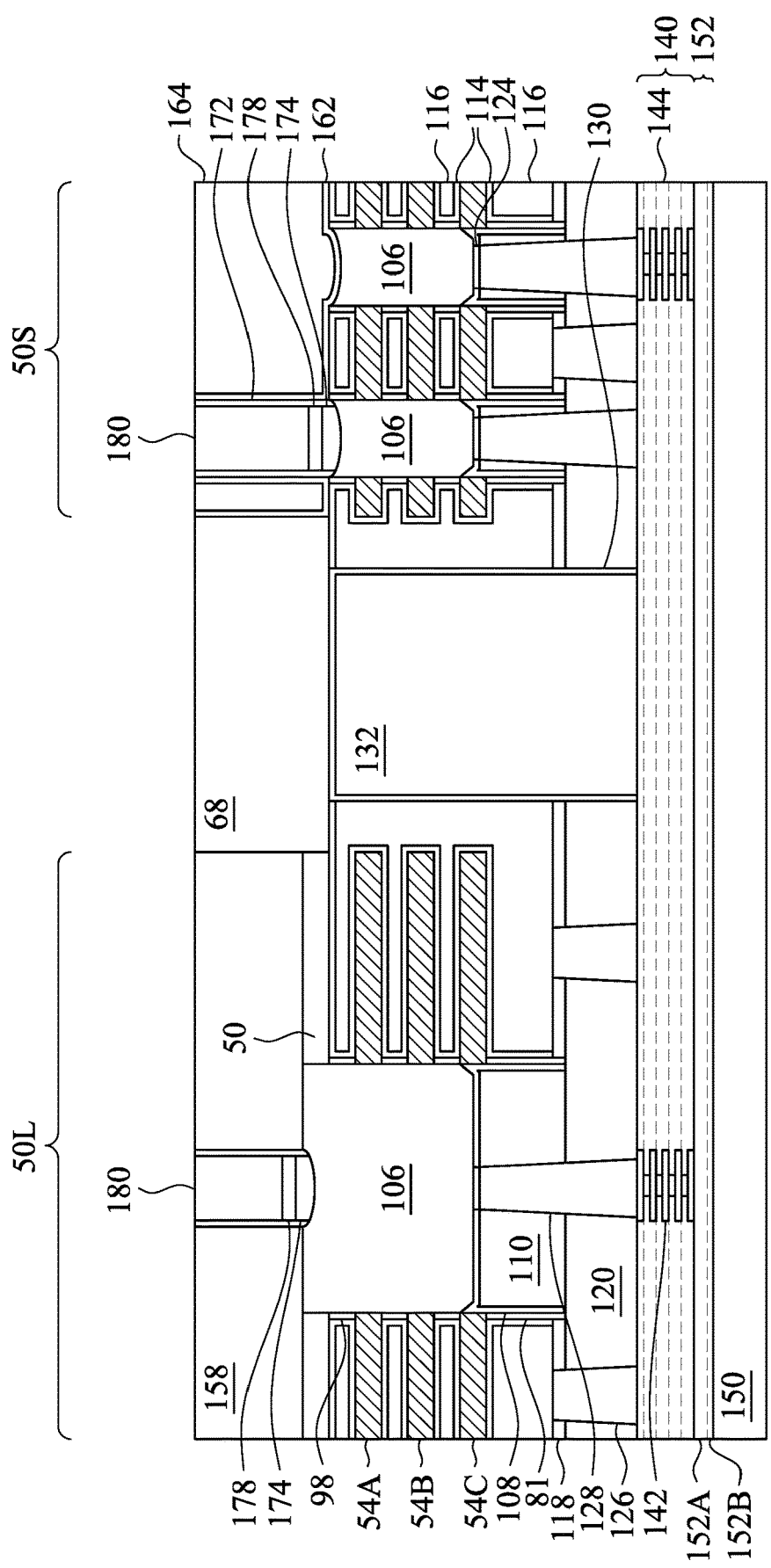

FIGS. 37D through 37F illustrate the backside vias 180 according to various embodiments. In the embodiment illustrated in FIG. 37D, the processes described above with respect to FIGS. 36A through 36C are not performed to widen the eighth recesses 166 and the ninth recesses 170. Thus, the backside vias 180 have vertical sidewalls. Forming the backside vias 180 without widening the eighth recesses 166 and the ninth recesses 170 reduces the number of steps required to form the backside vias 180, reduces costs, and increases throughput.

In the embodiment illustrated in FIG. 37E, the processes described above with respect to FIGS. 35A through 35C are not performed to form the backside epitaxial materials 174. Thus, the second silicide regions 178 are formed in contact with the epitaxial source/drain regions 106. Forming the backside vias 180 without the backside epitaxial materials 174 reduces the number of steps required to form the backside vias 180, reduces costs, and increases throughput.

In the embodiment illustrated in FIG. 37F, the processes described above with respect to FIGS. 28A through 28C to etch the substrate 50 and the epitaxial source/drain regions 106 continue to etch the substrate 50 and the epitaxial source/drain regions 106 until the gate dielectric layers 114 are exposed. Subsequent processes may be the same as or similar to those described above. This results in the backside vias 180 in the long-channel regions 50L and the short-channel regions 50S having the same lengths. Moreover, as the thickness of the substrate 50 is reduced or the substrate 50 is removed, gate leakage and capacitance may be reduced, improving device performance.

Figure 38A:
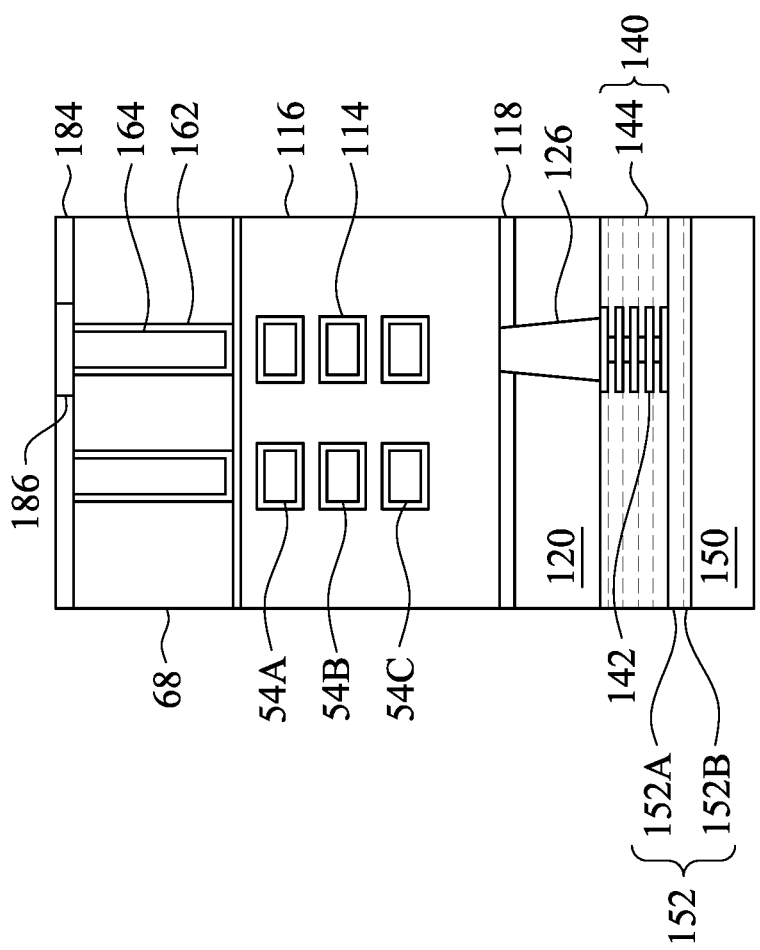
Figure 38B:
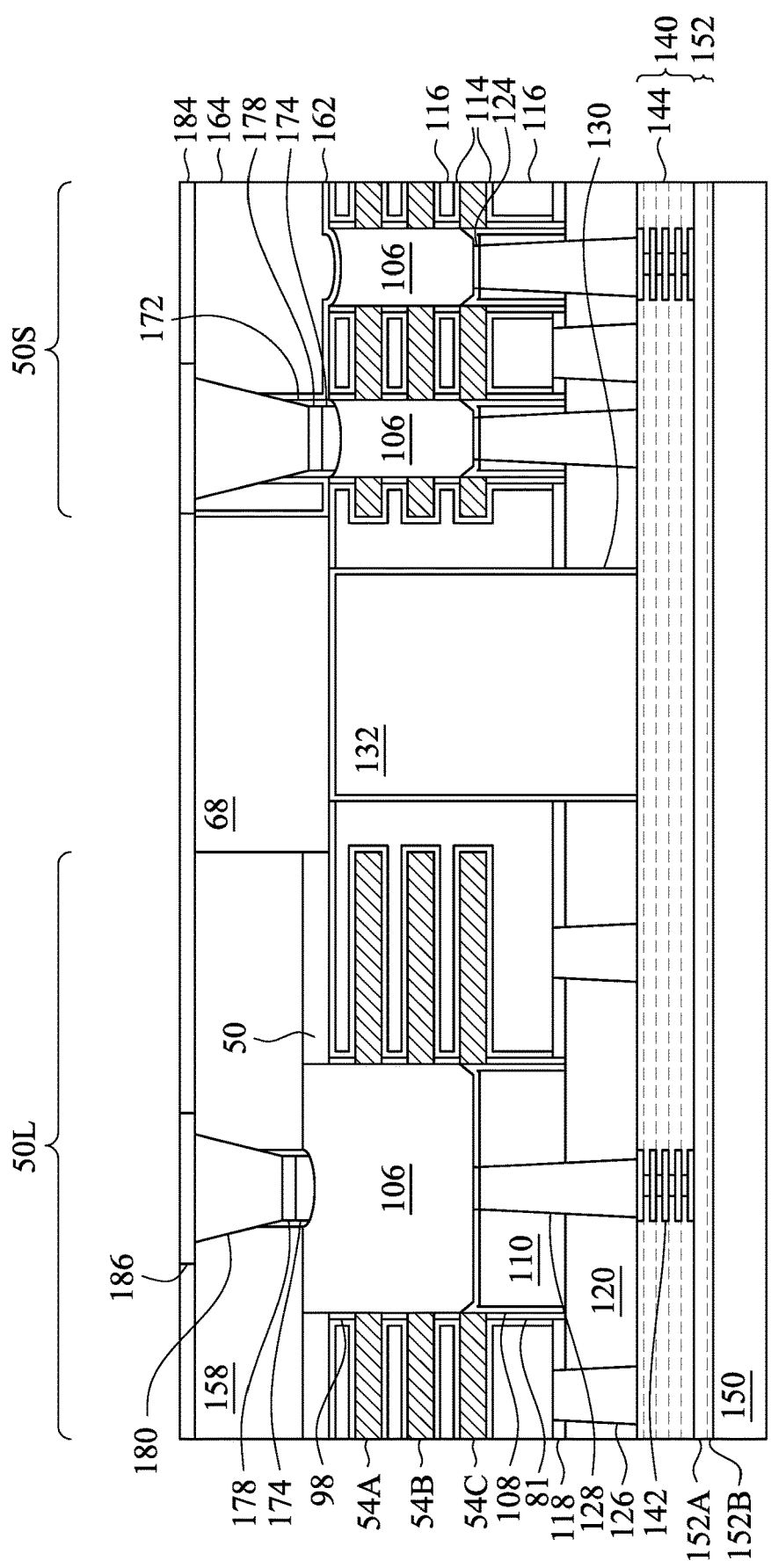
Figure 38C:
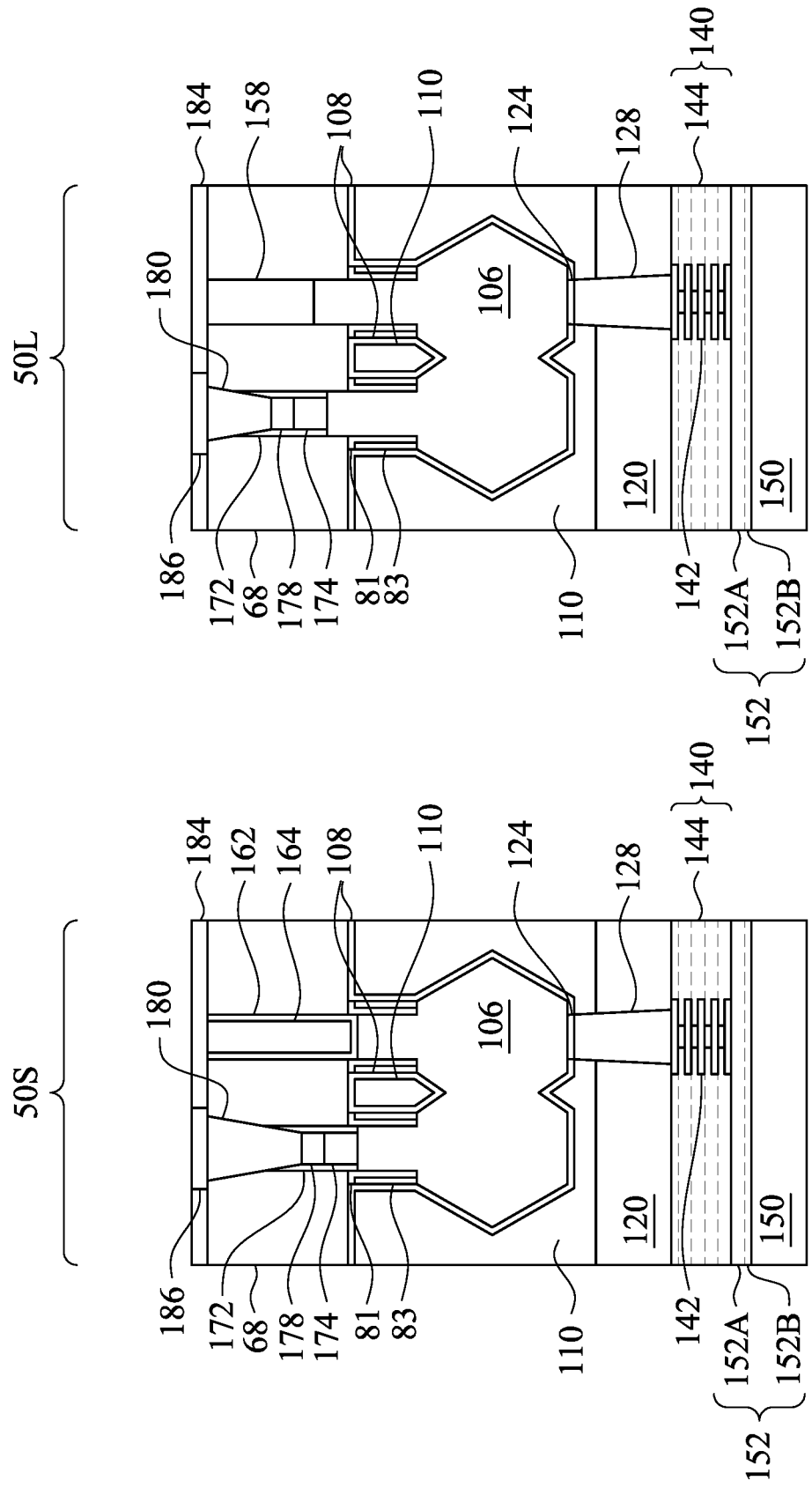

In FIGS. 38A through 38C, conductive lines 186 and a second dielectric layer 184 are formed over the STI regions 68, the fourth ILD 158, the fifth ILD 164, the second liner layer 162, and the backside vias 180. The second dielectric layer 184 may be similar to the second ILD 120. For example, the second dielectric layer 184 may be formed of a like material and using a like process as the second ILD 120.

The conductive lines 186 are formed in the second dielectric layer 184. The conductive lines 186 may be referred to as a power rail. Forming the conductive lines 186 may include patterning recesses in the second dielectric layer 184 using a combination of photolithography and etching processes, for example. A pattern of the recesses in the second dielectric layer 184 may correspond to a pattern of the conductive lines 186. The conductive lines 186 are then formed by depositing a conductive material in the recesses. In some embodiments, the conductive lines 186 may include a power rail which includes a metal layer, which may be a single layer or a composite layer comprising a plurality of sub-layers formed of different materials. In some embodiments, the conductive lines 186 include copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer includes titanium, titanium nitride, titanium oxide, tantalum, tantalum nitride, titanium oxide, or the like. The conductive lines 186 may be formed using, for example, CVD, ALD, PVD, plating or the like. The conductive lines 186 are physically and electrically coupled to the epitaxial source/drain regions 106 through the backside vias 180. A planarization process (e.g., a CMP, a grinding, an etch-back, or the like) may be performed to remove excess portions of the conductive lines 186 formed over the second dielectric layer 184.

In some embodiments, the conductive lines 186 are power rails, which are conductive lines that electrically connect the epitaxial source/drain regions 106 to a reference voltage, supply voltage, or the like. By placing power rails on a backside of the resulting semiconductor die rather than in a front side of the semiconductor die, advantages may be achieved. For example, a gate density of the nano-FETs and/or interconnect density of the front-side interconnect structure 140 may be increased. Further, the backside of the semiconductor die may accommodate wider power rails, reducing resistance and increasing efficiency of power delivery to the nano-FETs. For example, a width of the conductive lines 186 may be at least twice a width of a first level conductive line (e.g., a conductive feature 142, illustrated in FIGS. 38A through 38C) of the front-side interconnect structure 140.

Figure 39A:
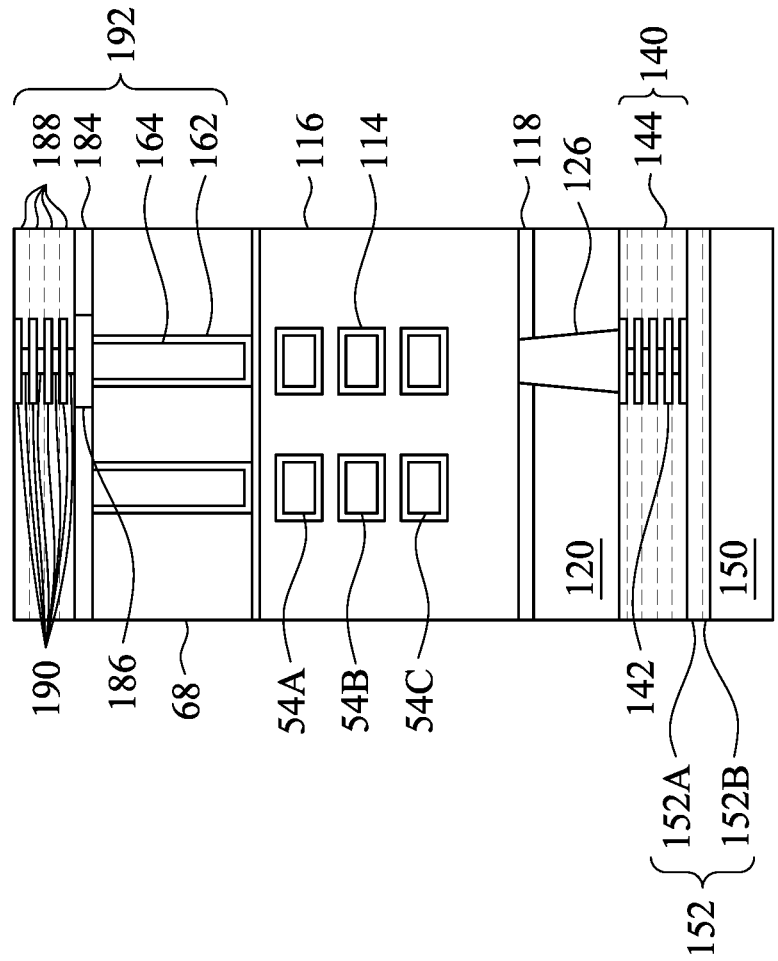
Figure 39B:
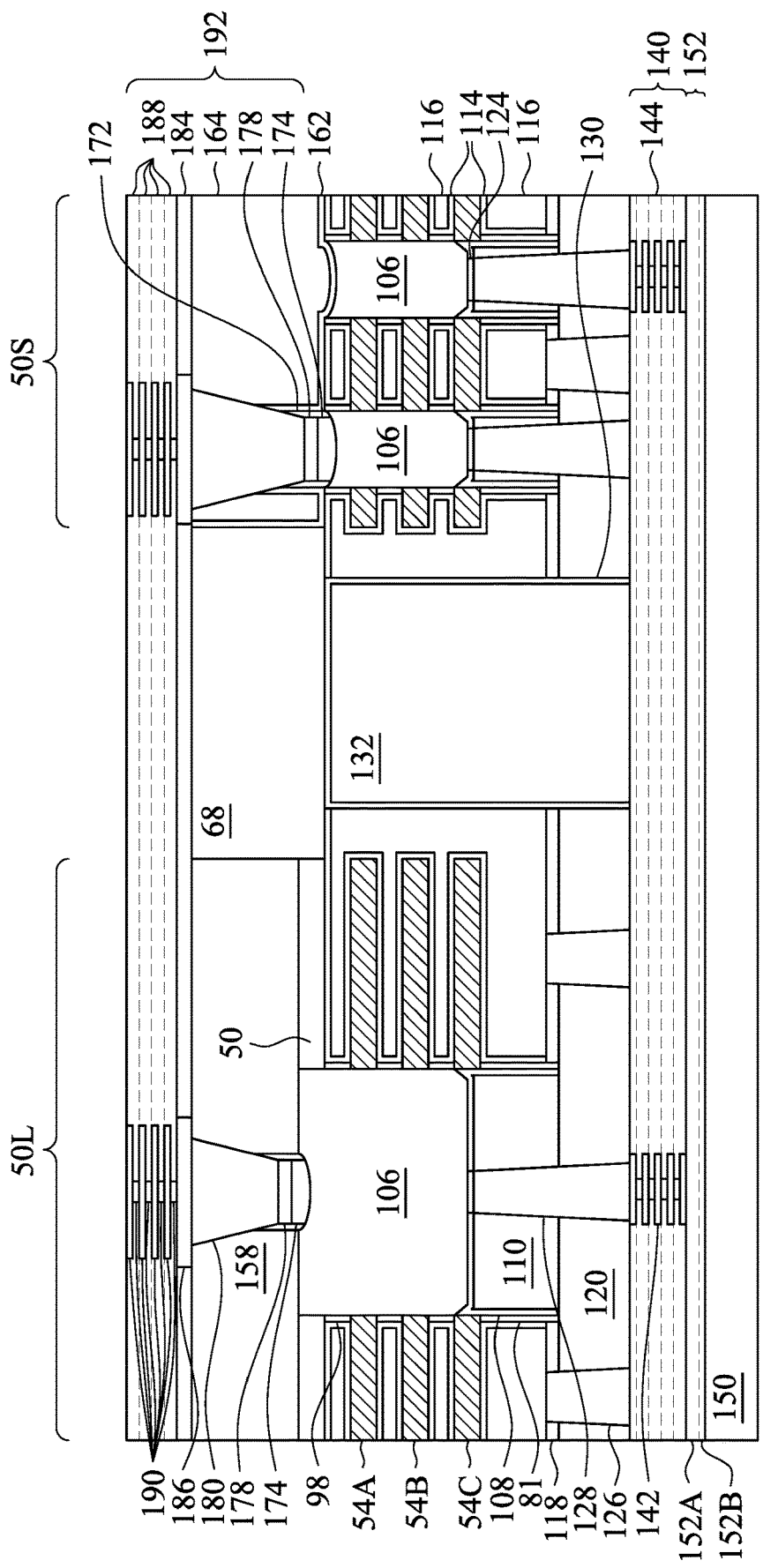
Figure 39C:
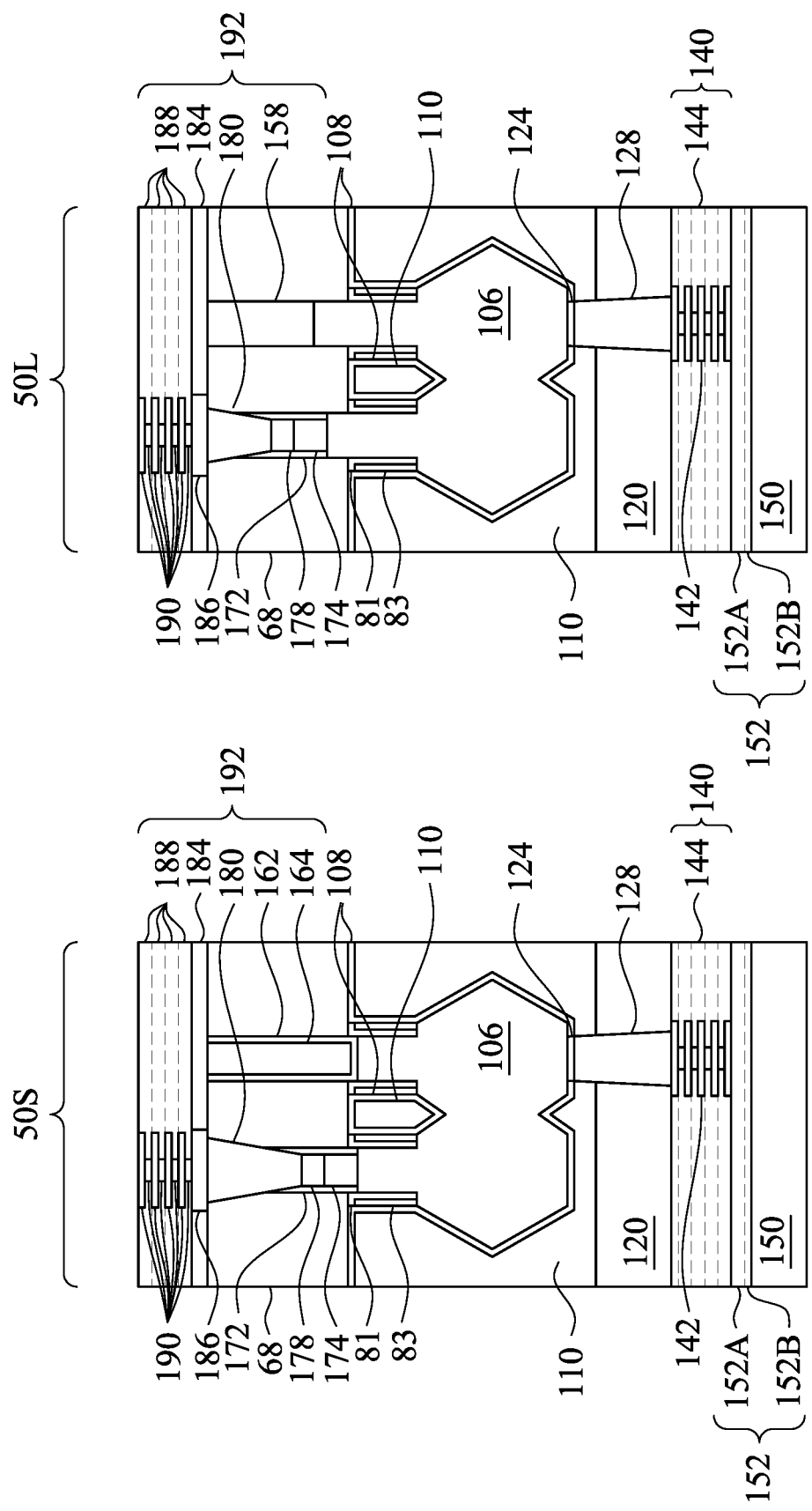

In FIGS. 39A through 39C, remaining portions of a backside interconnect structure 192 are formed over the second dielectric layer 184 and the conductive lines 186. The remaining portions of the backside interconnect structure 192 may include conductive features 190 formed in third dielectric layers 188. The backside interconnect structure 192 may include the STI regions 68, the fourth ILD 158, the fifth ILD 164, the second liner layer 162, the backside epitaxial materials 174, the second silicide regions 178, the backside vias 180, the conductive lines 186, the second dielectric layer 184, the conductive features 190, and the third dielectric layers 188. The remainder of the backside interconnect structure 192 may be similar to the front-side interconnect structure 140. For example, the backside interconnect structure 192 may include similar materials and be formed using like processes as the front-side interconnect structure 140. In particular, the backside interconnect structure 192 may comprise stacked layers of conductive features 190 formed in third dielectric layers 188. The conductive features 190 may include routing lines (e.g., for routing to and from subsequently formed contact pads and external connectors). The conductive features 190 may further be patterned to include one or more embedded passive devices such as, resistors, capacitors, inductors, or the like. The embedded passive devices may be integrated with the conductive lines 186 (e.g., a power rail) to provide circuits (e.g., power circuits) on the backside of the nano-FETs.

Figure 40A:
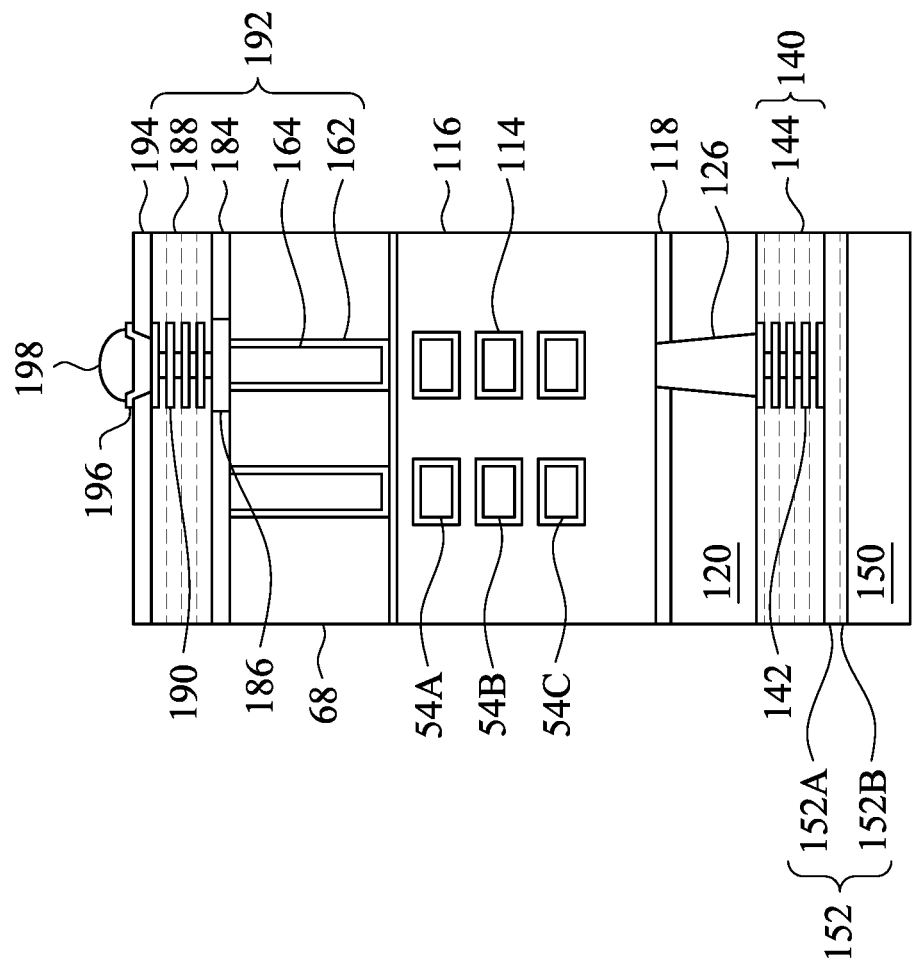
Figure 40B:
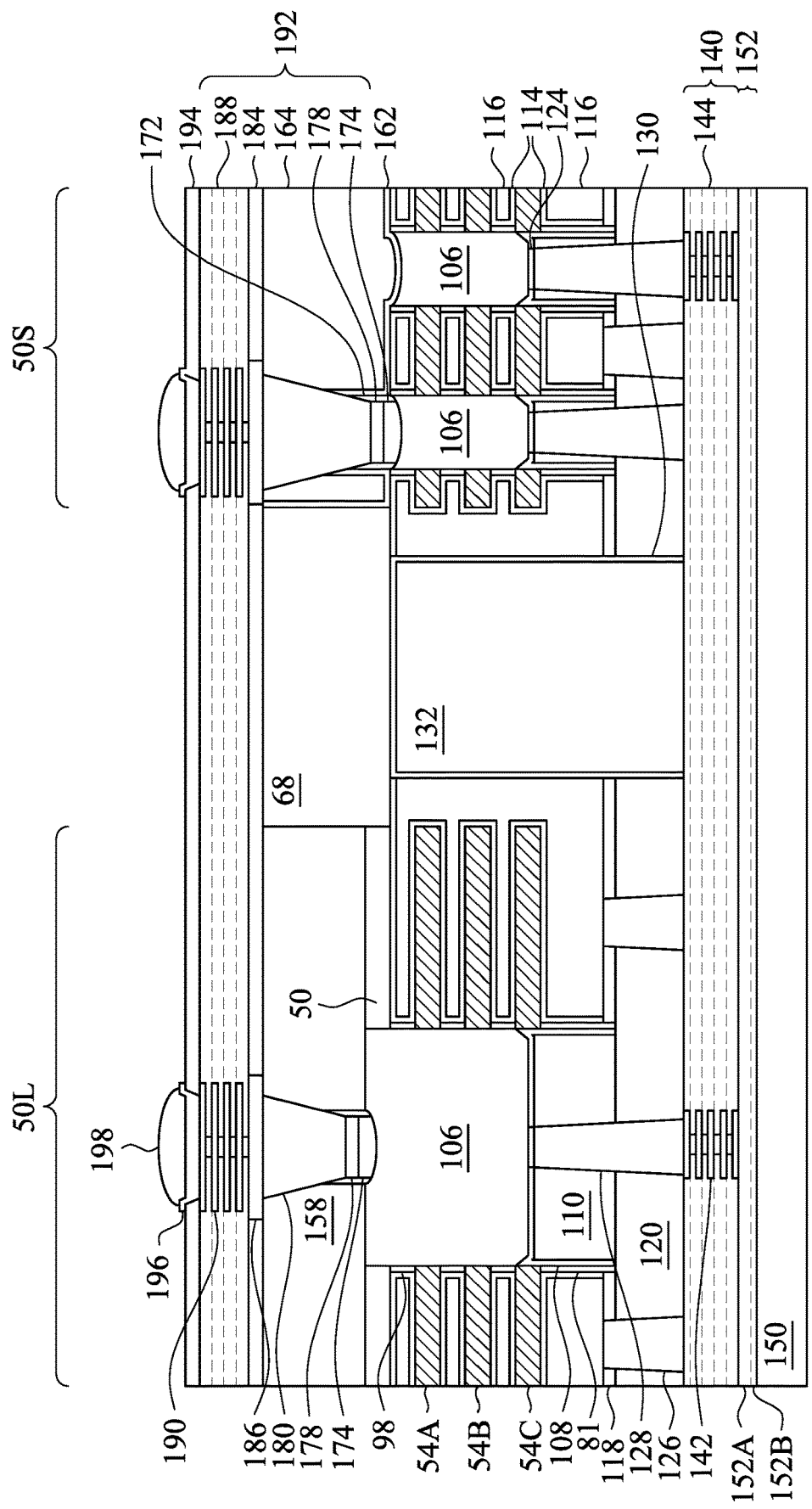
Figure 40C:
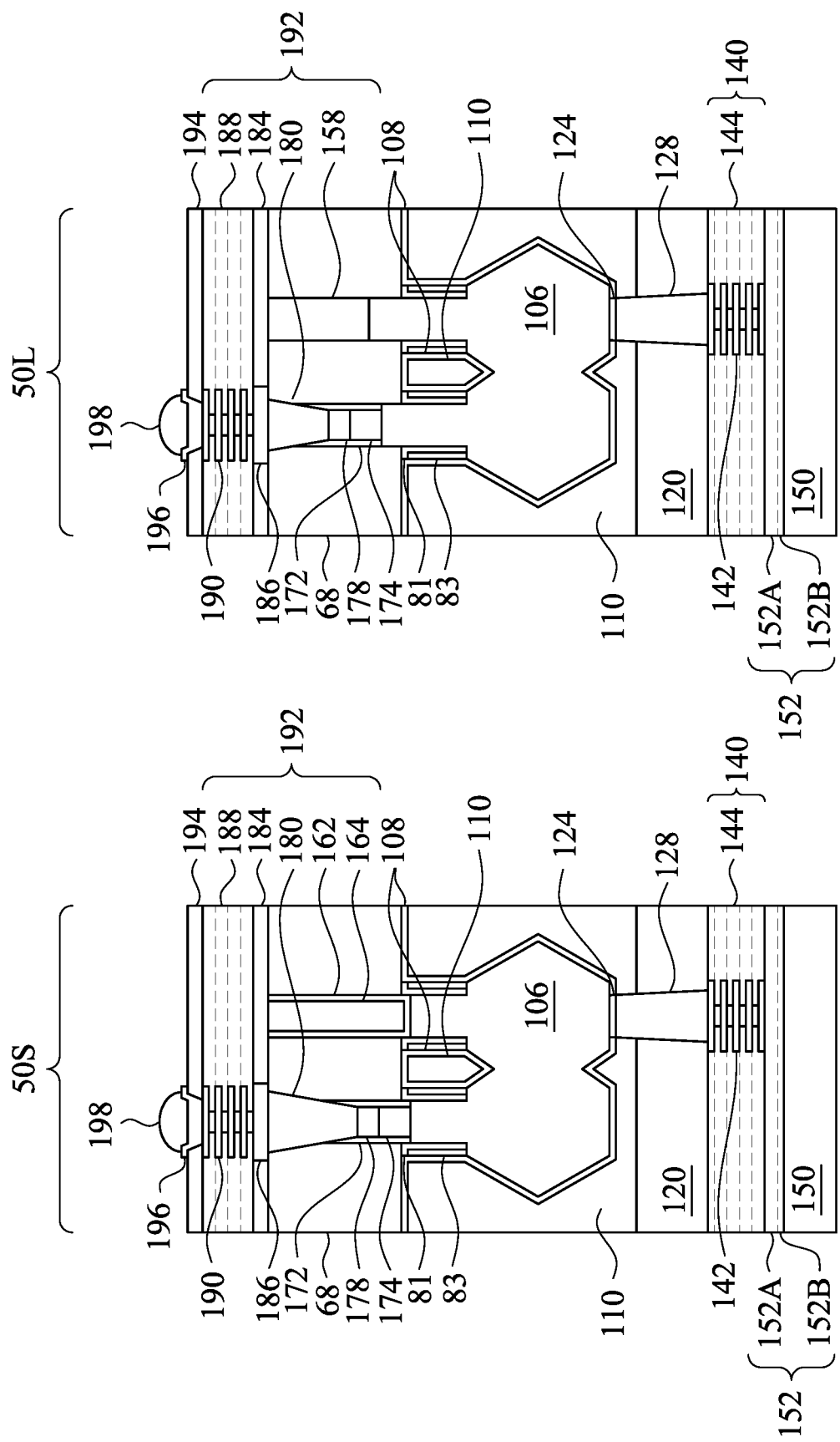

In FIGS. 40A through 40C, a passivation layer 194, UBMs 196, and external connectors 198 are formed over the backside interconnect structure 192. The passivation layer 194 may include polymers such as PBO, polyimide, BCB, or the like. Alternatively, passivation layer 194 may include non-organic dielectric materials such as silicon oxide, silicon nitride, silicon carbide, silicon oxynitride, or the like. The passivation layer 194 may be deposited by, for example, CVD, PVD, ALD, or the like.

The UBMs 196 are formed through the passivation layer 194 to the conductive features 190 in the backside interconnect structure 192, and external connectors 198 are formed on the UBMs 196. The UBMs 196 may include one or more layers of copper, nickel, gold, or the like, which are formed by a plating process, or the like. The external connectors 198 (e.g., solder balls) are formed on the UBMs 196. The formation of external connectors 198 may include placing solder balls on the exposed portions of UBMs 196 and then reflowing the solder balls. In alternative embodiments, the formation of external connectors 198 includes performing a plating step to form solder regions over the topmost conductive feature 190 and then reflowing the solder regions. The UBMs 196 and the external connectors 198 may be used to provide input/output connections to other electrical components, such as, other device dies, redistribution structures, printed circuit boards (PCBs), motherboards, or the like. The UBMs 196 and the external connectors 198 may also be referred to as backside input/output pads that may provide signal, supply voltage, and/or ground connections to the nano-FETs described above.

Embodiments may achieve various advantages. For example, including backside vias 180 in the long-channel regions 50L allows for device density in the long-channel regions 50L to be increased and improves performance of devices in the long-channel regions 50L. Further, including backside vias 180 in both the long-channel regions 50L and the short-channel regions 50S reduces depth loading between the long-channel regions 50L and the short-channel regions 50S, which reduces device defects. Reduced depth loading also allows for shorter backside vias 180 to be included in the short-channel regions 50S, which improves device performance.

In accordance with an embodiment, a semiconductor device includes a first transistor structure; a second transistor structure adjacent the first transistor structure; a first interconnect structure on a front-side of the first transistor structure and the second transistor structure; and a second interconnect structure on a backside of the first transistor structure and the second transistor structure, the second interconnect structure including a first dielectric layer on the backside of the first transistor structure; a second dielectric layer on the backside of the second transistor structure; a first contact extending through the first dielectric layer and electrically coupled to a first source/drain region of the first transistor structure; and a second contact extending through the second dielectric layer and electrically coupled to a second source/drain region of the second transistor structure, the second contact having a second length less than a first length of the first contact. In an embodiment, the first transistor structure has a first channel length, the second transistor structure has a second channel length, and the second channel length is greater than the first channel length. In an embodiment, the second interconnect structure further includes a first substrate between the second dielectric layer and the second transistor structure. In an embodiment, the first substrate has a thickness from 0.5 nm to 20 nm. In an embodiment, the first length is equal to a sum of the second length and a thickness of the first substrate. In an embodiment, the semiconductor device further includes an epitaxial material over a backside surface of the first source/drain region; and a silicide over a backside surface of the epitaxial material, the epitaxial material and the silicide being between the first source/drain region and the first contact. In an embodiment, a backside surface of the first contact, a backside surface of the second contact, a backside surface of the first dielectric layer, and a backside surface of the second dielectric layer are level with one another.

In accordance with another embodiment, a semiconductor device includes a first transistor structure including a first nanostructure, a first gate structure surrounding the first nanostructure, and a first source/drain region adjacent the first gate structure, the first transistor structure having a first channel length; a second transistor structure adjacent the first transistor structure, the second transistor structure including a second nanostructure, a second gate structure surrounding the second nanostructure, and a second source/drain region adjacent the second gate structure, the second transistor structure having a second channel length greater than the first channel length; a first interconnect structure on a front-side of the first transistor structure and the second transistor structure; and a second interconnect structure on a backside of the first transistor structure and the second transistor structure, the second interconnect structure including a first dielectric layer on the backside of the first transistor structure; a first substrate on the backside of the second transistor structure; and a second dielectric layer on a backside of the first substrate, a height of the first substrate and the second dielectric layer being equal to a height of the first dielectric layer. In an embodiment, the semiconductor device further includes a first contact extending through the first dielectric layer and electrically coupled to the first source/drain region; and a second contact extending through the second dielectric layer and electrically coupled to the second source/drain region, the second contact having a height less than a height of the first contact. In an embodiment, the second interconnect structure further includes a first silicide in physical contact with a backside of the first source/drain region, and the first contact is in physical contact with a backside of the first silicide. In an embodiment, the second interconnect structure further includes an epitaxial material in physical contact with a backside of the first source/drain region; and a silicide in physical contact with a backside of the epitaxial material, the first contact being in physical contact with a backside of the silicide. In an embodiment, the first contact has vertical sidewalls extending from the first source/drain region to level with a backside of the first dielectric layer. In an embodiment, the first contact has tapered sidewalls which widen as the tapered sidewalls extend towards a backside of the first dielectric layer. In an embodiment, the semiconductor device further includes first spacers between the first contact and the first dielectric layer; and second spacers between the second contact and the second dielectric layer, the first spacers and the second spacers including silicon nitride.

In accordance with yet another embodiment, a method includes forming a first transistor structure and a second transistor structure on a semiconductor substrate; thinning the semiconductor substrate to expose a first source/drain region of the first transistor structure while masking the semiconductor substrate over the second transistor structure; forming a first dielectric layer over the first transistor structure and the semiconductor substrate; removing the semiconductor substrate over the second transistor structure to expose a second gate structure of the second transistor structure; forming a second dielectric layer over the second transistor structure; forming a first contact extending through the first dielectric layer and coupled to the first source/drain region; and forming a second contact extending through the second dielectric layer and coupled to a second source/drain region of the second transistor structure, the second contact having a length greater than the first contact. In an embodiment, the second transistor structure has a second channel length less than a first channel length of the first transistor structure. In an embodiment, forming the first contact includes forming a first patterned photoresist over the first dielectric layer and the second dielectric layer; and etching the first dielectric layer to form a first recess exposing the first source/drain region using the first patterned photoresist as a mask. In an embodiment, forming the second contact includes etching a first semiconductor material to expose a second semiconductor material over the second source/drain region; and etching the second semiconductor material to form a second recess exposing the second source/drain region, the first semiconductor material and the second semiconductor material being etched after forming the second dielectric layer, the second source/drain region including a different material from the first semiconductor material and the second semiconductor material. In an embodiment, the second source/drain region includes boron-doped silicon germanium having a boron concentration from $6 \times 10^{20}$ atoms/cm$^3$ to $10 \times 10^{20}$ atoms/cm$^3$, the first semiconductor material includes silicon germanium, and the second semiconductor material includes boron-doped silicon germanium having a boron concentration from $2 \times 10^{20}$ atoms/cm$^3$ to $5 \times 10^{20}$ atoms/cm$^3$. In an embodiment, the method further includes depositing a sacrificial material in the first recess and the second recess; and after depositing the sacrificial material, widening the first recess and the second recess such that the first recess and the second recess have tapered profiles.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
a first transistor structure;
a second transistor structure adjacent the first transistor structure;
a first interconnect structure on a front-side of the first transistor structure and the second transistor structure; and a second interconnect structure on a backside of the first transistor structure and the second transistor structure, the second interconnect structure comprising:
  a first dielectric layer on the backside of the first transistor structure;
  a second dielectric layer on the backside of the second transistor structure;
  a first contact extending through the first dielectric layer and electrically coupled to a first source/drain region of the first transistor structure; and
  a second contact extending through the second dielectric layer and electrically coupled to a second source/drain region of the second transistor structure, the second contact having a second length less than a first length of the first contact.

2. The semiconductor device of claim 1, wherein the first transistor structure has a first channel length, wherein the second transistor structure has a second channel length, and wherein the second channel length is greater than the first channel length.

3. The semiconductor device of claim 1, wherein the second interconnect structure further comprises a first substrate between the second dielectric layer and the second transistor structure.

4. The semiconductor device of claim 3, wherein the first substrate has a thickness from 0.5 nm to 20 nm.

5. The semiconductor device of claim 3, wherein the first length is equal to a sum of the second length and a thickness of the first substrate.

6. The semiconductor device of claim 1, further comprising:
  an epitaxial material over a backside surface of the first source/drain region; and
  a silicide over a backside surface of the epitaxial material, wherein the epitaxial material and the silicide are between the first source/drain region and the first contact.

7. The semiconductor device of claim 1, wherein a backside surface of the first contact, a backside surface of the second contact, a backside surface of the first dielectric layer, and a backside surface of the second dielectric layer are level with one another.

8. A semiconductor device comprising:
  a first transistor structure comprising a first nanostructure, a first gate structure surrounding the first nanostructure, and a first source/drain region adjacent the first gate structure, the first transistor structure having a first channel length;
  a second transistor structure adjacent the first transistor structure, the second transistor structure comprising a second nanostructure, a second gate structure surrounding the second nanostructure, and a second source/drain region adjacent the second gate structure, the second transistor structure having a second channel length greater than the first channel length;
  a first interconnect structure on a front-side of the first transistor structure and the second transistor structure; and
  a second interconnect structure on a backside of the first transistor structure and the second transistor structure, the second interconnect structure comprising:
    a first dielectric layer on the backside of the first transistor structure;
    a first substrate on the backside of the second transistor structure; and
    a second dielectric layer on a backside of the first substrate, wherein a height of the first substrate and the second dielectric layer is equal to a height of the first dielectric layer.

9. The semiconductor device of claim 8, further comprising:
  a first contact extending through the first dielectric layer and electrically coupled to the first source/drain region; and
  a second contact extending through the second dielectric layer and electrically coupled to the second source/drain region, the second contact having a height less than a height of the first contact.

10. The semiconductor device of claim 9, wherein the second interconnect structure further comprises a first silicide in physical contact with a backside of the first source/drain region, and wherein the first contact is in physical contact with a backside of the first silicide.

11. The semiconductor device of claim 9, wherein the second interconnect structure further comprises:
  an epitaxial material in physical contact with a backside of the first source/drain region; and
  a silicide in physical contact with a backside of the epitaxial material, wherein the first contact is in physical contact with a backside of the silicide.

12. The semiconductor device of claim 9, wherein the first contact has vertical sidewalls extending from the first source/drain region to level with a backside of the first dielectric layer.

13. The semiconductor device of claim 9, wherein the first contact has tapered sidewalls which widen as the tapered sidewalls extend towards a backside of the first dielectric layer.

14. The semiconductor device of claim 9, further comprising:
  first spacers between the first contact and the first dielectric layer; and
  second spacers between the second contact and the second dielectric layer, the first spacers and the second spacers comprising silicon nitride.

15. A method comprising:
  forming a first transistor structure and a second transistor structure on a semiconductor substrate;
  thinning the semiconductor substrate to expose a first source/drain region of the first transistor structure while masking the semiconductor substrate over the second transistor structure;
  forming a first dielectric layer over the first transistor structure and the semiconductor substrate;
  removing the semiconductor substrate over the second transistor structure to expose a second gate structure of the second transistor structure;
  forming a second dielectric layer over the second transistor structure;
  forming a first contact extending through the first dielectric layer and coupled to the first source/drain region; and
  forming a second contact extending through the second dielectric layer and coupled to a second source/drain region of the second transistor structure, the second contact having a length greater than the first contact.

16. The method of claim 15, wherein the second transistor structure has a second channel length less than a first channel length of the first transistor structure.

17. The method of claim 15, wherein forming the first contact comprises:

forming a first patterned photoresist over the first dielectric layer and the second dielectric layer; and etching the first dielectric layer to form a first recess exposing the first source/drain region using the first patterned photoresist as a mask.

18. The method of claim 17, wherein forming the second contact comprises:

etching a first semiconductor material to expose a second semiconductor material over the second source/drain region; and etching the second semiconductor material to form a second recess exposing the second source/drain region, wherein the first semiconductor material and the second semiconductor material are etched after forming the second dielectric layer, wherein the second source/drain region comprises a different material from the first semiconductor material and the second semiconductor material.

19. The method of claim 18, wherein the second source/drain region comprises boron-doped silicon germanium having a boron concentration from $6 \times 10^{20}$ atoms/cm$^3$ to $10 \times 10^{20}$ atoms/cm$^3$, wherein the first semiconductor material comprises silicon germanium, and wherein the second semiconductor material comprises boron-doped silicon germanium having a boron concentration from $2 \times 10^{20}$ atoms/cm$^3$ to $5 \times 10^{20}$ atoms/cm$^3$.

20. The method of claim 18, further comprising:

depositing a sacrificial material in the first recess and the second recess; and after depositing the sacrificial material, widening the first recess and the second recess such that the first recess and the second recess have tapered profiles.

* * * * *